United States Patent
Park et al.

(10) Patent No.: US 9,070,893 B2
(45) Date of Patent: Jun. 30, 2015

(54) ORGANIC LIGHT-EMITTING DEVICE

(71) Applicant: SAMSUNG DISPLAY CO., LTD., Yongin, Gyeonggi-Do (KR)

(72) Inventors: Tae-Jin Park, Yongin (KR); Jung-Min Moon, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/142,684

(22) Filed: Dec. 27, 2013

(65) Prior Publication Data
US 2015/0014645 A1   Jan. 15, 2015

(30) Foreign Application Priority Data
Jul. 9, 2013 (KR) .................. 10-2013-0080470

(51) Int. Cl.
*H01L 29/08* (2006.01)
*H01L 35/24* (2006.01)
(Continued)

(52) U.S. Cl.
CPC ......... *H01L 51/5064* (2013.01); *H01L 51/0067* (2013.01); *H01L 51/0072* (2013.01);
(Continued)

(58) Field of Classification Search
CPC ............ H01L 51/0047; H01L 51/5052; H01L 51/5056; H01L 51/5064; H01L 51/5068
See application file for complete search history.

(56) References Cited

U.S. PATENT DOCUMENTS
7,718,277 B2 * 5/2010 Chichak et al. ............... 428/690
(Continued)

FOREIGN PATENT DOCUMENTS
KR  10-2010-0070350 A   6/2010
KR  10-2010-0106415 A   10/2010
KR  10-2012-0022861 A   3/2012

*Primary Examiner* — Ida M Soward
(74) *Attorney, Agent, or Firm* — Christie, Parker & Hale, LLP

(57) ABSTRACT

An organic light-emitting device including a first electrode; a second electrode facing the first electrode; an emission layer between the first electrode and the second electrode; a first hole transport layer between the first electrode and the emission layer; and a second hole transport layer between the first hole transport layer and the emission layer, wherein the first hole transport layer includes a first compound represented by Formula 1 and the second hole transport layer includes a second compound represented by Formula 2:

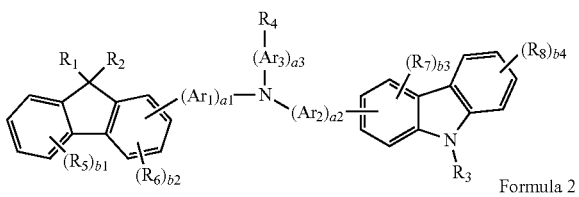
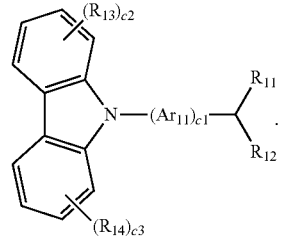

16 Claims, 2 Drawing Sheets

| A SECOND ELECTRODE |
| --- |
| AN ELECTRON INJECTION LAYER |
| AN ELECTRON TRANSPORT LAYER |
| AN EMISSION LAYER |
| A SECOND HOLE TRANSPORT LAYER |
| A FIRST HOLE TRANSPORT LAYER |
| A FIRST ELECTRODE |

(51) Int. Cl.
*H01L 51/00* (2006.01)
*H01L 51/50* (2006.01)

(52) U.S. Cl.
CPC ......... *H01L51/0047* (2013.01); *H01L 51/5052* (2013.01); *H01L 51/5056* (2013.01); *H01L 51/5068* (2013.01)

(56) References Cited

U.S. PATENT DOCUMENTS

| | | | |
|---|---|---|---|
| 7,994,498 B2* | 8/2011 | Pieh et al. | 257/40 |
| 2010/0026168 A1* | 2/2010 | Hsieh et al. | 313/504 |
| 2010/0219404 A1 | 9/2010 | Endo et al. | |
| 2010/0301312 A1 | 12/2010 | Jinde et al. | |
| 2011/0215308 A1* | 9/2011 | Im et al. | 257/40 |
| 2012/0049177 A1* | 3/2012 | Chesterfield | 257/40 |
| 2012/0091438 A1 | 4/2012 | Yabunouchi et al. | |
| 2012/0326137 A1* | 12/2012 | Song et al. | 257/40 |
| 2013/0241401 A1* | 9/2013 | Kwong et al. | 313/504 |
| 2014/0001444 A1* | 1/2014 | Kim et al. | 257/40 |
| 2014/0183517 A1* | 7/2014 | Huh et al. | 257/40 |
| 2014/0203251 A1* | 7/2014 | Jung et al. | 257/40 |
| 2014/0306211 A1* | 10/2014 | Okuyama et al. | 257/40 |
| 2014/0339518 A1* | 11/2014 | Yamamoto et al. | 257/40 |

* cited by examiner

ORGANIC LIGHT-EMITTING DEVICE

CROSS-REFERENCE TO RELATED APPLICATION

This application claims priority to and the benefit of Korean Patent Application No. 10-2013-0080470, filed on Jul. 9, 2013, in the Korean Intellectual Property Office, the disclosure of which is incorporated herein in its entirety by reference.

BACKGROUND

1. Field

One or more embodiments of the present invention are directed to an organic light-emitting device.

2. Description of the Related Art

Organic light-emitting devices (OLEDs) are self-emitting devices, which have wide viewing angles, high contrast, quick response, high brightness, low driving voltage characteristics, and can provide multicolored images.

A typical OLED has a structure including an anode, a hole transport layer (HTL), an emission layer (EML), an electron transport layer (ETL), and a cathode which are sequentially stacked on a substrate. In this regard, the HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

One or more aspects of embodiments of the present invention are directed to an organic light-emitting device having a novel structure.

Additional aspects will be set forth in part in the description which follows and, in part, will be apparent from the description, or may be learned by practice of the presented embodiments.

According to one or more embodiments of the present invention, an organic light-emitting device includes: a first electrode; a second electrode facing the first electrode; an emission layer between the first electrode and the second electrode; a first hole transport layer between the first electrode and the emission layer; and a second hole transport layer between the first hole transport layer and the emission layer, wherein the first hole transport layer includes a first compound represented by Formula 1 below and the second hole transport layer includes a second compound represented by Formula 2 below:

Formula 1

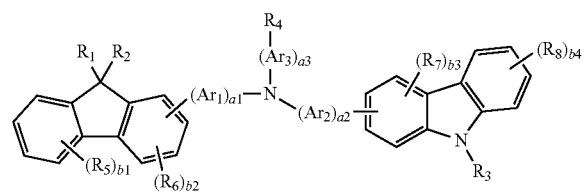

Formula 2

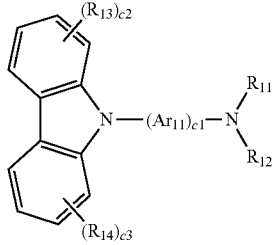

wherein, in Formulae 1 and 2 above, $Ar_1$ to $Ar_3$, and $Ar_{11}$ are each independently selected from a substituted or unsubstituted $C_3$-$C_{10}$cycloalkylene group, a substituted or unsubstituted $C_2$-$C_{10}$heterocycloalkylene group, a substituted or unsubstituted $C_3$-$C_{10}$cycloalkenylene group, a substituted or unsubstituted $C_2$-$C_{10}$heterocycloalkenylene group, a substituted or unsubstituted $C_6$-$C_{60}$arylene group, and a substituted or unsubstituted $C_2$-$C_{60}$heteroarylene group;

a1 to a3 are each independently an integer from 0 to 5;

c1 is an integer from 1 to 5;

$R_1$, $R_2$, $R_4$ to $R_8$, $R_{13}$, and $R_{14}$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$alkyl group, a substituted or unsubstituted $C_2$-$C_{60}$alkenyl group, a substituted or unsubstituted $C_2$-$C_{60}$alkynyl group, a substituted or unsubstituted $C_1$-$C_{60}$alkoxy group, a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, a substituted or unsubstituted $C_6$-$C_{60}$aryloxy group, a substituted or unsubstituted $C_6$-$C_{60}$arylthio group, a substituted or unsubstituted $C_2$-$C_{60}$heteroaryl group, —N($Q_1$)($Q_2$), or —Si($Q_3$)($Q_4$)($Q_5$) (where $Q_1$ to $Q_5$ are each independently selected from a $C_1$-$C_{60}$alkyl group, a $C_1$-$C_{60}$alkoxy group, a $C_6$-$C_{60}$aryl group, or a $C_2$-$C_{60}$heteroaryl group);

$R_3$, $R_{11}$, and $R_{12}$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$alkyl group, a substituted or unsubstituted $C_2$-$C_{60}$alkenyl group, a substituted or unsubstituted $C_2$-$C_{60}$alkynyl group, a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, a substituted or unsubstituted $C_2$-$C_{60}$heteroaryl group, or —Si($Q_3$)($Q_4$)($Q_5$) (where $Q_3$ to $Q_5$ are each independently selected from a $C_1$-$C_{60}$alkyl group, a $C_1$-$C_{60}$alkoxy group, a $C_6$-$C_{60}$aryl group, or a $C_2$-$C_{60}$heteroaryl group);

b1, b4, c2, and c3 are each independently an integer from 1 to 4; and b2 and b3 are each independently an integer from 1 to 3.

According to one or more embodiments of the present invention, an organic light-emitting device includes: a first electrode; a second electrode facing the first electrode; an emission layer between the first electrode and the second electrode; a first hole transport layer between the first electrode and the emission layer; and a second hole transport layer between the first hole transport layer and the emission layer, wherein the first hole transport layer includes at least one of Compounds 309 to 320 below, and the second hole transport layer includes at least one of Compounds 701 to 715 below:

309

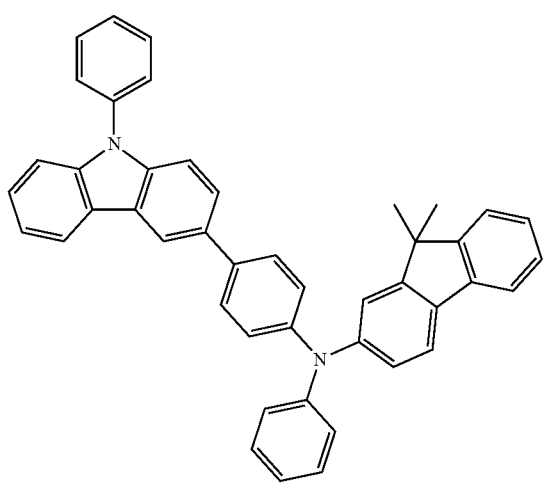

310

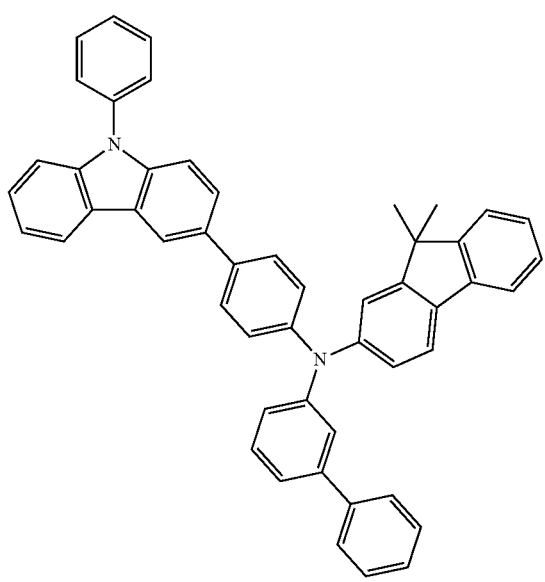

311

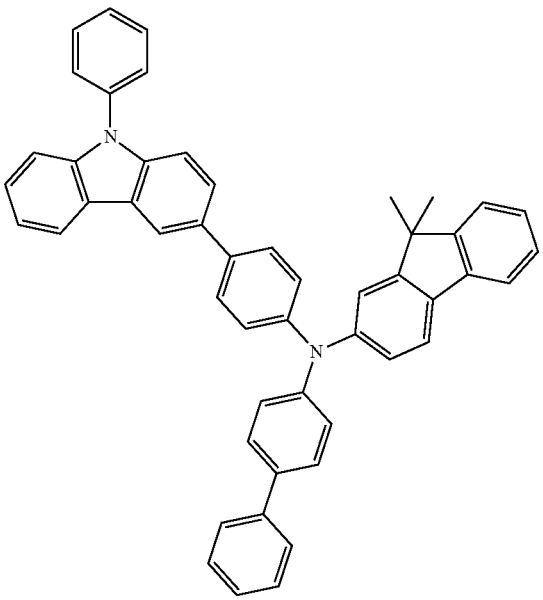

312

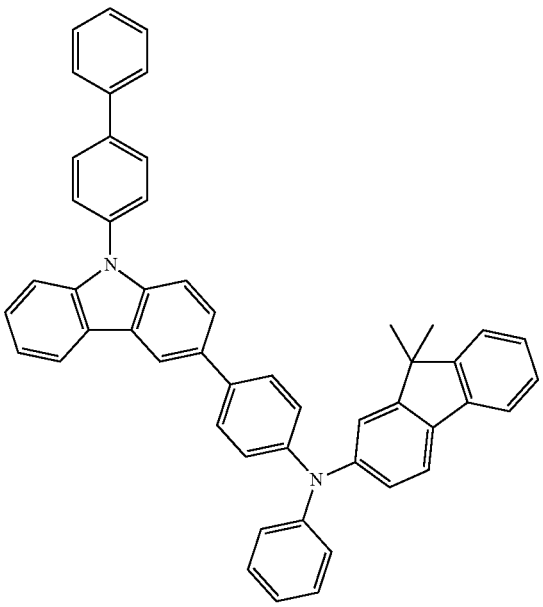

313
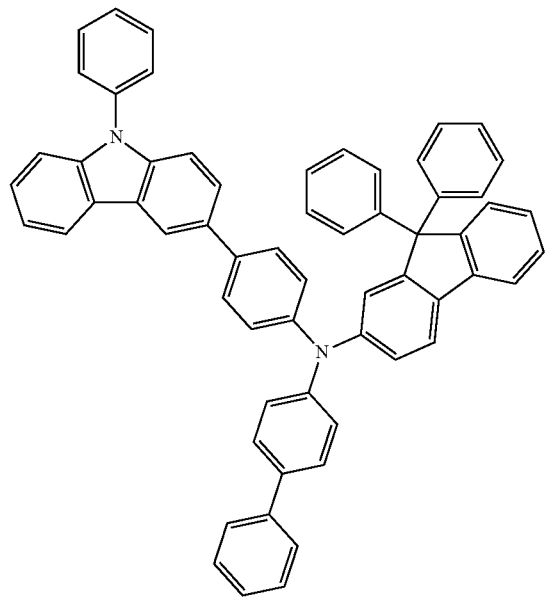
314
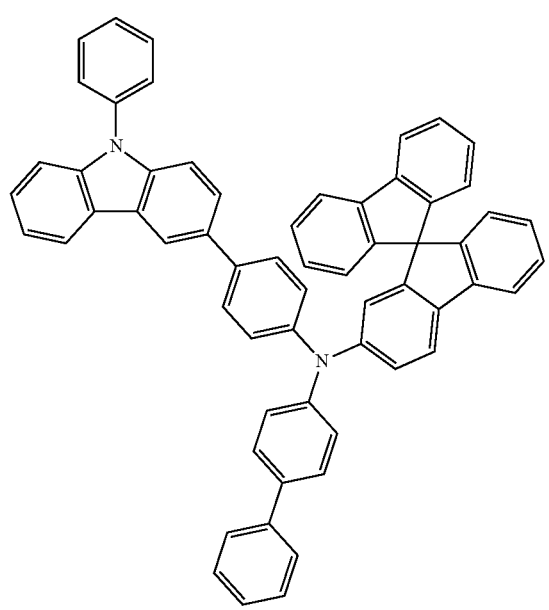
315
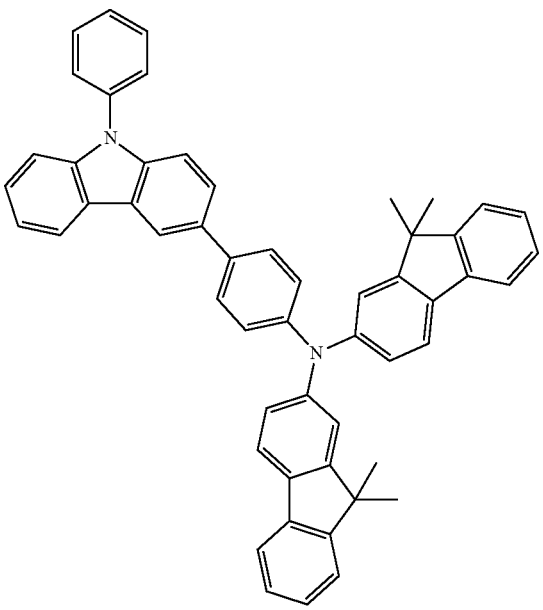
316
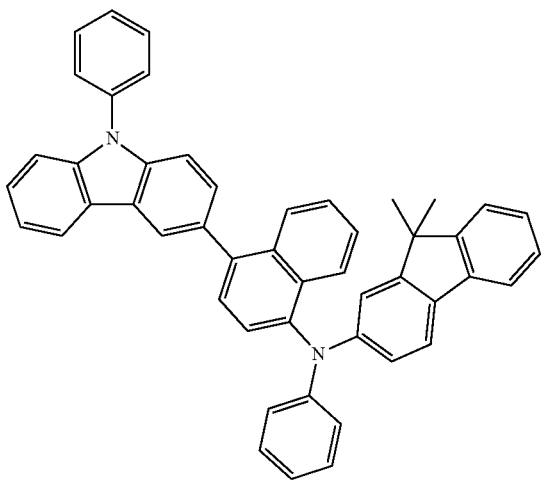
317
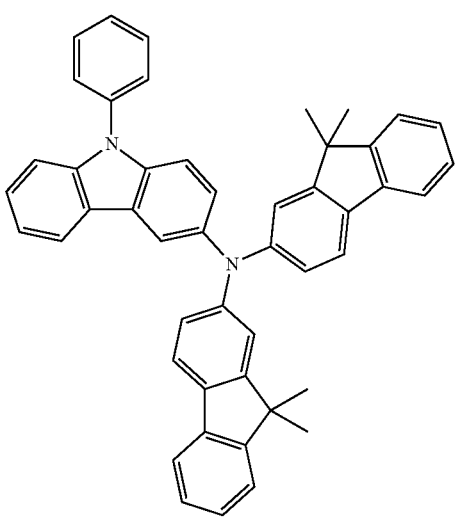

318
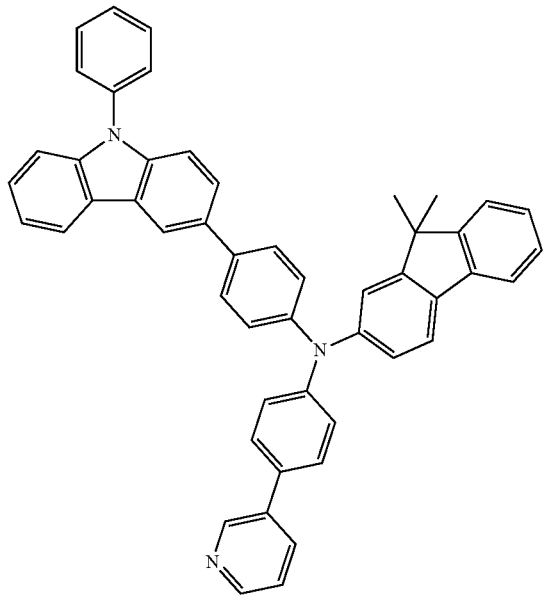
319
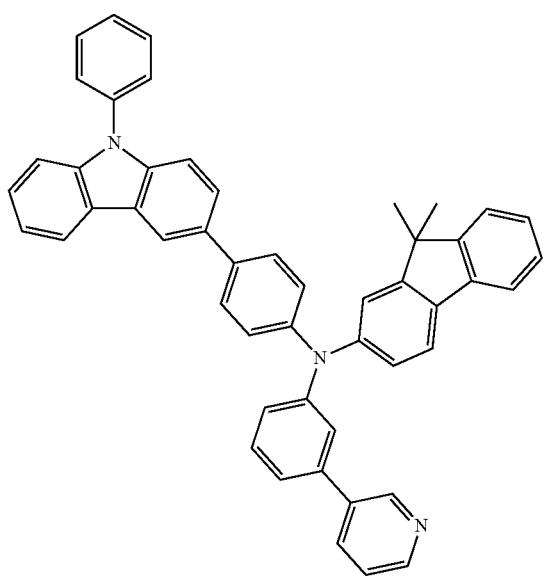
320
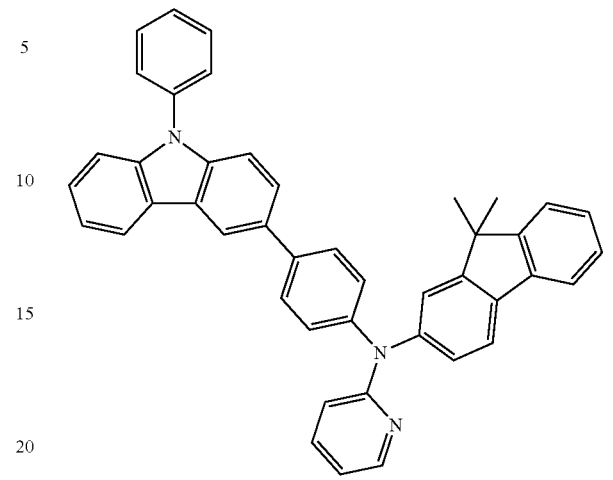
701
702
703
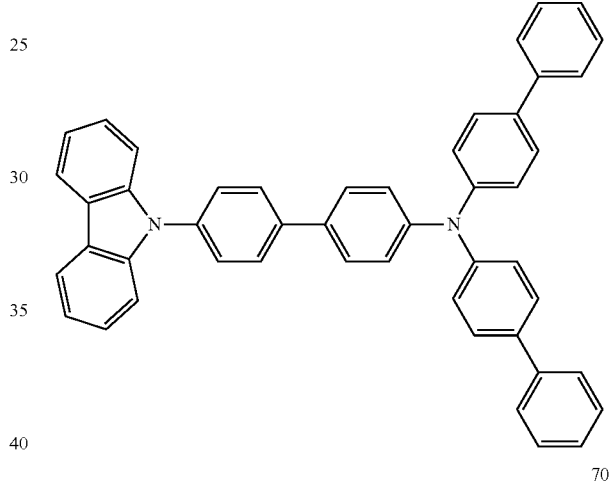
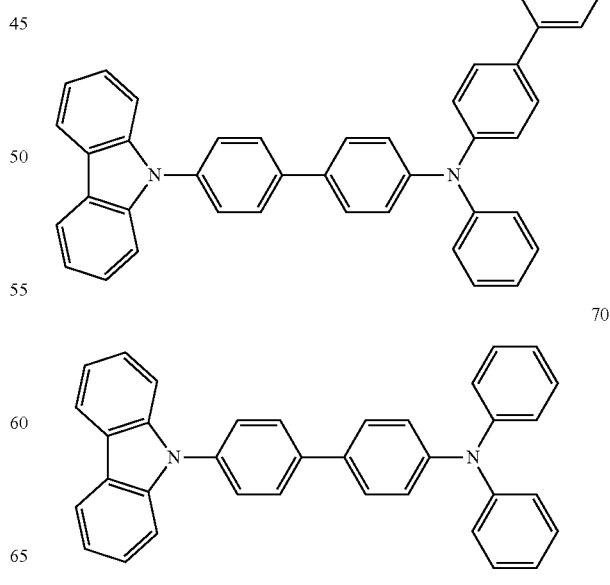

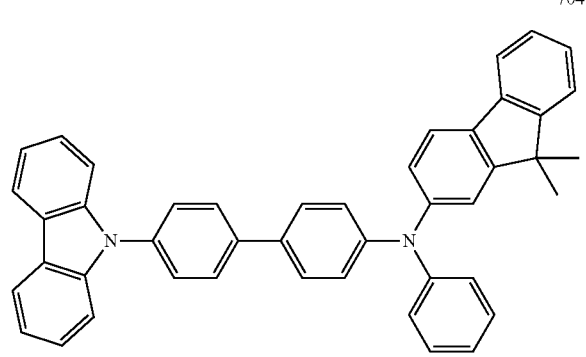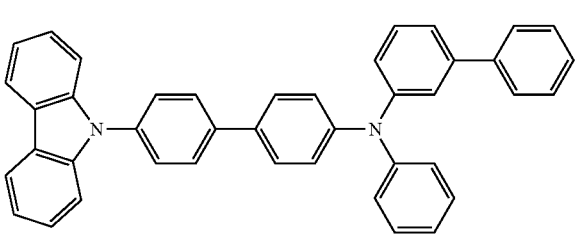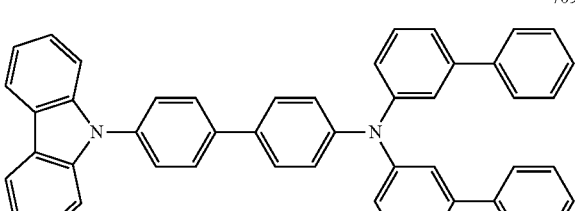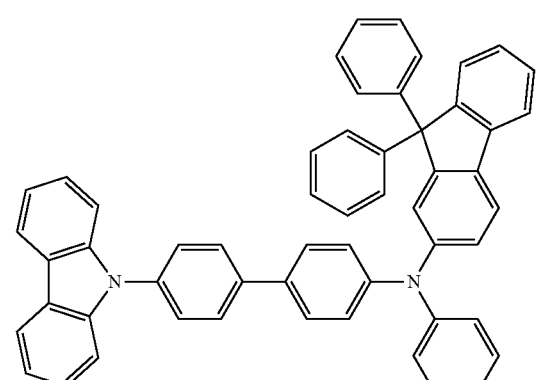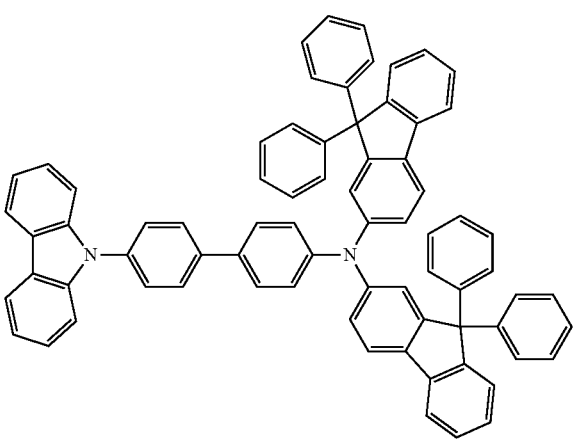

712

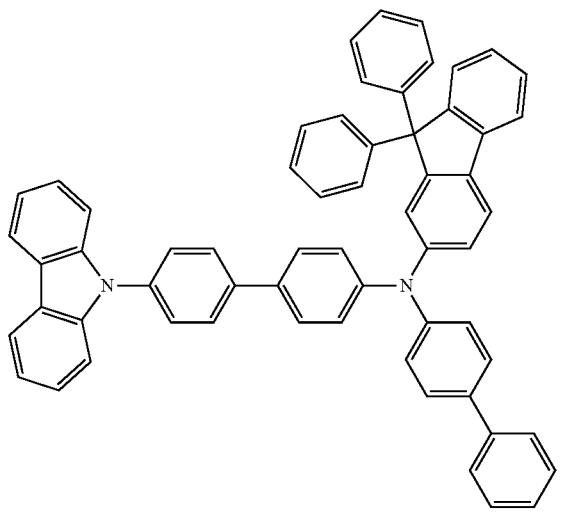

713

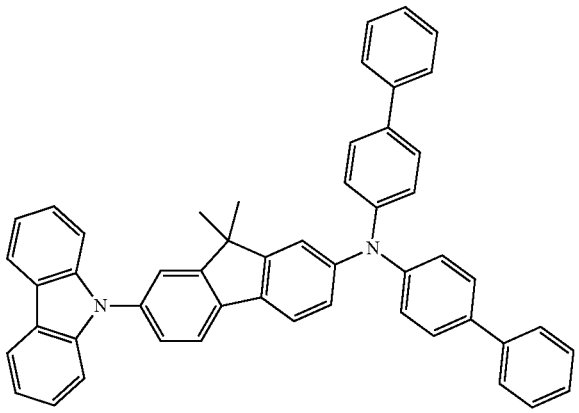

714

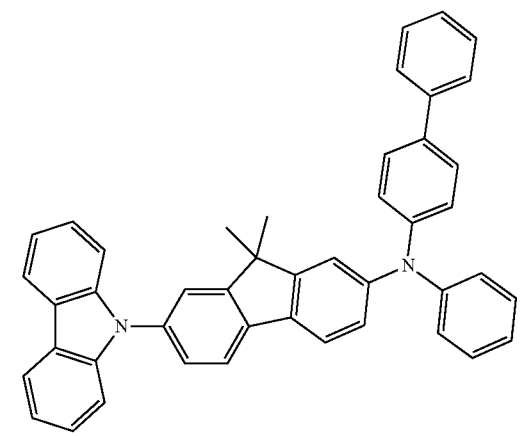

715

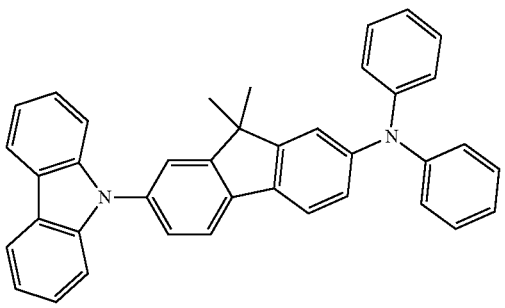

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
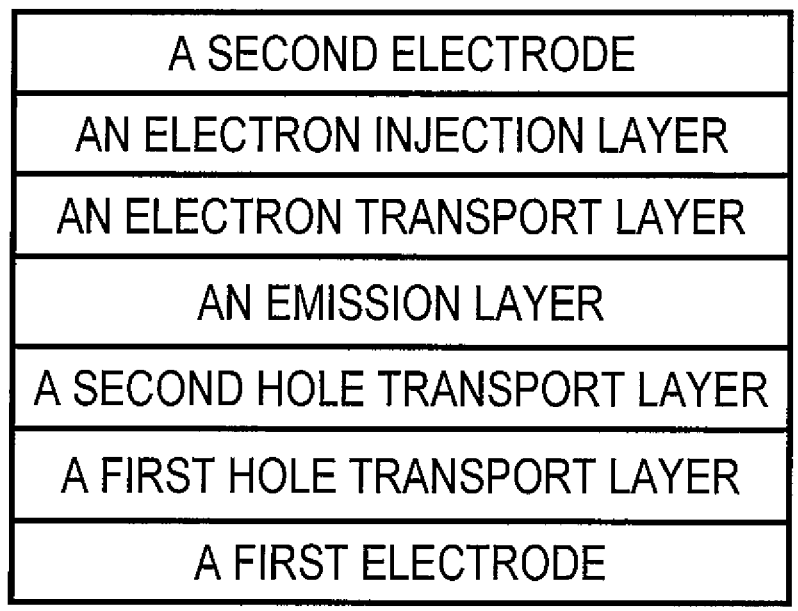
FIG. 1 is a schematic view of a structure of an organic light-emitting device according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the use of "may" when describing embodiments of the present invention refers to "one or more embodiments of the present invention."

FIG. 1 is a schematic view of a structure of an organic light-emitting device according to an embodiment of the present invention, in which a first electrode, a first hole transport layer (HTL), a second HTL, an emission layer, an electron transport layer (ETL), an electron injection layer (EIL), and a second electrode are sequentially stacked upon one another.

In FIG. 1, the first electrode may be an anode through which holes are injected, and the second electrode may be a cathode through which electrons are injected.

Although not illustrated in FIG. 1, a substrate may be further disposed under the first electrode or on the second electrode.

The substrate may be any substrate suitable for use in organic light emitting devices. In some embodiments the substrate may be a glass substrate or a transparent plastic substrate with strong mechanical strength, thermal stability, transparency, surface smoothness, ease of handling, and water resistance.

hen the substrate is below the first electrode, the first electrode may be formed by depositing or sputtering a first electrode-forming material on the substrate. A material having a high work function may be selected as a material for the first electrode to facilitate hole injection.

The first electrode may be a reflective electrode, a semi-transmissive electrode, or a transmissive electrode. When the substrate is under the first electrode, and the first electrode is a reflective electrode, the organic light-emitting device of FIG. 1 may be a top-emission organic light-emitting device. When the substrate is under the first electrode, and the first electrode is a semi-transmissive or transmissive electrode, the organic light-emitting device of FIG. 1 may be a bottom-emission or a double-sided organic light-emitting device.

Transparent and conductive materials such as Indium Tin Oxide (ITO), Indium Zinc Oxide (IZO), $SnO_2$, and ZnO may be used as materials for the first electrode. Non-limiting examples of the material for the first electrode are metals, including lithium (Li), magnesium (Mg), aluminum (Al), aluminum (Al)-lithium (Li), calcium (Ca), magnesium (Mg)-indium (In), magnesium (Mg)-silver (Ag).

The first electrode may be a single layer or a plurality of layers. For example, the first electrode may have a three-layered structure of ITO/Ag/ITO, but is not limited thereto.

In some embodiments, the second electrode is positioned to face the first electrode. A material for the second electrode may include materials having a low work function such as a metal, an alloy, an electrically conductive compound, or a combination thereof. Non-limiting examples of the material for the second electrode are lithium (Li), magnesium (Mg), aluminum (Al), aluminum (Al)-lithium (Li), calcium (Ca), magnesium (Mg)-indium (In), and magnesium (Mg)-silver (Ag). In some embodiments, to manufacture a top-emission light-emitting device, the second electrode may be formed as a transmissive electrode using, for example, ITO or IZO.

The EML may be between the first electrode and the second electrode, the first HTL may be between the first electrode and the EML, and the second HTL may be between the EML and the first HTL.

The ETL and the EIL may be sequentially disposed between the EML and the second electrode.

In the organic light-emitting device of FIG. 1, holes injected through the first electrode may migrate into the EML via the first HTL and the second HTL, while electrons injected through the second electrode may migrate into the EML via the EIL and the ETL. The holes and electrons in the EML recombine to generate excitons. When the excitons drop from an excited state to a ground state, light is emitted.

In the organic light-emitting device of FIG. 1, the first HTL and the second HTL may directly contact each other, and the second HTL and the EML may directly contact each other.

Although not illustrated in FIG. 1, a hole injection layer may be further disposed between the first electrode and the first HTL.

The HIL may be formed on the first electrode by vacuum deposition, spin coating, casting, Langmuir-Blodgett (LB) deposition, or the like.

When the HIL is formed using vacuum deposition, vacuum deposition conditions may vary depending on the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary depending on the compound that is used to form the HIL, and the desired structure and thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

Non-limiting examples of the material for forming the HIL are N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris (3-methylphenylphenylaniino) triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfonic acid (Pani/CSA), and polyaniline)poly(4-styrenesulfonate (PANI/PSS).

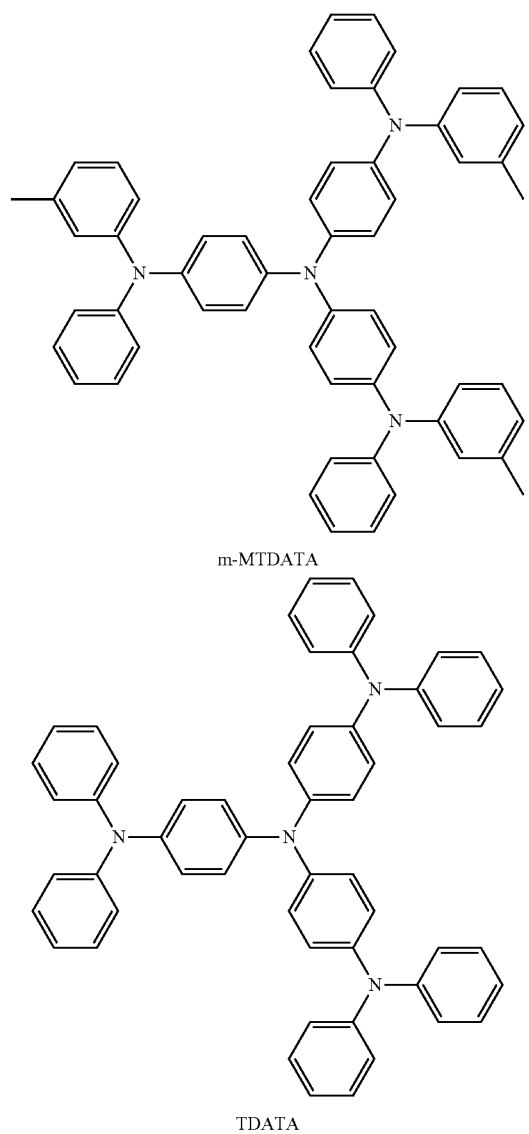

m-MTDATA

TDATA

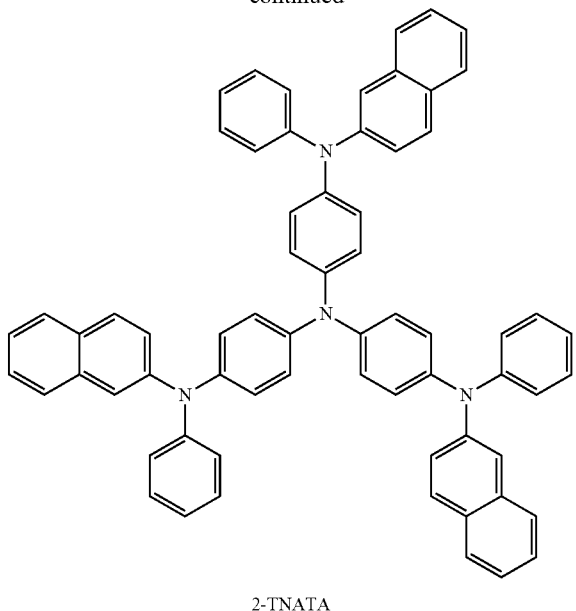

2-TNATA

The thickness of the HIL may be about 100 Å to about 10000 Å, and in some embodiments, may be from about 100 Å to about 1000 Å. When the thickness of the HIL is within these ranges, the HIL may have good hole injecting ability without a substantial increase in driving voltage.

The first HTL, the second HTL, and the EML may be sequentially formed on the first electrode (or on the HIL if it is formed) by any of a variety of methods, such as vacuum deposition, spin coating or LB method. When the first HTL, the second HTL, and the EML are formed using vacuum deposition or spin coating, the conditions for deposition or coating may be similar to those as in forming the HIL, although the conditions for deposition or coating may vary depending on the material that is used to form the first HTL, the second HTL, or the EML.

The first HTL may include a first compound represented by Formula 1 below, and the second HTL may include a second compound represented by Formula 2 below:

Formula 1

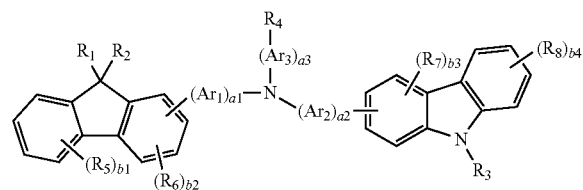

Formula 2

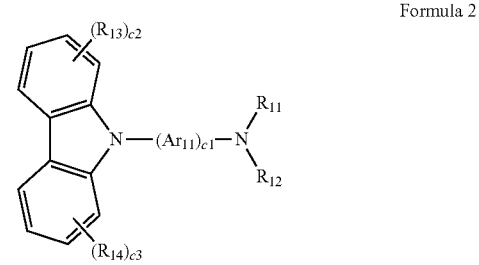

In Formulae 1 and 2 above, $Ar_1$ to $Ar_3$, and $Ar_{11}$ may be each independently selected from a substituted or unsubstituted $C_3$-$C_{10}$cycloalkylene group, a substituted or unsubstituted $C_2$-$C_{10}$heterocycloalkylene group, a substituted or unsubstituted $C_3$-$C_{10}$cycloalkenylene group, a substituted or unsubstituted $C_2$-$C_{10}$heterocycloalkenylene group, a substituted or unsubstituted $C_6$-$C_{60}$arylene group, or a substituted or unsubstituted $C_2$-$C_{60}$heteroarylene group.

For example, $Ar_1$ to $Ar_3$, and $Ar_{11}$ in Formulae 1 and 2 may be each independently selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzopuranylene group, a dibenzothiophenylene group, or a benzocarbazolylene group, and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzopuranylene group, a dibenzothiophenylene group, or a benzocarbazolylene group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, or a $C_1$-$C_{20}$alkoxy group;

a $C_1$-$C_{20}$alkyl group or a $C_1$-$C_{20}$alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

a $C_6$-$C_{20}$aryl group, or a $C_2$-$C_{20}$heteroaryl group;

a $C_6$-$C_{20}$aryl group or a $C_2$-$C_{20}$heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group;

—$N(Q_{11})(Q_{12})$, or —$Si(Q_{13})(Q_{14})(Q_{15})$ (wherein $Q_{11}$ to $Q_{15}$ are each independently a $C_1$-$C_{20}$alkyl group, a $C_1$-$C_{20}$alkoxy group, a $C_6$-$C_{20}$aryl group, or a $C_2$-$C_{20}$heteroaryl group.

In some embodiments, $Ar_1$ to $Ar_3$, and $Ar_{11}$, in Formulae 1 and 2 may be each independently represented by one of Formulae 10-1 to 10-24 below, but are not limited thereto:

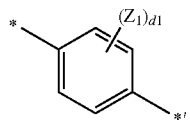

Formula 10-1

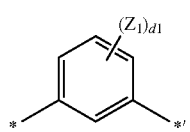

Formula 10-2

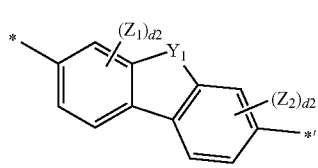

Formula 10-3

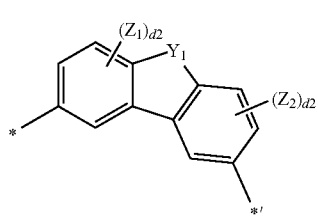

Formula 10-4

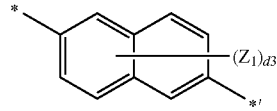

Formula 10-5

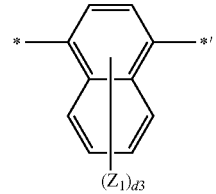

Formula 10-6

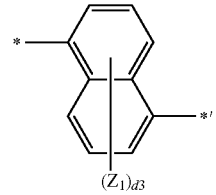

Formula 10-7

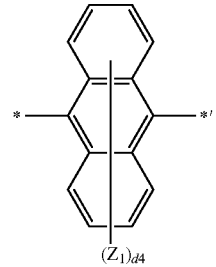

Formula 10-8

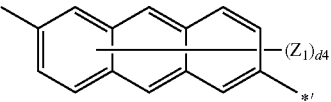

Formula 10-9

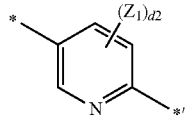

Formula 10-10

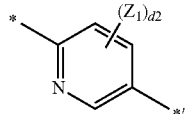

Formula 10-11

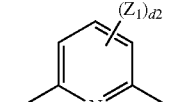

Formula 10-12

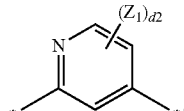

Formula 10-13

-continued

Formula 10-14

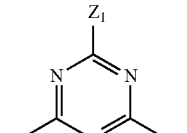

Formula 10-15

Formula 10-16

Formula 10-17

Formula 10-18

Formula 10-19

Formula 10-20

Formula 10-21

Formula 10-22

Formula 10-23

Formula 10-24

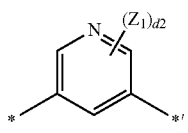

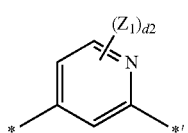

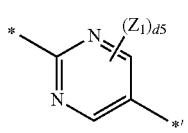

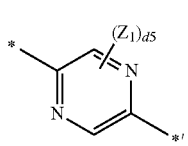

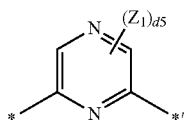

In Formulae 10-1 to 10-24 above, $Y_1$ may be O, S, $C(R_{21})(R_{22})$, or $N(R_{23})$;

$Z_1$, $Z_2$, and $R_{21}$ to $R_{23}$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

a $C_6$-$C_{20}$ aryl group or a $C_2$-$C_{20}$ heteroaryl group;

a $C_6$-$C_{20}$ aryl group or a $C_2$-$C_{20}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; and —$N(Q_{11})(Q_{12})$, or —$Si(Q_{13})(Q_{14})(Q_{15})$ (wherein $Q_{11}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group);

d1 is an integer from 1 to 4;
d2 is an integer from 1 to 3;
d3 is an integer from 1 to 6;
d4 is an integer from 1 to 8, and
d5 is an integer of 1 or 2.

In some embodiments, $Z_1$, $Z_2$, and $R_{21}$ to $R_{23}$ in Formulae 10-1 to 10-24 above may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; or —N($Q_{11}$)($Q_{12}$), or —Si($Q_{13}$)($Q_{14}$)($Q_{15}$) (wherein $Q_{11}$ to $Q_{15}$ are each independently a $C_1$-$C_{20}$alkyl group, a $C_1$-$C_{20}$alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group), but are not limited thereto.

In Formulae 10-1 to 10-24 above, d1 may be an integer from 1 to 4; d2 may be an integer from 1 to 3; d3 may be an integer from 1 to 6; d4 may be an integer from 1 to 8; and d5 may be 1 or 2. In some embodiments, d1, d2, d3 and d4 may be each independently 1 or 2.

In some embodiments, $Ar_1$ to $Ar_3$, and $Ar_{11}$, in Formulae 1 and 2 may be each independently represented by one of Formulae 11-1 to 11-11 below, but are not limited thereto:

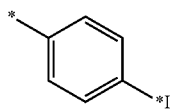

Formula 11-1

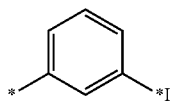

Formula 11-2

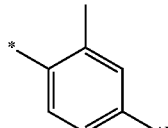

Formula 11-3

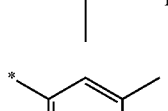

Formula 11-4

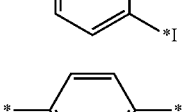

Formula 11-5

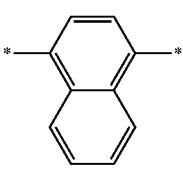

Formula 11-6

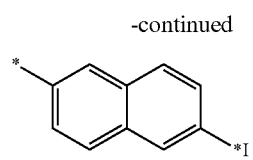

Formula 11-7

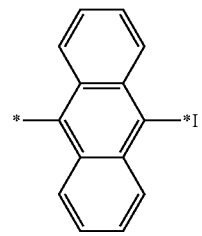

Formula 11-8

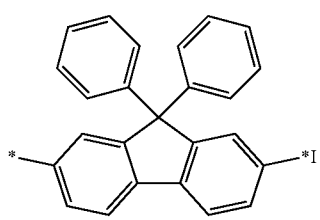

Formula 11-9

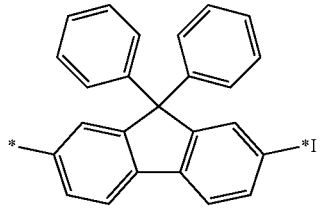

Formula 11-10

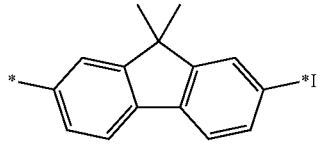

Formula 11-11

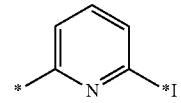

In Formula 1 above, a1 indicates the number of $Ar_1$s, a2 indicates the number of $Ar_2$s, and a3 indicates the number of $Ar_3$s. In some embodiments, a1 to a3 may be each independently an integer from 0 to 5, and in some embodiments, an integer from 0 to 3. When a1 and/or a2 are 0, "carbazole" and/or "fluorene" in Formula 1 may be directly linked to "N". When a1 is 2 or greater, at least two of $Ar_1$s may be identical to or different from each other. When a2 is 2 or greater, at least two of $Ar_e$ may be identical to or different from each other. When a3 is 2 or greater, at least two of $Ar_3$ may be identical to or different from each other.

In some embodiments, in Formula 1 above, i) a1=0 and a2=0; ii) a1=1 and a2=0; iii) a1=2 and a2=0; iv) a1=0 and a2=1; v) a1=0 and a2=2; or vi) a1=1 and a2=1.

In Formula 2 above, c1 indicates the number of $Ar_{11}$s. In some embodiments, c1 may be an integer from 1 to 5, and in some embodiments, 1, 2, or 3. When c1 is 2 or greater, at least two of $Ar_{11}$s may be identical to or different from each other.

In Formulae 1 and 2 above, $R_1$, $R_2$, $R_4$ to $R_8$, $R_{13}$, and $R_{14}$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{64}$alkyl group, a substituted or unsubstituted $C_2$-$C_{60}$alkenyl group, a substituted or unsubstituted $C_2$-$C_{60}$alkynyl group, a substituted or unsubstituted $C_1$-$C_{60}$alkoxy group, a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, a substituted or unsubstituted $C_6$-$C_{60}$aryloxy group, a substituted or unsubstituted $C_6$-$C_{60}$arylthio group, a substituted or unsubstituted $C_2$-$C_{60}$heteroaryl group, —$N(Q_1)(Q_2)$, or —$Si(Q_3)(Q_4)(Q_5)$ (where $Q_1$ to $Q_5$ are each independently selected from a $C_1$-$C_{60}$alkyl group, a $C_1$-$C_{60}$alkoxy group, a $C_6$-$C_{60}$aryl group, or a $C_2$-$C_{60}$heteroaryl group); and $R_3$, $R_{11}$, and $R_{12}$ may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{64}$alkyl group, a substituted or unsubstituted $C_2$-$C_{60}$alkenyl group, a substituted or unsubstituted $C_2$-$C_{60}$alkynyl group, a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, a substituted or unsubstituted $C_2$-$C_{60}$heteroaryl group, or —$Si(Q_3)(Q_4)(Q_5)$ (where $Q_3$ to $Q_5$ are each independently selected from a $C_1$-$C_{60}$alkyl group, a $C_1$-$C_{60}$alkoxy group, a $C_6$-$C_{60}$aryl group, or a $C_2$-$C_{60}$heteroaryl group).

In Formulae 1 and 2 above, $R_1$ to $R_8$, and $R_{11}$ to $R_{14}$ may be each independently selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, or a benzocarbazolyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, or a benzocarbazolyl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, or a $C_1$-$C_{20}$alkoxy group;

a $C_1$-$C_{20}$alkyl group or a $C_1$-$C_{20}$alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

a $C_6$-$C_{20}$aryl group, or a $C_2$-$C_{20}$heteroaryl group;

a $C_6$-$C_{20}$aryl group or a $C_2$-$C_{20}$heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; and —$N(Q_{11})(Q_{12})$, or —$Si(Q_{13})(Q_{14})(Q_{15})$ (wherein $Q_{11}$ to $Q_{15}$ are each independently a $C_1$-$C_{20}$alkyl group, a $C_1$-$C_{20}$alkoxy group, a $C_6$-$C_{20}$aryl group, or a $C_2$-$C_{20}$heteroaryl group).

In some embodiments, $R_3$ to $R_5$, and $R_{11}$ to $R_{14}$ in Formulae 1 and 2 may be each independently represented by one of Formulae 12-1 to 12-22 below:

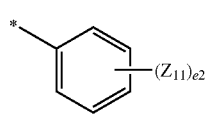

Formula 12-1

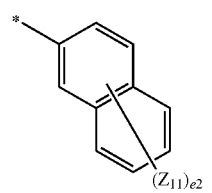

Formula 12-2

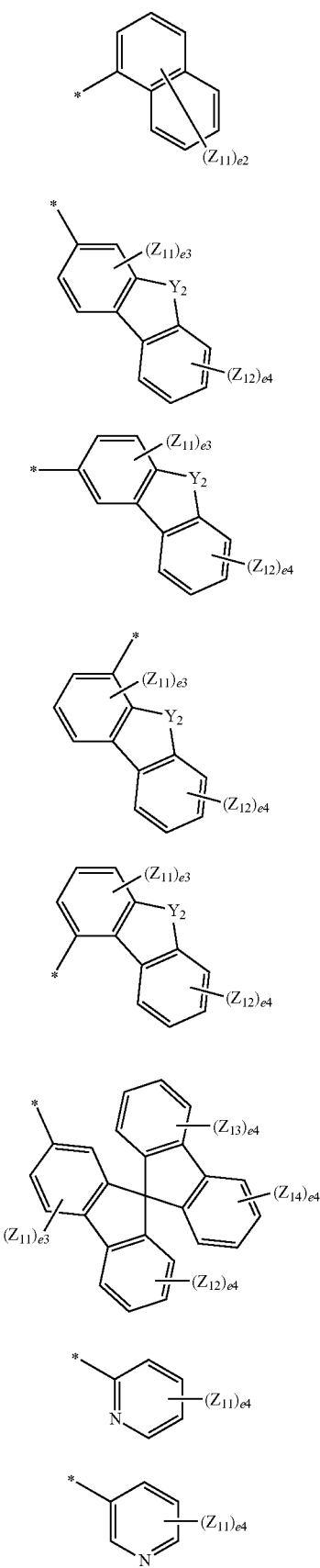
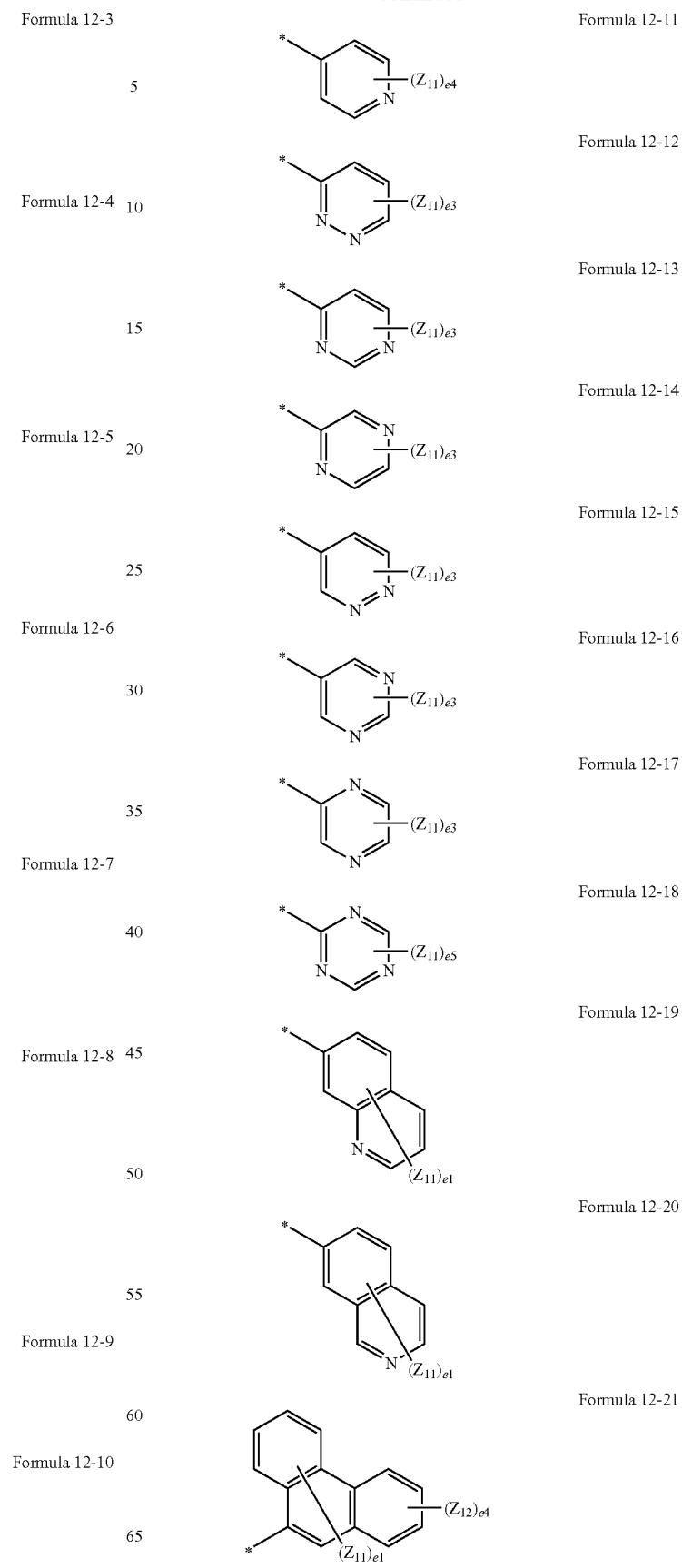

Formula 12-22

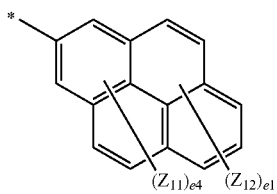

In Formulae 12-20 to 12-22 above, $Y_2$ may be O, S, $C(R_{25})(R_{26})$, or $N(R_{27})$;

$Z_{11}$ to $Z_{14}$, and $R_{25}$ to $R_{27}$ may be each independently selected from:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phoshoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phoshoric acid group or a salt thereof;

a $C_6$-$C_{20}$ aryl group or a $C_2$-$C_{20}$ heteroaryl group;

a $C_6$-$C_{20}$aryl group, or a $C_2$-$C_{20}$heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group;

—$N(Q_{11})(Q_{12})$, or —$Si(Q_{13})(Q_{14})(Q_{15})$ (wherein $Q_{11}$ to $Q_{15}$ are each independently a $C_1$-$C_{20}$alkyl group, a $C_1$-$C_{20}$alkoxy group, a $C_6$-$C_{20}$aryl group, or a $C_2$-$C_{20}$heteroaryl group);

e1 may be an integer from 1 to 6;

e2 may be an integer from 1 to 7;

e3 may be an integer from 1 to 3;

e4 may be an integer from 1 to 4;

e5 may be an integer of 1 or 2.

In some other embodiments, $R_3$ to $R_8$, and $R_{11}$ to $R_{14}$ in Formulae 1 and 2 may be each independently represented by one of Formulae 13-1 to 13-19 below, but are not limited thereto:

Formula 13-1

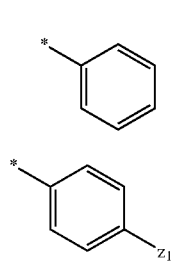

Formula 13-2

Formula 13-3

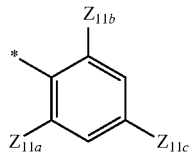

Formula 13-4

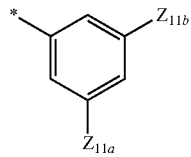

Formula 13-5

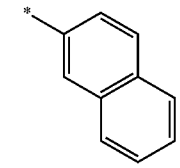

Formula 13-6

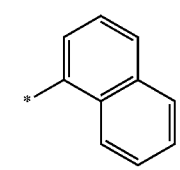

Formula 13-7

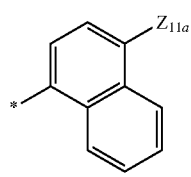

Formula 13-8

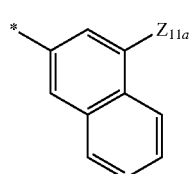

Formula 13-9

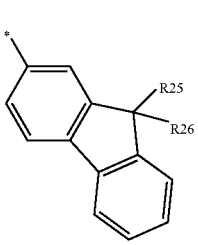

Formula 13-10

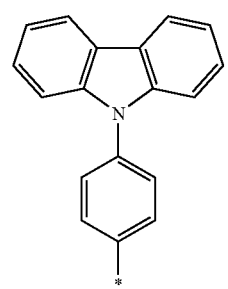

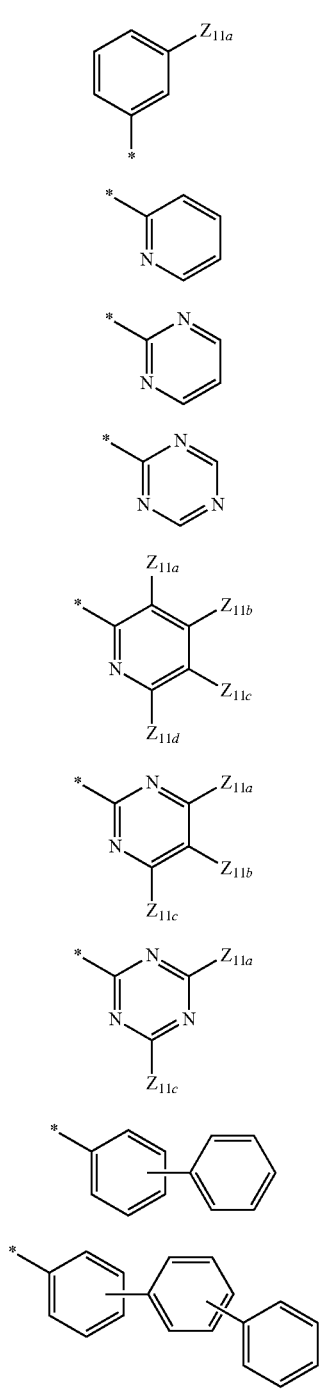

Formula 13-11

Formula 13-12

Formula 13-13

Formula 13-14

Formula 13-15

Formula 13-16

Formula 13-17

Formula 13-18

Formula 13-19

In Formulae 13-1 to 13-19 above, $Z_{11a}$ to $Z_{11c}$ may be defined as described above in conjunction with $Z_{11}$.

For example, $Z_{11a}$ to $Z_{11c}$, $R_{25}$, and $R_{26}$ in Formulae 13-1 to 13-19 above may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phoshoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phoshoric acid group or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group; or a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

In some other embodiments, $R_1$ and $R_2$ in Formula 1 may be each independently selected from a $C_1$-$C_{20}$ alkyl group;

a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phoshoric acid group or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group; or a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a fluorenyl group, a dimethyifluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

In Formula 1 above, b1 indicates the number of $R_5$s, b2 indicates the number of $R_6$s, b3 indicates the number of $R_7$s, and b4 indicates the number of $R_a$s. In Formula 2 above, c2 indicates the number of $R_{13}$s, and c3 indicates the number of $R_{14}$s. In Formulae 1 and 2 above, b1, b4, c2, and c3 may be each independently an integer from 1 to 4, and b2 and b3 may be each independently an integer from 1 to 3.

The first compound in the first HTL may be a compound represented by Formula 1A(1) or 1B(1) below, but is not limited thereto:

Formula 1A(1)
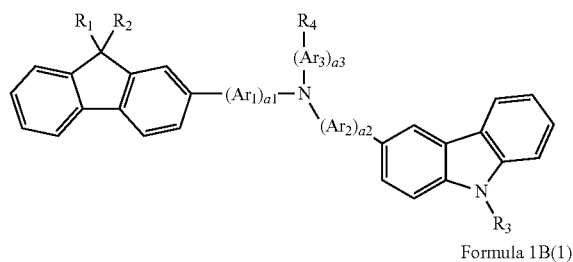
Formula 1B(1)
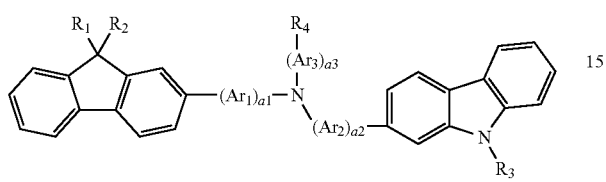
In Formulae 1A(1) and 1B(1), $R_1$ to $R_4$, $Ar_1$ to $Ar_3$, a1, a2, and a3 may be the same as those defined above in conjunction with Formula 1.
In some embodiments, the first compound in the first HTL may include at least one of Compounds 309 to 320 below, but is not limited thereto:
309
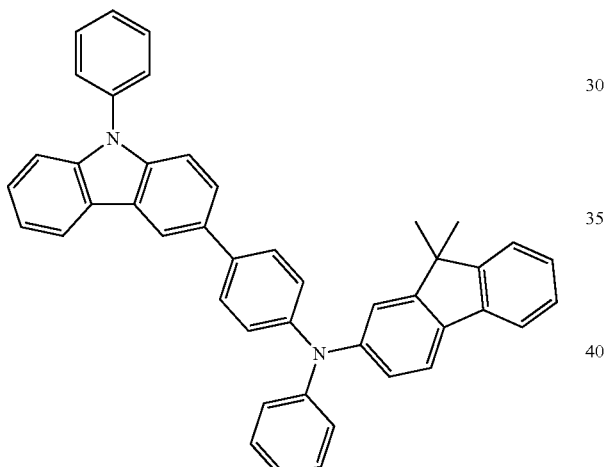
310
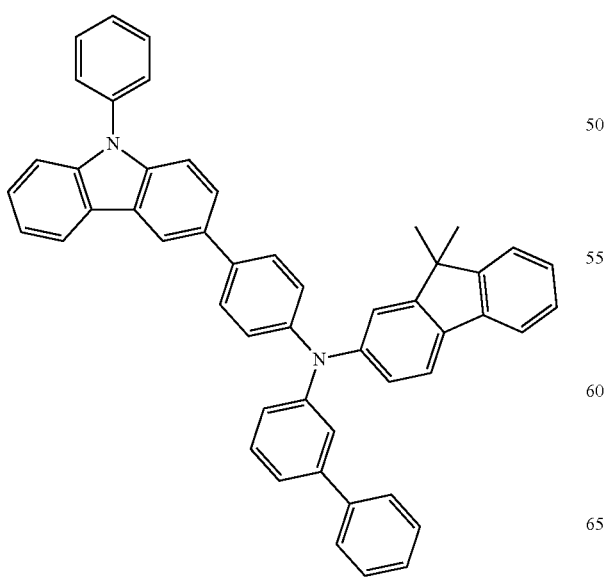
311
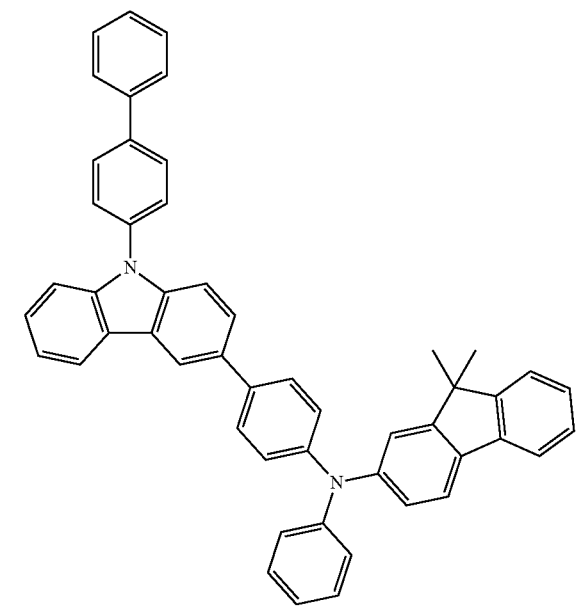
312

-continued
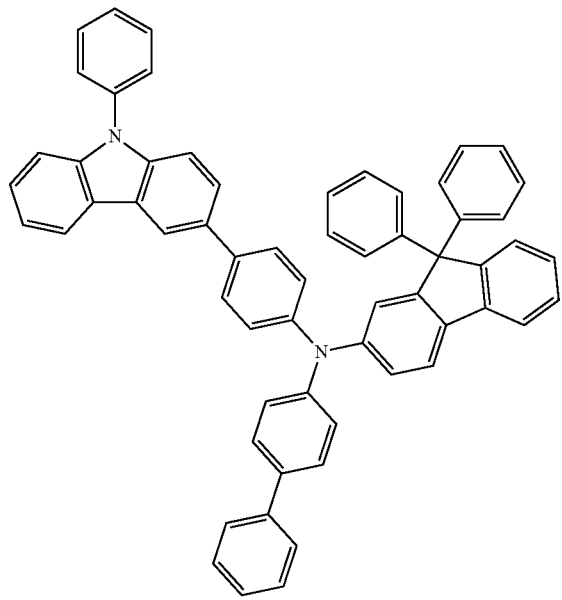
313
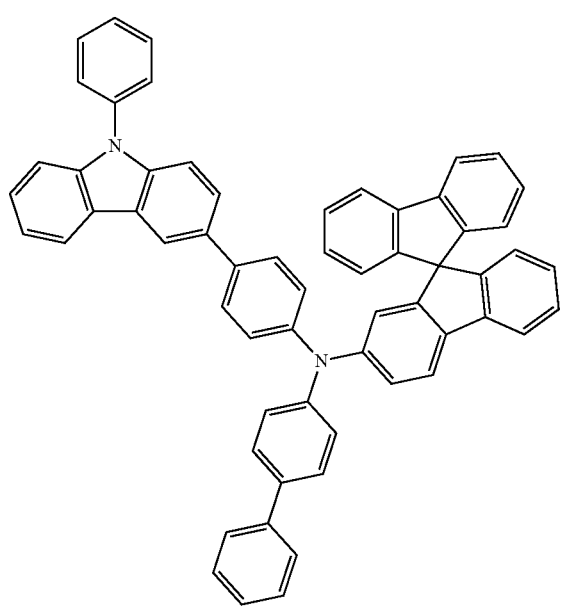
314
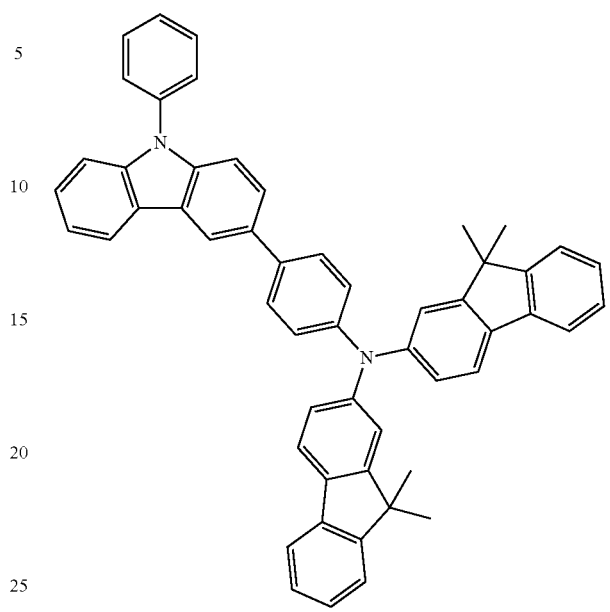
315
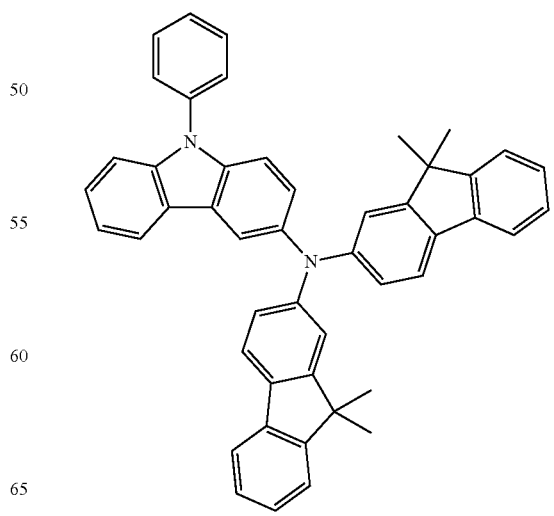
316
317

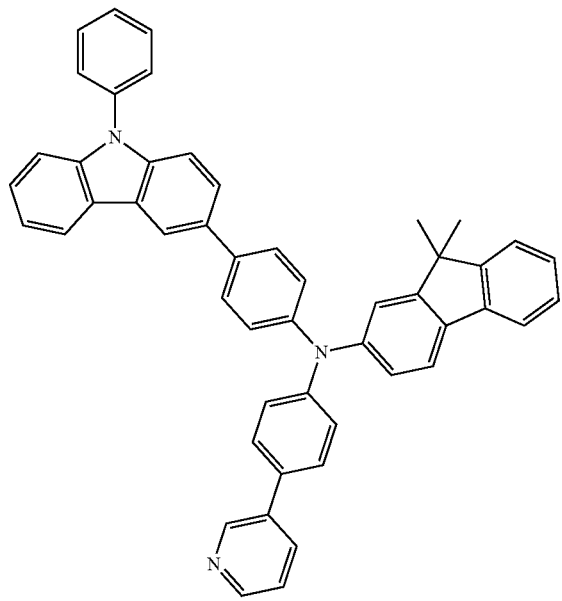
318
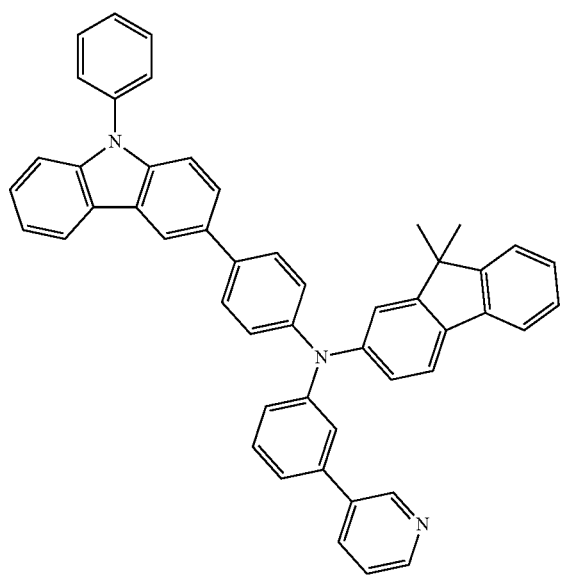
319
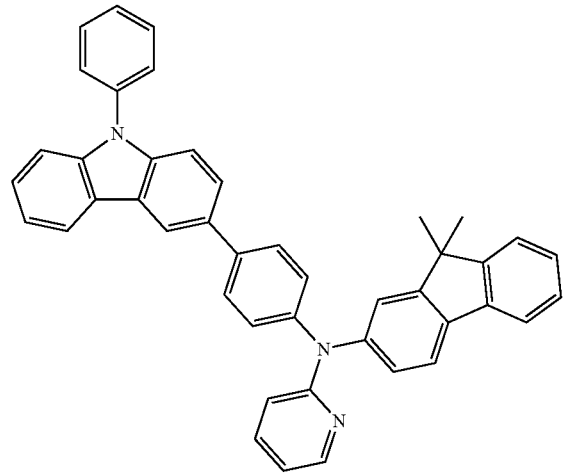
320
The second compound in the second HTL may include at least one of Compounds 701 to 715 below, but is not limited thereto:
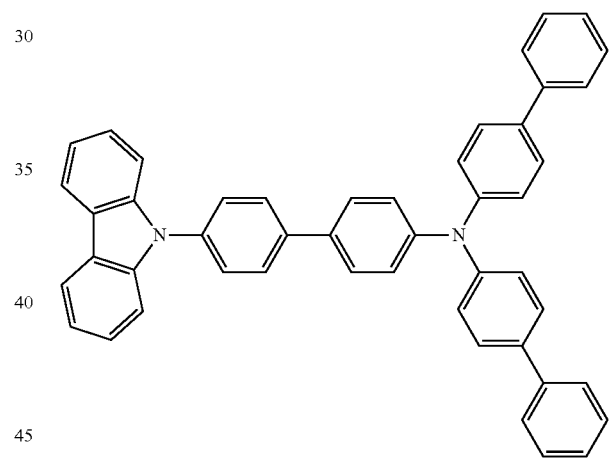
701
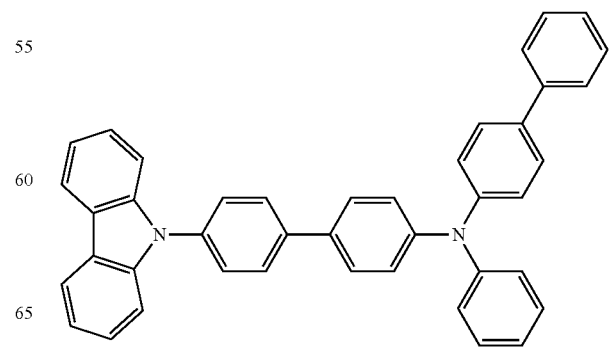
702

703
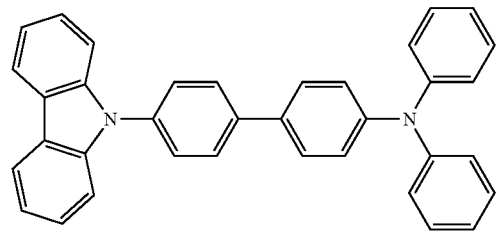
704
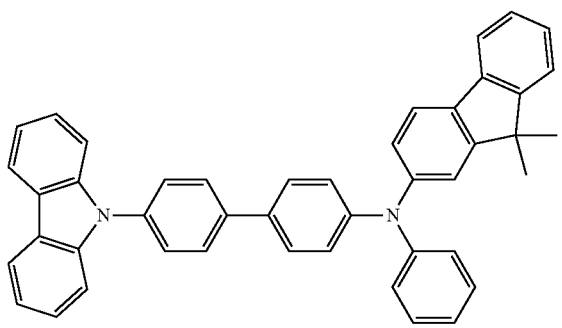
705
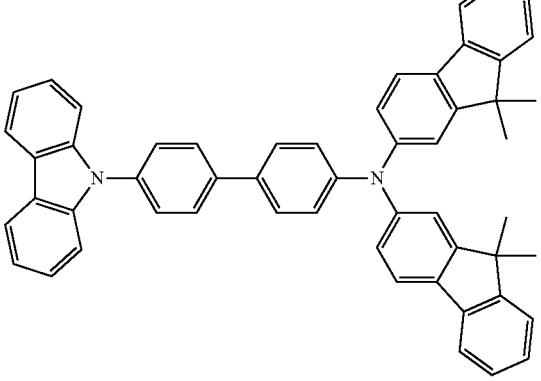
706
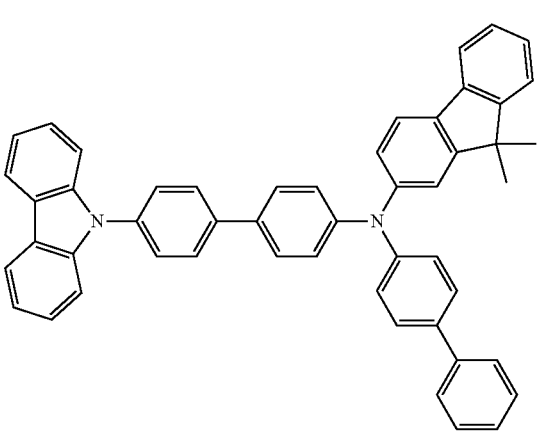
707
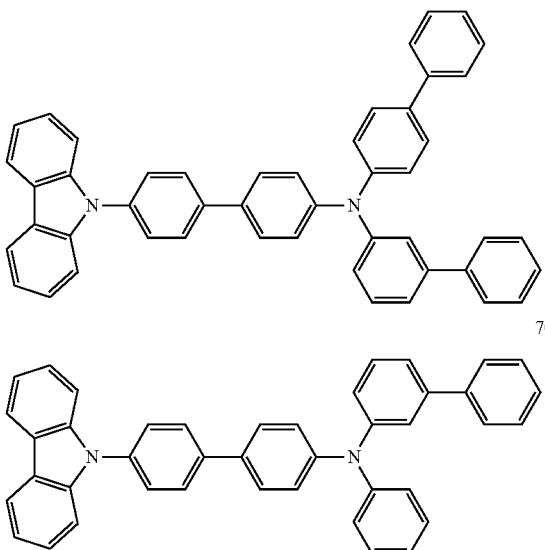
708
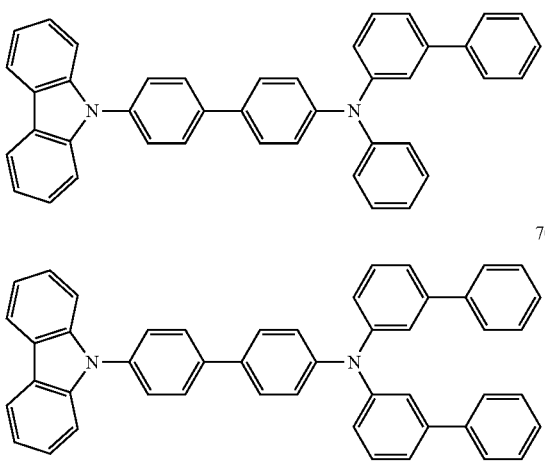
709
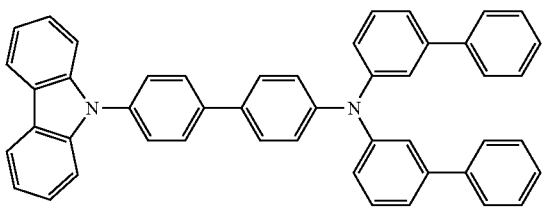
710
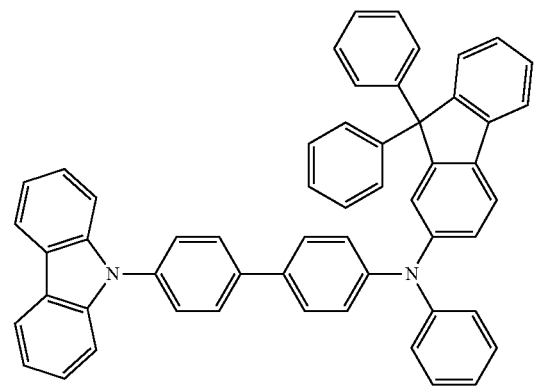
711
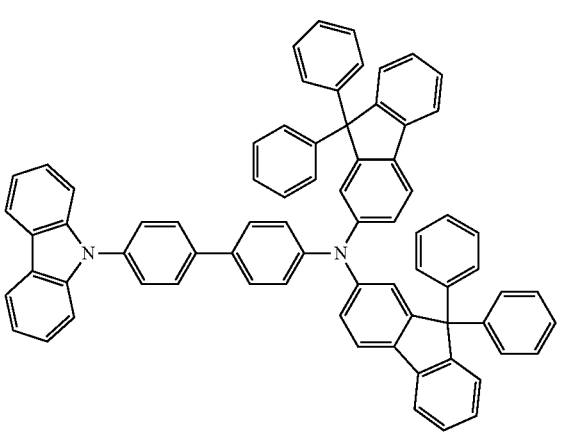

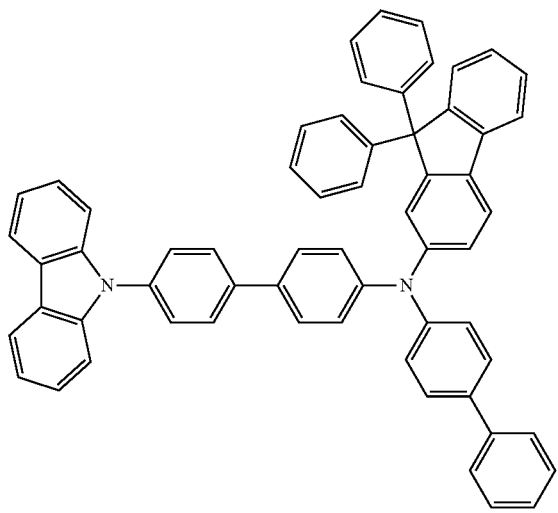
712

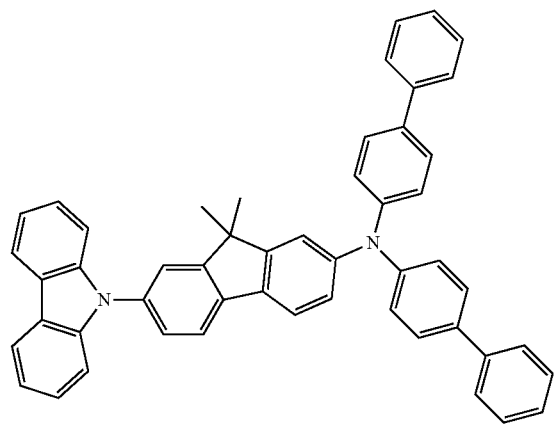
713

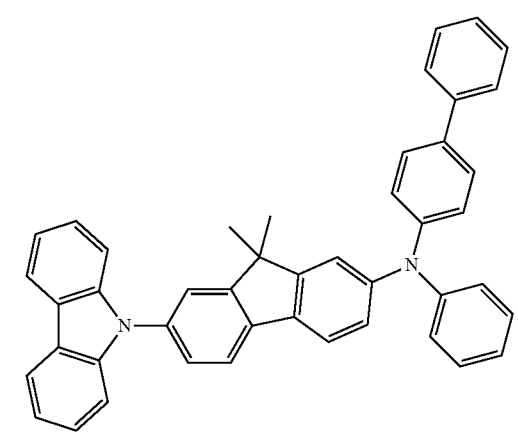
714

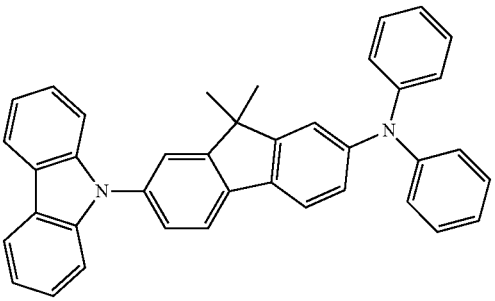
715

As used in the present application, at least one substituent for the substituted $C_3$-$C_{10}$cycloalkylene group, the substituted $C_2$-$C_{14}$heterocycloalkylene group, the substituted $C_3$-$C_{10}$cycloalkenylene group, the substituted $C_2$-$C_{10}$heterocycloalkenylene group, the substituted $C_6$-$C_{60}$arylene group, the substituted $C_2$-$C_{60}$heteroarylene group, the substituted $C_3$-$C_{10}$cycloalkyl group, the substituted $C_2$-$C_{10}$heterocycloalkyl group, the substituted $C_3$-$C_{10}$cycloalkenyl group, the substituted $C_2$-$C_{10}$heterocycloalkenyl group, the substituted $C_6$-$C_{60}$aryl group, the substituted $C_2$-$C_{60}$heteroaryl group, the substituted $C_1$-$C_{60}$alkyl group, the substituted $C_2$-$C_{60}$alkenyl group, the substituted $C_2$-$C_{60}$alkynyl group, the substituted $C_1$-$C_{60}$alkoxy group, the substituted $C_6$-$C_{60}$aryloxy group, or the substituted $C_6$-$C_{60}$arylthio group may be selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, or a $C_1$-$C_{60}$alkoxy group;

a $C_1$-$C_{60}$alkyl group, a $C_2$-$C_{60}$alkenyl group, a $C_2$-$C_{60}$alkynyl group, or a $C_1$-$C_{60}$alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, or a $C_2$-$C_{60}$heteroaryl group;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, or a $C_2$-$C_{60}$heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a phenyl group, a naphthyl group, an anthracenyl group, a fluorenyl group, dimethyifluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; and —N($Q_{11}$)($Q_{12}$), or —Si($Q_{13}$)($Q_{14}$)($Q_{15}$) (where $Q_{11}$ to $Q_{15}$ may be each independently selected from a $C_1$-$C_{60}$alkyl group, a $C_1$-$C_{60}$alkoxy group, a $C_6$-$C_{60}$aryl group, or a $C_2$-$C_{60}$heteroaryl group, but are not limited thereto.)

As used herein, a unsubstituted $C_1$-$C_{60}$alkyl group (or a $C_1$-$C_{60}$alkyl group) may refer to a $C_1$-$C_{60}$ liner or branched alkyl group, for example, a methyl group, an ethyl group, a propyl group, an isobutyl group, a sec-butyl group, a pentyl group, an iso-amyl group, or a hexyl group. A substituted $C_1$-$C_{60}$alkyl group may include at least one substitutent selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, or a $C_1$-$C_{60}$alkoxy group;

a $C_1$-$C_{60}$alkyl group, a $C_2$-$C_{60}$alkenyl group, a $C_2$-$C_{60}$alkynyl group, or a $C_1$-$C_{60}$alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, or a $C_2$-$C_{60}$heteroaryl group;

a $C_3$-$C_{10}$cycloalkyl group, a $C_2$-$C_{10}$heterocycloalkyl group, a $C_3$-$C_{10}$cycloalkenyl group, a $C_2$-$C_{10}$heterocycloalkenyl group, a $C_6$-$C_{60}$aryl group, a $C_6$-$C_{60}$aryloxy group, a $C_6$-$C_{60}$arylthio group, or a $C_2$-$C_{60}$heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a phenyl group, a naphthyl group, an anthracenyl group, a fluorenyl group, dimethylfluorenyl group, a diphenyifluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; or —N($Q_{17}$)($Q_{12}$); or —Si($Q_{11}$)($Q_{12}$)($Q_{13}$) (wherein $Q_{11}$ and $Q_{12}$ may be each independently a $C_6$-$C_{60}$aryl group or a $C_2$-$C_{60}$heteroaryl group, and $Q_{13}$ to $Q_{15}$ may be each independently a $C_1$-$C_{60}$alkyl group, a $C_1$-$C_{60}$alkoxy group, a $C_6$-$C_{60}$aryl group, or a $C_2$-$C_{60}$heteroaryl group), but embodiments of the invention are not limited thereto.

The unsubstituted $C_1$-$C_{60}$ alkoxy group (or a $C_1$-$C_{60}$ alkoxy group) may refer to a group represented by —OA, wherein A is an unsubstituted $C_1$-$C_{60}$ alkyl group described above. Non-limiting examples of the unsubstituted $C_1$-$C_{60}$ alkoxy group are a methoxy group, an ethoxy group, and an isopropyloxy group. The substituted $C_1$-$C_{60}$ alkoxy group may refer to the unsubstituted $C_1$-$C_{60}$ alkoxy group in which at least one of the hydrogen atoms is substituted with the substituents described above in conjunction with the substituted $C_1$-$C_{60}$ alkyl group.

The unsubstituted $C_2$-$C_{60}$ alkenyl group (or a $C_2$-$C_{60}$ alkenyl group) may refer to a hydrocarbon chain having at least one carbon-carbon double bond at one or more positions along a carbon chain of the unsubstituted $C_2$-$C_{60}$ alkyl group. For example, the unsubstituted $C_2$-$C_{60}$ alkenyl group may include a terminal alkene and/or an internal alkene. Non-limiting examples of the $C_2$-$C_{60}$ alkenyl group are an ethenyl group, a propenyl group, a butenyl group, and the like. The substituted $C_2$-$C_{60}$ alkenyl group may refer to the unsubstituted $C_2$-$C_{60}$ alkenyl group in which at least one hydrogen atom is substituted with those substituents described above in conjunction with the substituted $C_1$-$C_{60}$ alkyl group.

The unsubstituted $C_2$-$C_{60}$ alkynyl group (or a $C_2$-$C_{60}$ alkynyl group) may refer to a hydrocarbon chain having at least one carbon-carbon triple bond at one or more positions along a carbon chain of the unsubstituted $C_2$-$C_{60}$ alkyl group. For example, the unsubstituted $C_2$-$C_{60}$ alkynyl group may include a terminal alkyne and/or an internal alkyne. Non-limiting examples of the unsubstituted $C_2$-$C_{60}$ alkynyl group are an ethenyl group, a propynyl group, and the like. The substituted $C_2$-$C_{60}$ alkynyl group may refer to the unsubstituted $C_2$-$C_{60}$ alkynyl group in which at least one hydrogen atom is substituted with those substituents described above in conjunction with the substituted $C_1$-$C_{60}$ alkyl group.

The unsubstituted $C_6$-$C_{60}$ aryl group may refer to a monovalent group having a carbocyclic aromatic system having 6 to 60 carbon atoms and including at least one aromatic ring. The unsubstituted $C_6$-$C_{60}$ arylene group is a divalent group having a carbocyclic aromatic system having 6 to 60 carbon atoms and including at least one aromatic ring. When the aryl group or the arylene group have at least two rings, the rings may be fused to each other or connected to each other via a single bond. The substituted $C_6$-$C_{60}$ aryl group may refer to the unsubstituted $C_6$-$C_{60}$ aryl group in which at least one hydrogen atom is substituted with those substituents described above in conjunction with the $C_1$-$C_{60}$ alkyl group.

Non-limiting examples of the substituted or unsubstituted $C_6$-$C_{60}$ aryl group are a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a ($\alpha$,$\alpha$-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolinyl group, a methylanthracenyl group, a phenanthryl group, a triphenyienyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, or an ovalenyl group. Non-limiting examples of the substituted $C_6$-$C_{60}$ aryl group may be inferred from those of the unsubstituted $C_6$-$C_{60}$ aryl group and the substituted $C_1$-$C_{60}$ alkyl group described above. Non-limiting examples of the substituted or unsubstituted $C_6$-$C_{60}$ arylene group may be inferred from those examples of the substituted or unsubstituted $C_6$-$C_{60}$ aryl group described above.

The unsubstituted $C_2$-$C_{60}$ heteroaryl group may refer to a monovalent group having at least one aromatic ring having at least one of the heteroatoms selected from N, O, P, and S. The unsubstituted $C_2$-$C_{60}$ heteroarylene group may refer to a divalent group having at least one aromatic ring having at least one of the heteroatoms selected from N, O, P, and S. In embodiments of the present invention, when the heteroaryl group or the heteroarylene group have at least two rings, the rings may be fused to each other or connected to each other via a single bond. The substituted $C_2$-$C_{60}$ heteroaryl group and the substituted $C_2$-$C_{60}$ heteroarylene group may refer to the unsubstituted $C_2$-$C_{60}$ heteroaryl group and the unsubstituted $C_2$-$C_{60}$ heteroarylene group in which at least one hydrogen atom is substituted with those substituents described with reference to the substituted $C_1$-$C_{60}$ alkyl group.

Non-limiting examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group and an imidazopyrimidinyl group. Examples of the substituted or unsubstituted $C_2$-$C_{60}$ heteroarylene group may be inferred from those examples of the substituted or unsubstituted $C_6$-$C_{60}$ arylene group described above.

The substituted or unsubstituted $C_6$-$C_{60}$ aryloxy group may refer to a group represented by —$OA_2$ (where $A_2$ is a substituted or unsubstituted $C_6$-$C_{60}$ aryl group described above). The substituted or unsubstituted $C_6$-$C_{60}$ arylthiol group may refer to a group represented by —$SA_3$ (where $A_3$ is a substituted or unsubstituted $C_6$-$C_{60}$ aryl group described above).

A total thickness of the first HTL and the second HTL may be from about 50 Å to about 3000 Å, and in some embodiments, from about 100 Å to about 2000 Å. A thickness ratio of the first HTL to the second HTL may be from about 1:9 to about 9:1, and in some embodiments, from about 3:7 to about 7:3, but embodiments of the present invention are not limited thereto. The second HTL may have a thickness of about 50 Å to about 3000 Å. When a total thickness of the first HTL and the second HTL, and a thickness ratio of the first HTL to the second HTL is within the above ranges, the first and second HTLs may have satisfactory hole transporting ability without a substantial increase in driving voltage.

In the embodiments here i) at least one of the first HTL and the second HTL or ii) the HIL is formed, at least one of the HIL, the first HTL and the second HTL may further include a p-dopant.

An amount of the additional p-dopant in each of the HIL, the first HTL, and the second HTL may be selected from a range of about 0.1 wt % to about 20 wt %, and in some embodiments, of about 0.5 wt % to about 15 wt %, each based on 100 wt % of each of the HIL, the first HTL, and the second HTL. When the amount of the additional p-dopant is within these ranges, excess hole injection from the first electrode into the EML may be prevented, so that lifetime of the organic light-emitting device may be improved.

The p-dopant may be selected from any materials able to facilitate hole transport.

For example, the p-dopant may be at least one material selected from quinone derivatives, metal oxides, and compounds with a cyano group, but is not limited thereto. Non-limiting examples of the p-dopant include quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

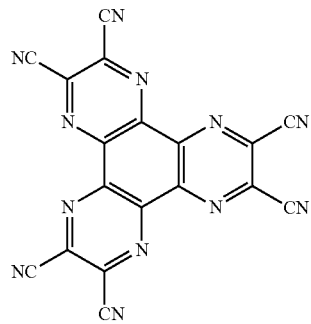

Compound 200

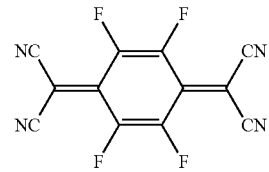

F4-TCNQ

The EML may include a host and a dopant.

For example, the host may further include at least one of $Alq_3$, 4,4'-N,N'-dicarbazole-biphenyl (CBP), 9,10-di(naphthalene-2-yl)anthracene (ADN), TCTA (refer to a formula below), 1,3,5-tris(N-phenylbenzimidazole-2-yl)benzene (TPBI), 3-tert-butyl-9,10-di-2-naphthylanthracene (TBADN), E3 (refer to a formula below), dmCBP (refer to a formula below), and Compounds 501 to 509 below.

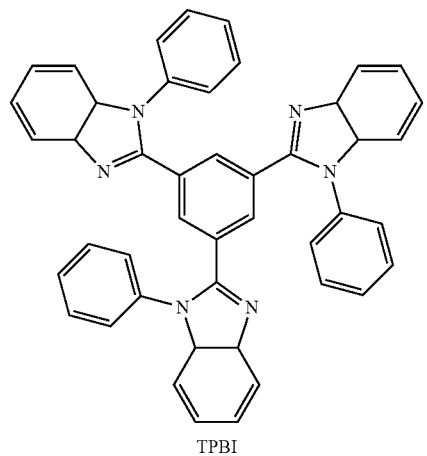

TPBI

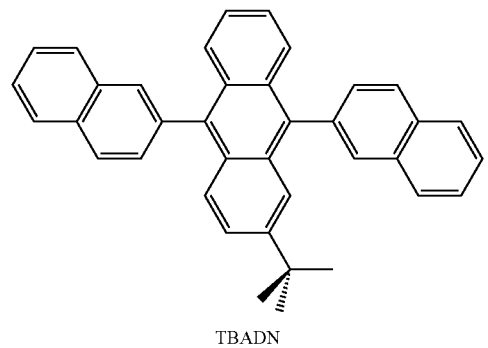

TBADN

-continued
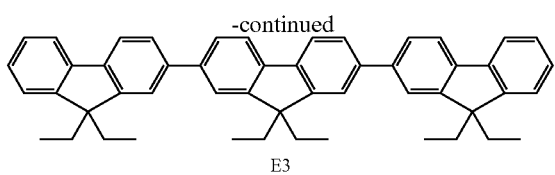
E3
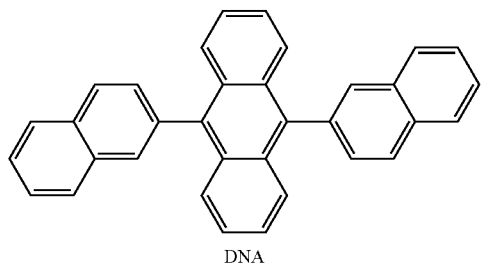
DNA
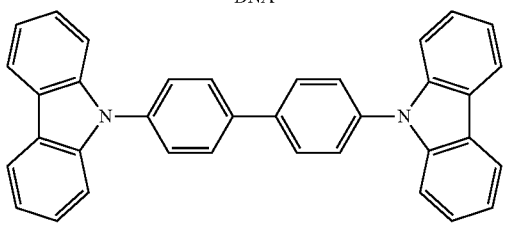
CBP
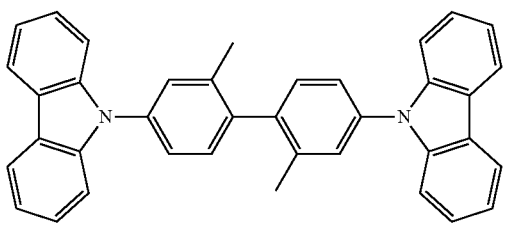
dmCBP
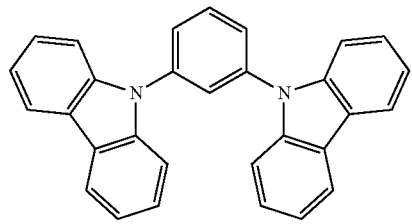
501
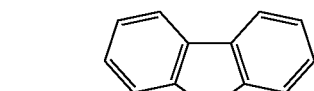
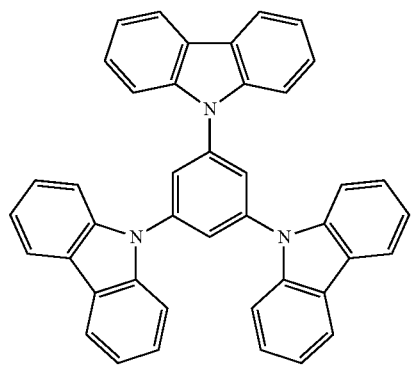
502
-continued
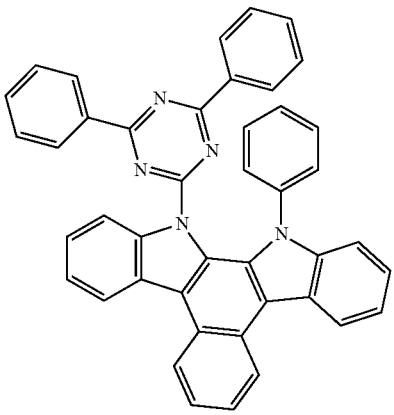
503
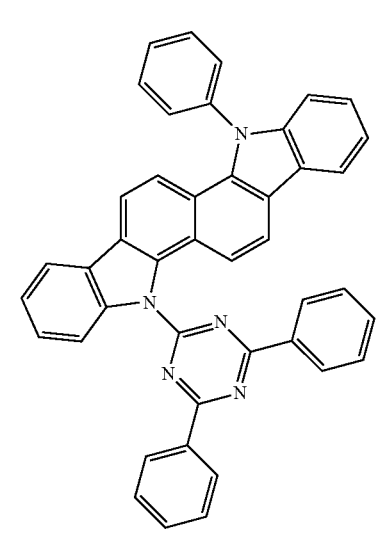
504
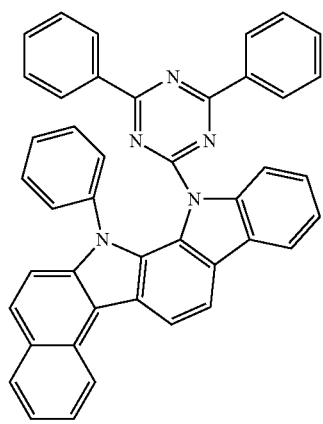
505

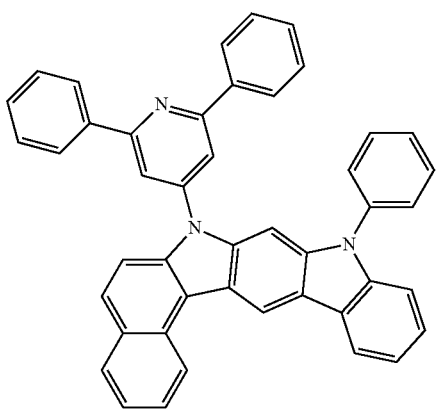

506

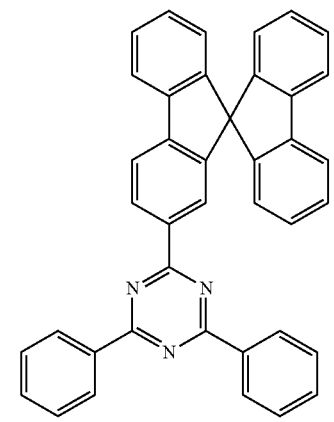

507

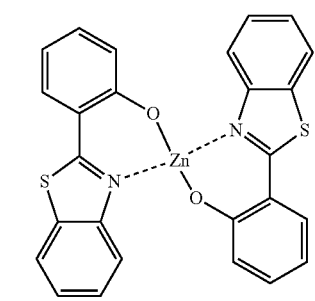

508

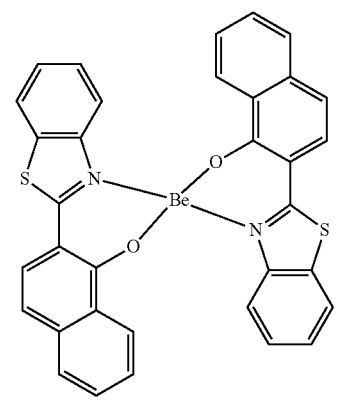

509

In some embodiments, the host may include an anthracene-based compound represented by Formula 400 below.

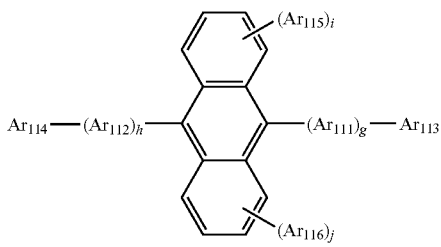

Formula 400>

In some embodiments, $Ar_{111}$ and $Ar_{112}$ in Formula 400 may be each independently selected from a phenylene group, a naphthylene group, a phenanthrenylene group, or a pyrenylene group; or a phenylene group, a naphthylene group, a phenanthrenylene group, a fluorenyl group, or a pyrenylene group, each substituted with at least one of a phenyl group, a naphthyl group, or an anthracenylene group, but embodiments of the invention are not limited thereto.

In Formula 400 above, $Ar_{113}$ to $Ar_{116}$ may be each independently selected from a $C_1$-$C_{10}$alkyl group; a phenyl group, a naphthyl group, a phenanthrenyl group, a fluorenyl group, or a pyrenyl group; or a phenyl group, a naphthyl group, a phenanthrenyl group, a fluorenyl group, and a pyrenyl group, each substituted with at least one of a phenyl group, a naphthyl group, or an anthracenyl group.

In Formula 400, g, h, i, and j may be each independently an integer from 0 to 4, and in some embodiments, may be 0, 1, or 2.

In Formula 400 above, $Ar_{113}$ to $Ar_{116}$ may be each independently selected from a $C_1$-$C_{10}$alkyl group substituted with at least one of a phenyl group, a naphthyl group, or an anthracenyl group;

a phenyl group, a naphthyl group, an anthracenyl group, a pyrenyl group, a phenanthrenyl group, or a fluorenyl group;

a phenyl group, a naphthyl group, an anthracenyl group, a pyrenyl group, a phenanthrenyl group, or a fluorenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a phenyl group, a naphthyl group, an anthracenyl group, a pyrenyl group, a phenanthrenyl group, or a fluorenyl group; or

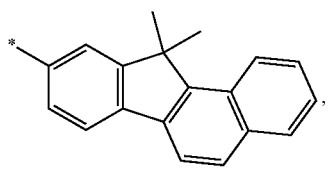 [SMILES: *c1ccc2c(c1)C(C)(C)c1c-2ccc2ccccc12]

but are not limited thereto.

In some embodiments, the anthracene-based compound of Formula 400 above may be one of the compounds represented by the following formulae, but is not limited thereto:

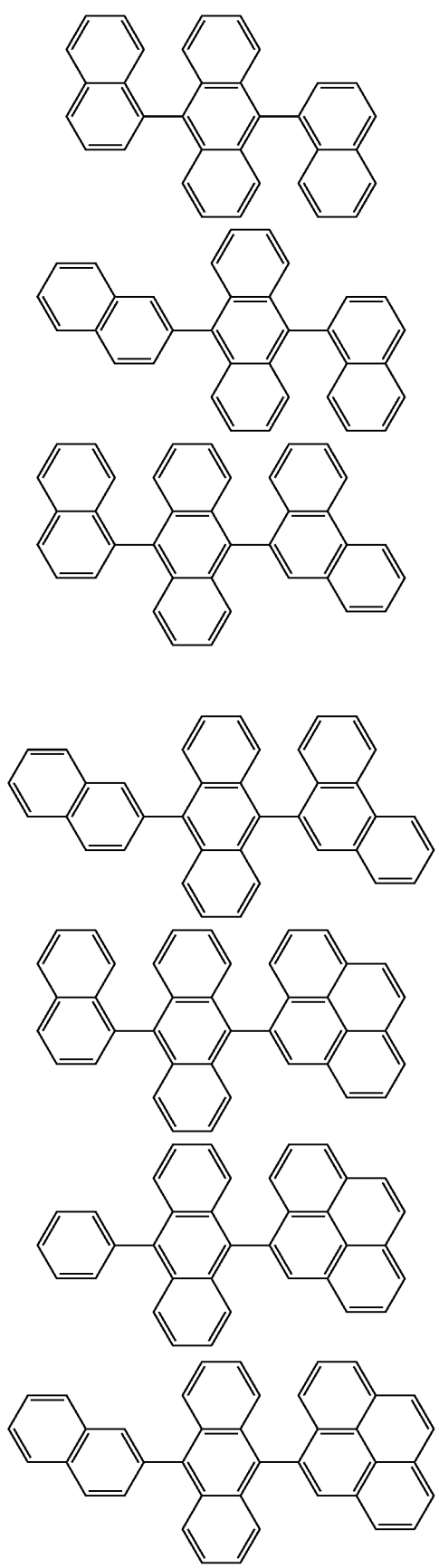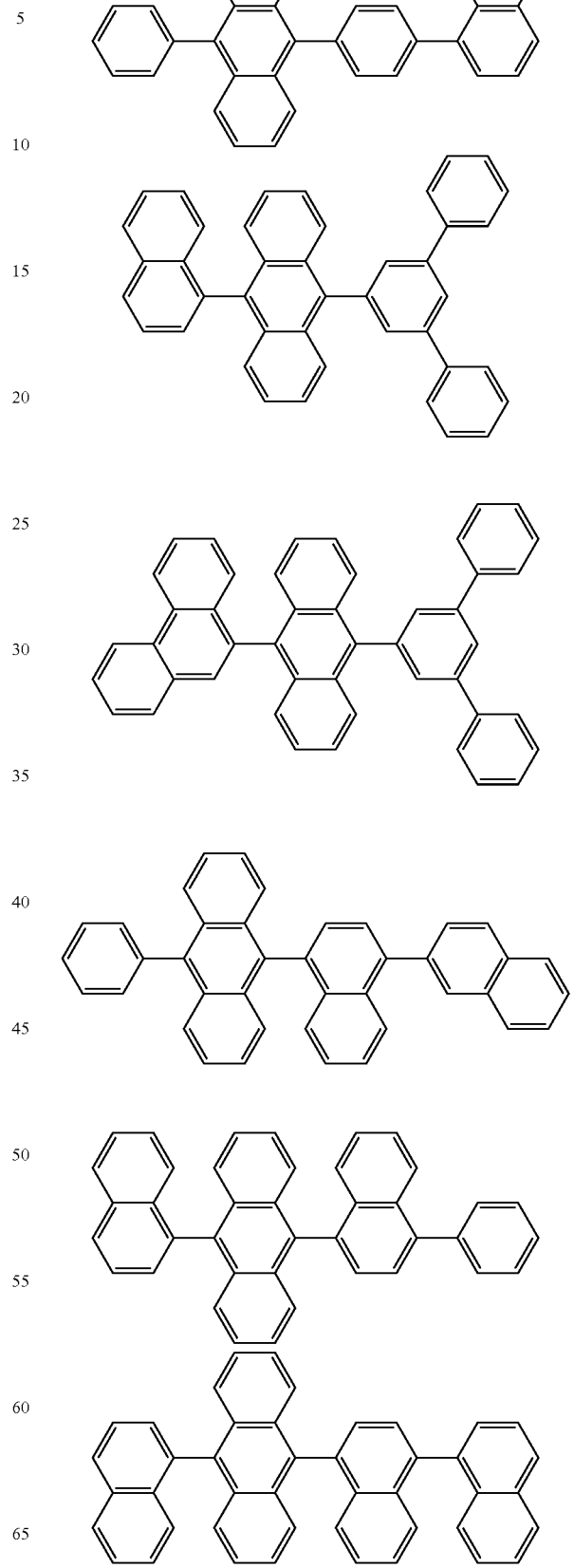

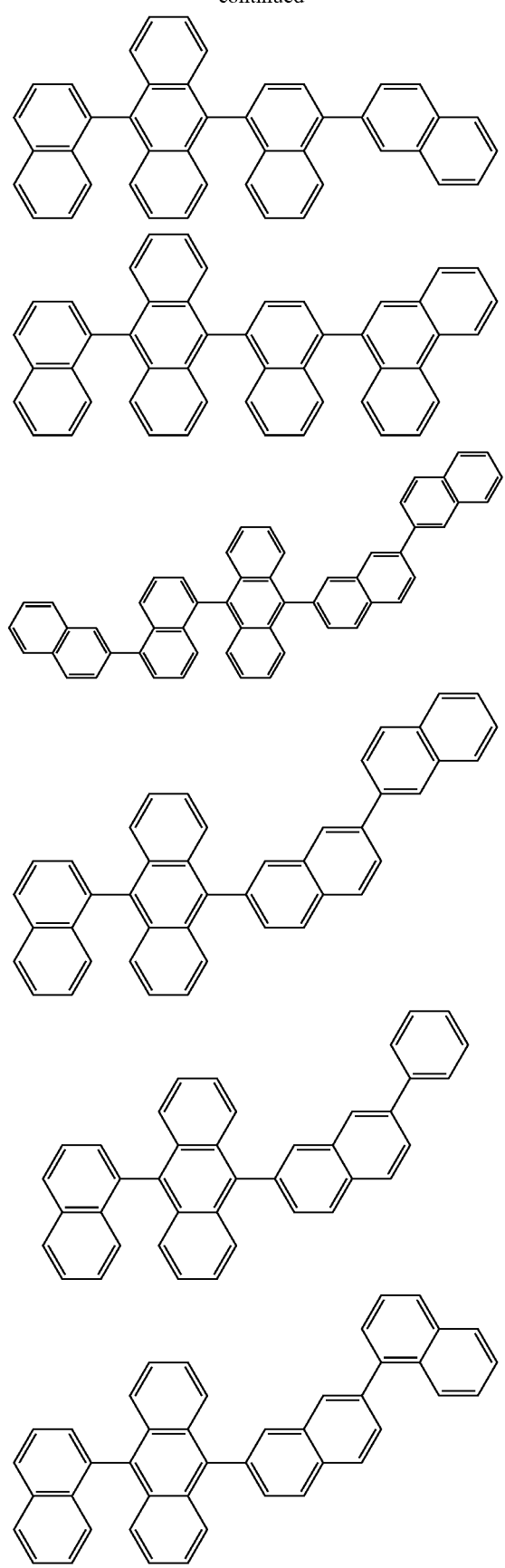
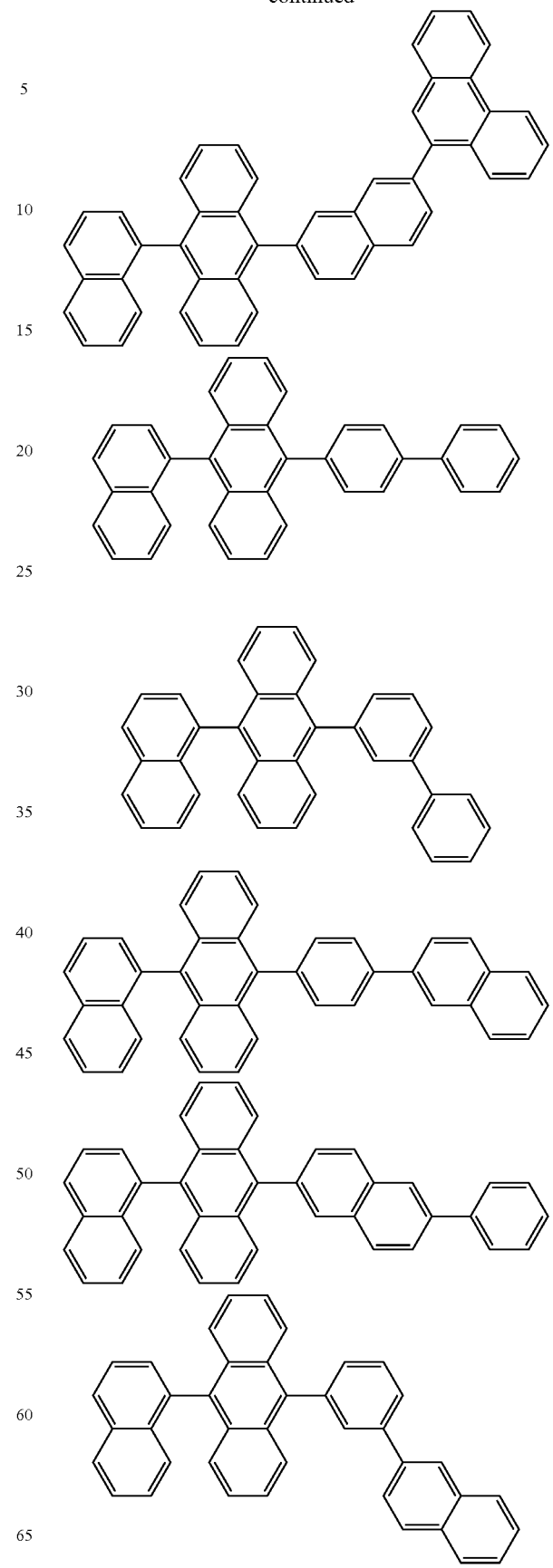

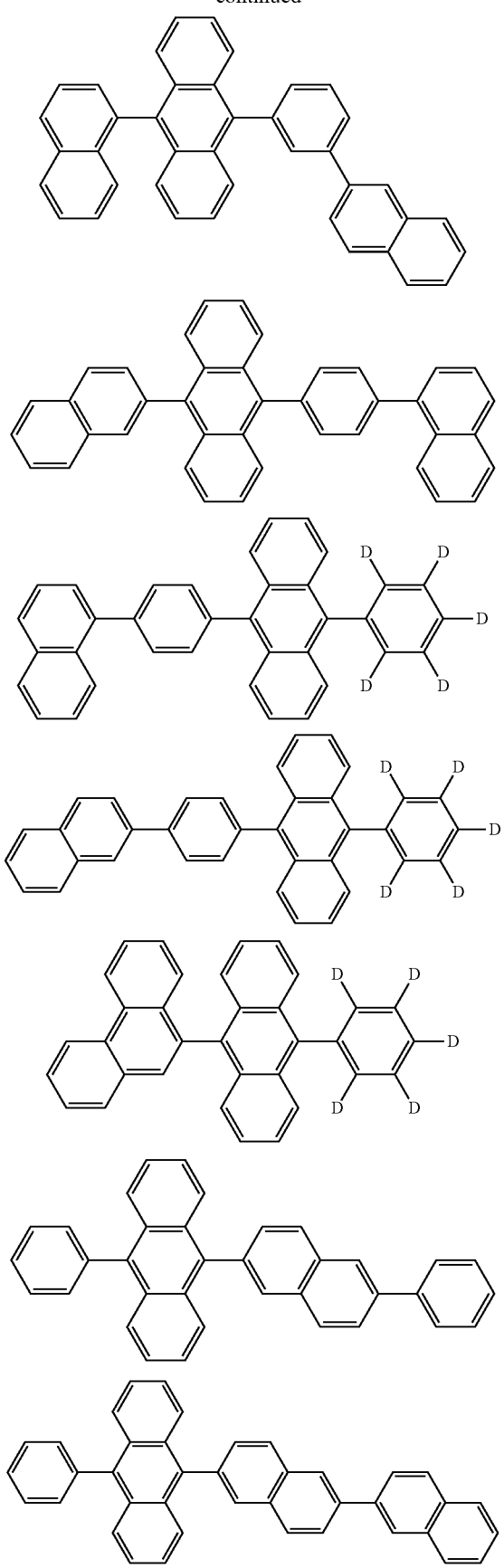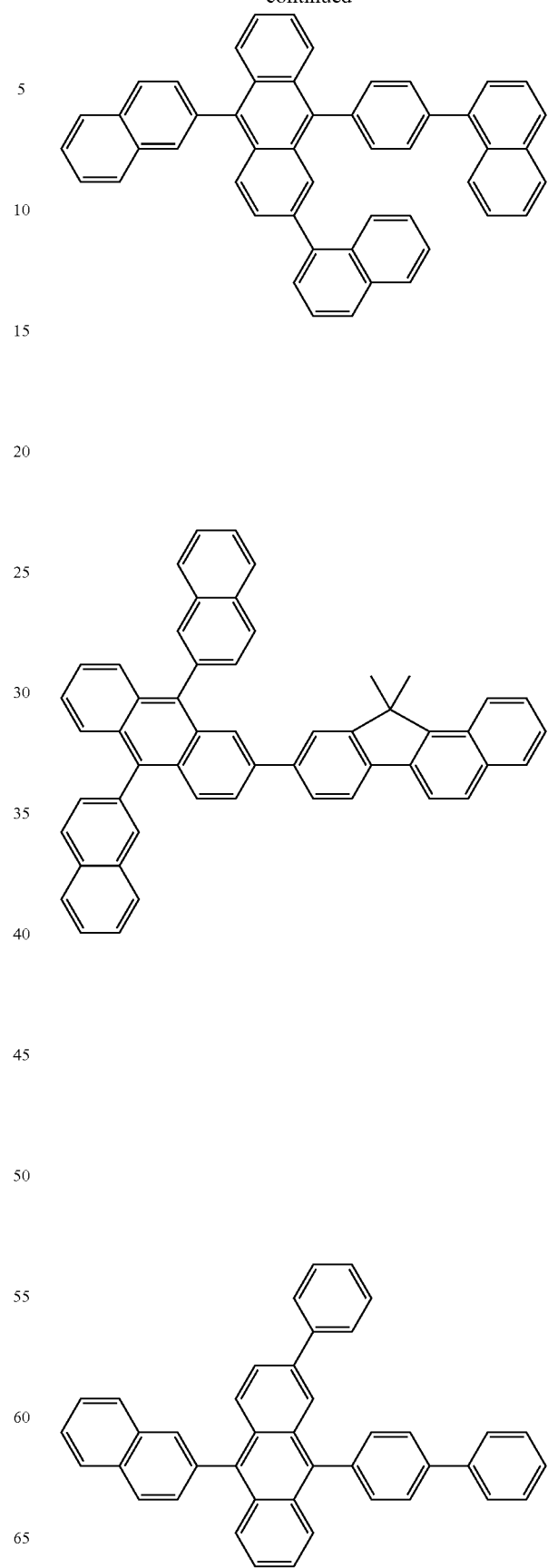

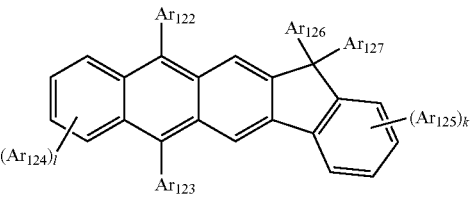

Formula 401

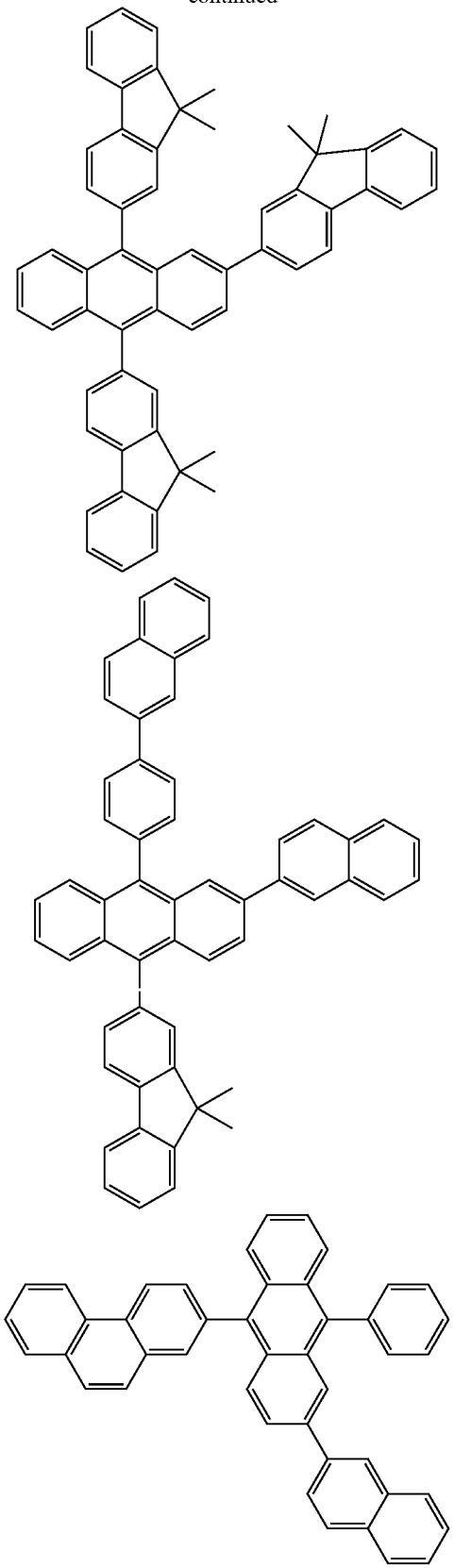

Ar$_{122}$ to Ar$_{125}$ in Formula 401 above may be defined as described above in conjunction with Ar$_{113}$ of Formula 400, and thus detailed descriptions thereof will not be provided here.

Ar$_{126}$ and Ar$_{127}$ in Formula 401 above may be each independently a C$_1$-C$_{10}$ alkyl group, for example, a methyl group, an ethyl group, or a propyl group.

In Formula 401, k and l may be each independently an integer from 0 to 4, for example, 0, 1, or 2.

In some embodiments, the anthracene compound of Formula 401 above may be one of the compounds represented by the following formulae, but is not limited thereto:

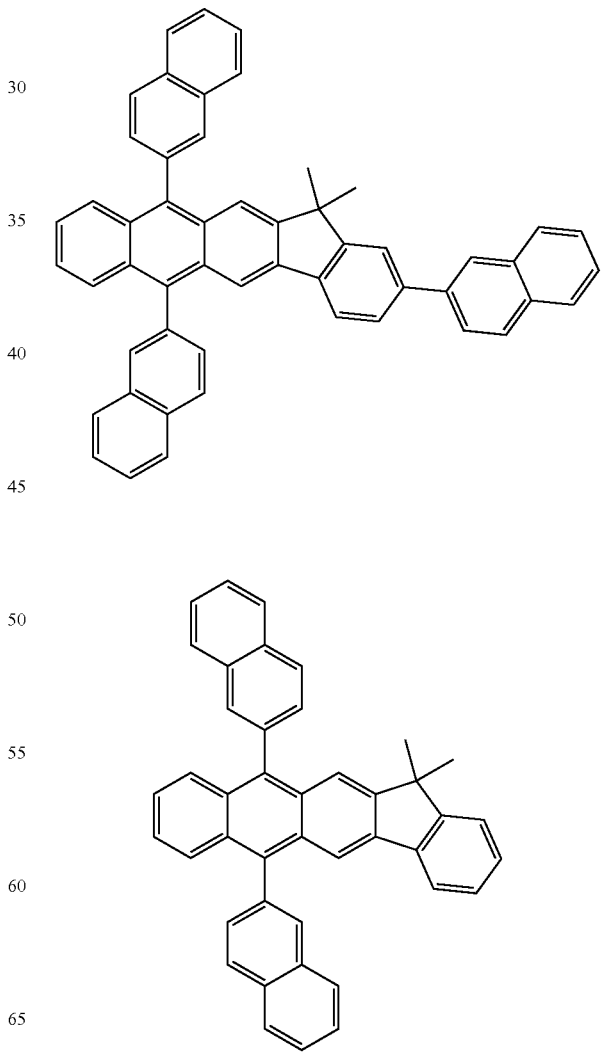

In some embodiments, an anthracene-based compound represented by Formula 401 below may be used as the host.

-continued

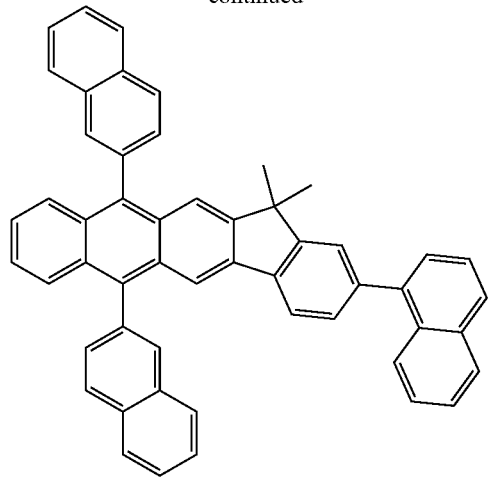

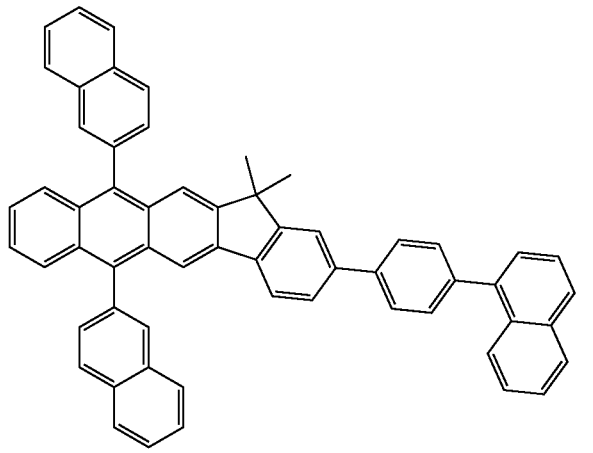

In the embodiments where the organic light-emitting device is a full color organic light-emitting device, the emission layer may be patterned into a red emission layer, a green emission layer, and a blue emission layer. In some embodiments, the EML may have a stack structure including a red emission layer, a green emission layer, and/or a blue emission layer that are stacked upon one another to emit white light, but is not limited thereto.

The EML of the light-emitting device may include a dopant, which may be a fluorescent dopant emitting light based on fluorescence mechanism, or a phosphorescent dopant emitting light based on phosphorescence mechanism.

In some embodiments, the EML may include at least one of a fluorescent dopant and a phosphorescent dopant. The phosphorescent dopant may include an organometallic complex including a transition metal, for example, iridium (Ir), platinum (Pt), osmium (Os), or rhodium (Rh).

The EML may include at least one suitable dopant.

Non-limiting examples of the blue dopant are compounds represented by the following formulae.

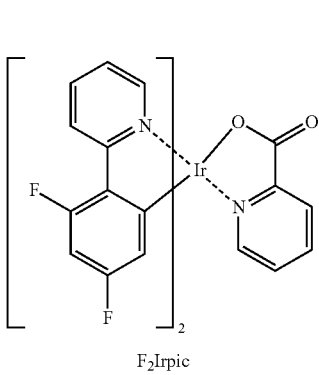

$F_2Irpic$

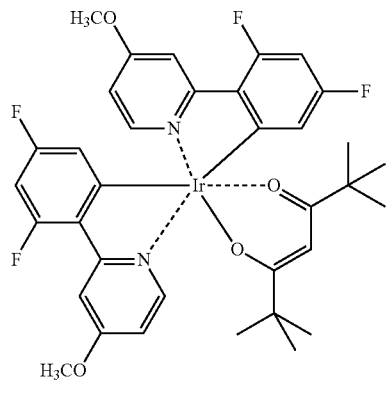

$(F_2ppy)_2Ir(tmd)$

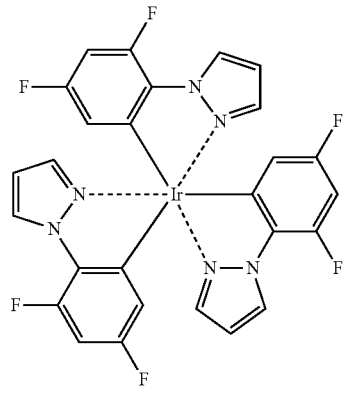

$Ir(dfppz)_3$

-continued
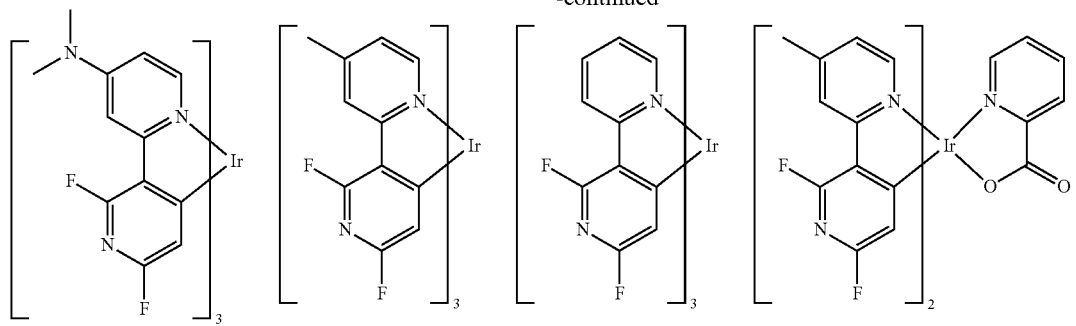
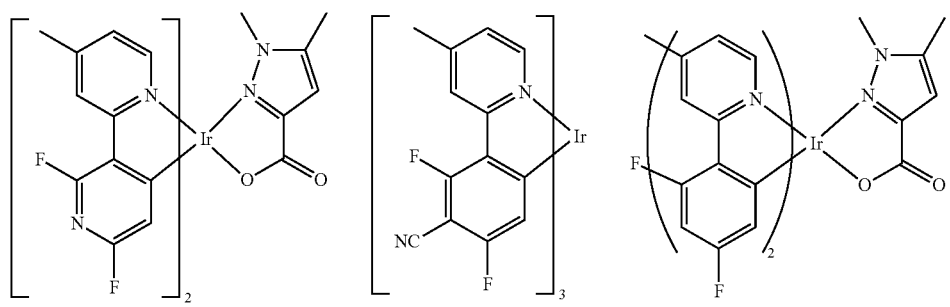
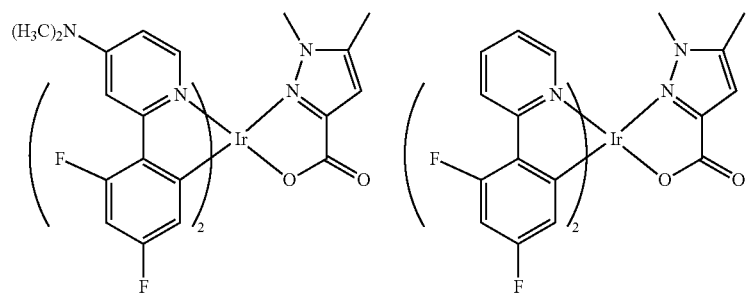
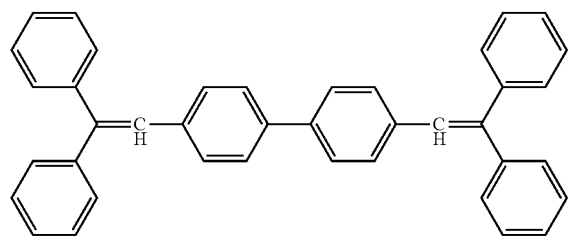
DPVBi
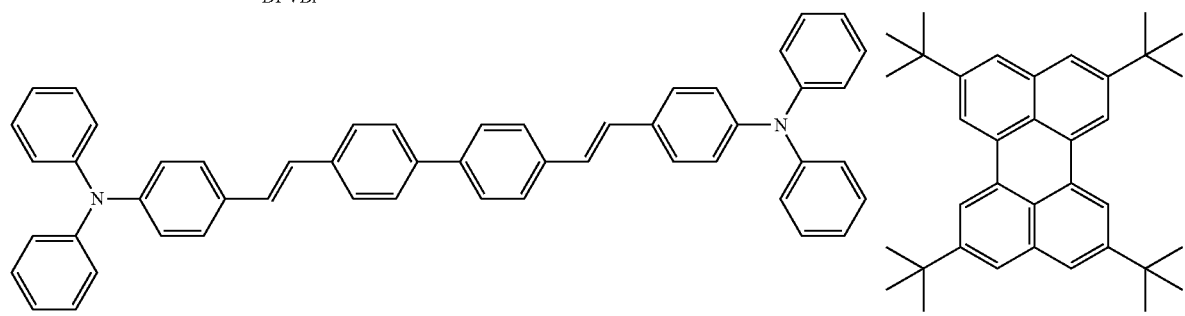
DPAVBi
TBPe Non-limiting examples of the red dopant are compounds represented by the following formulae.
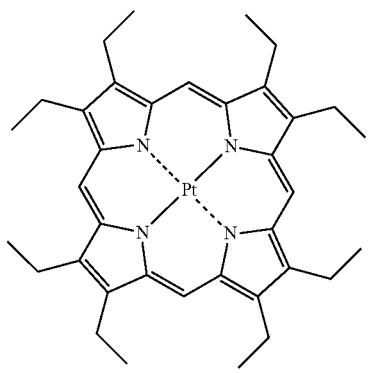
PtOEP
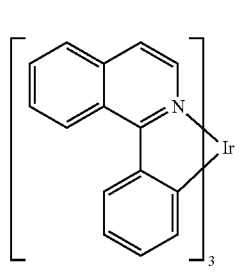
Ir(piq)₃
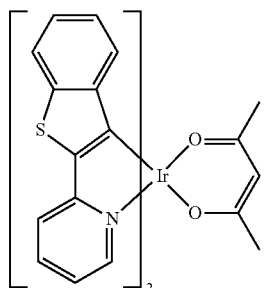
Btp₂Ir(acac)
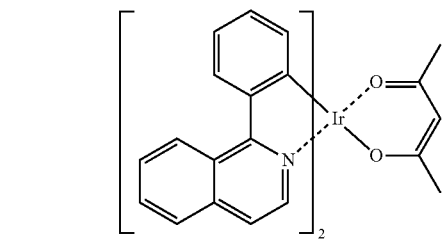
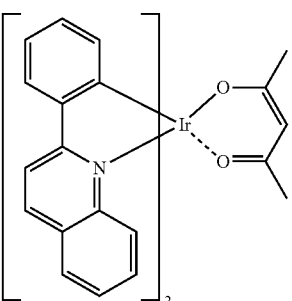
Ir(pq)₂(acac)    Ir(2-phq)₃
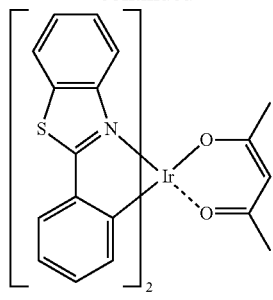
Ir(BT)₂(acac)
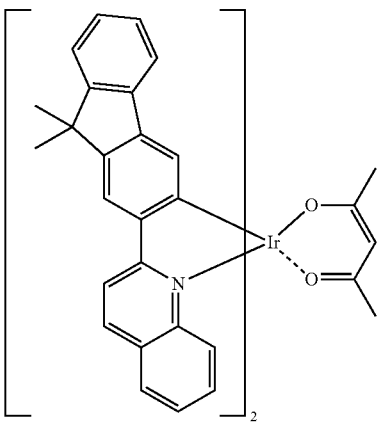
Ir(flq)₂(acac)
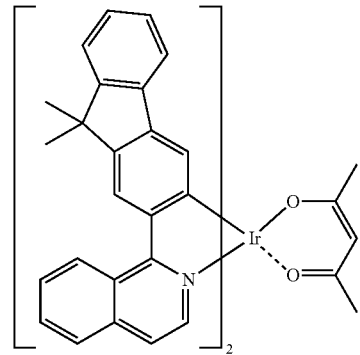
Ir(fliq)₂(acac)
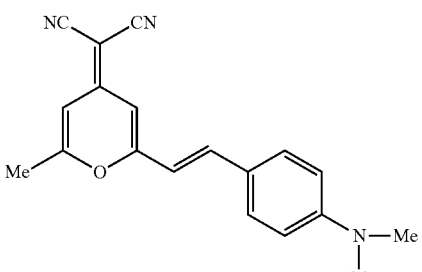
DCM

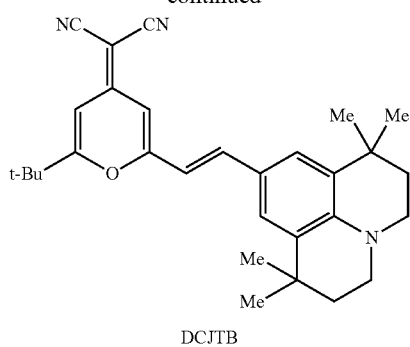
DCJTB
Non-limiting examples of the green dopant are compounds represented by the following formulae.
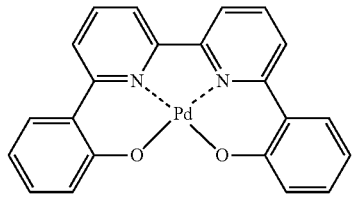
Ir(ppy)₃
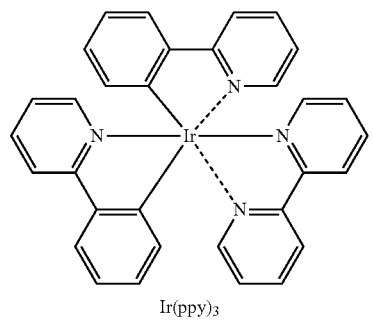
Ir(ppy)₂(acac)    Ir(mpyp)₃
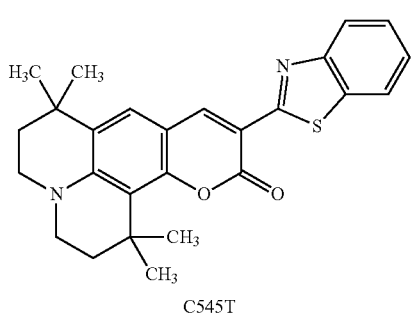
C545T
Non-limiting examples of the dopant that may be used in the EML are organometallic complexes represented by the following formulae.
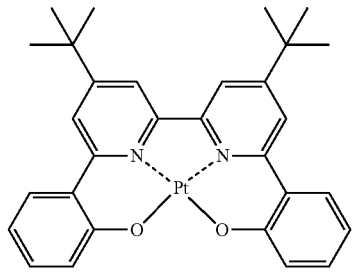 D1
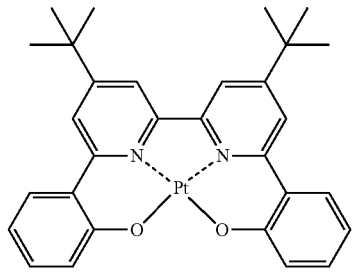 D2
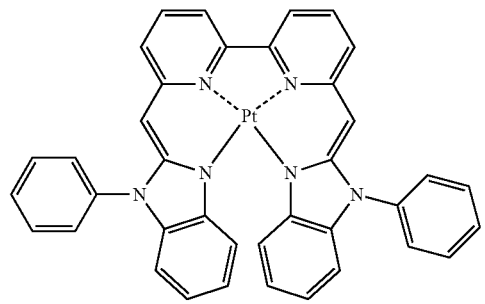 D3
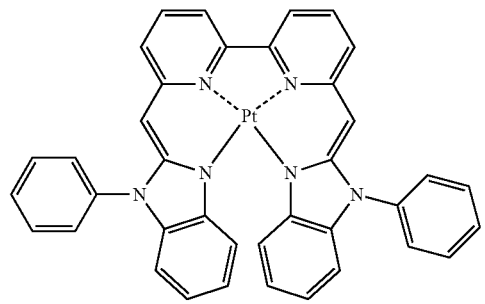 D4
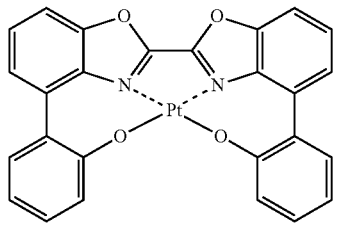 D5
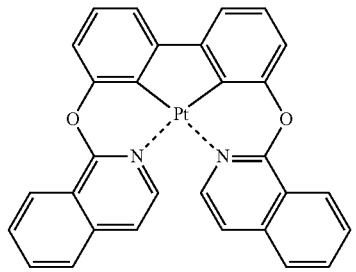 D6

-continued
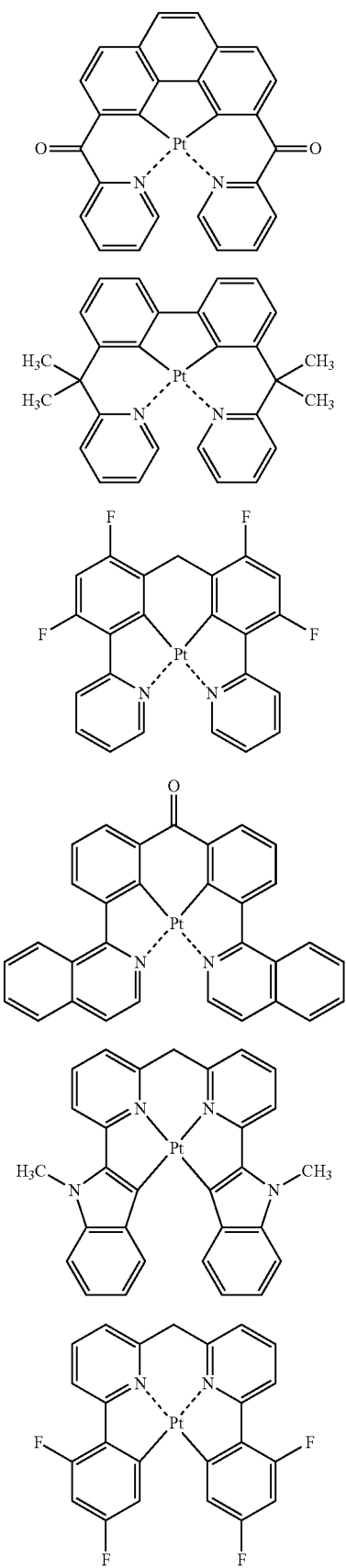
D7
D8
D9
D10
D11
D12
-continued
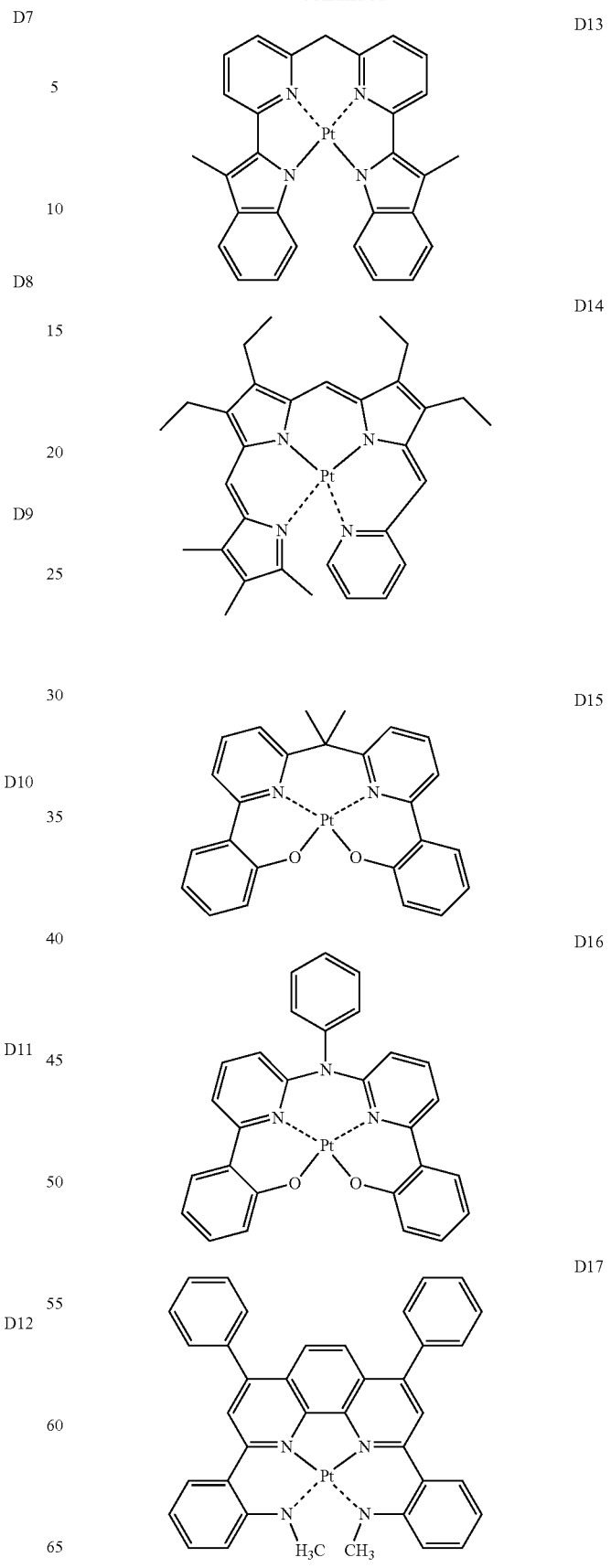
D13
D14
D15
D16
D17

-continued
D18
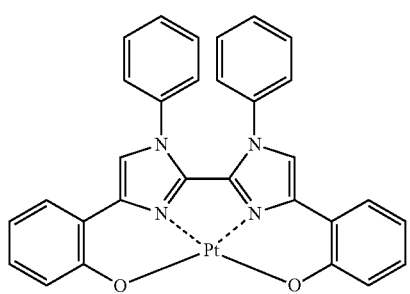
D19
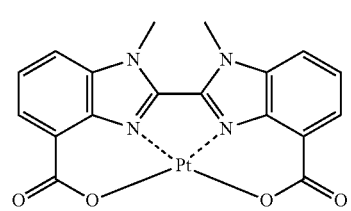
D20
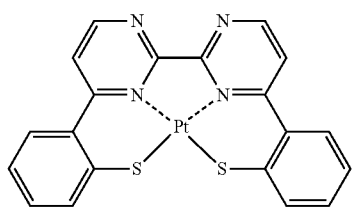
D21
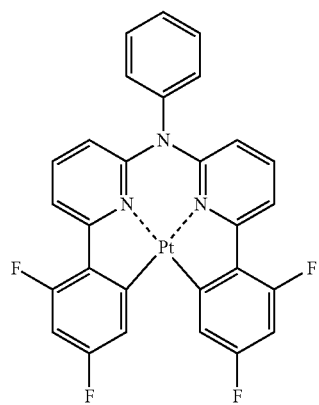
D22
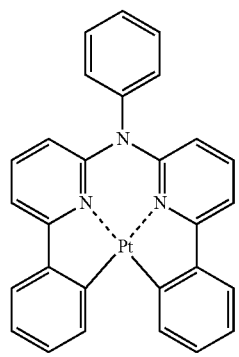
-continued
D23
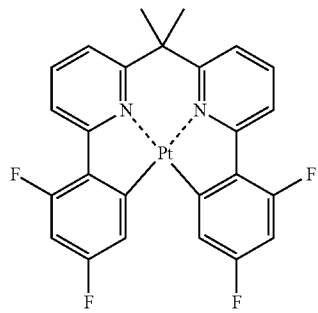
D24
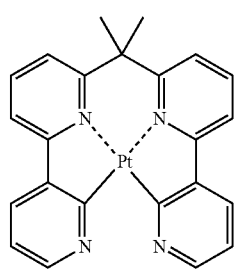
D25
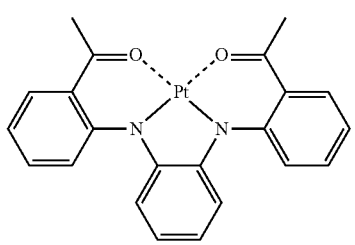
D26
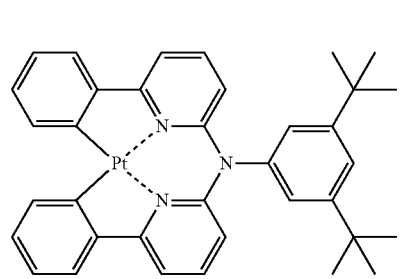
D27
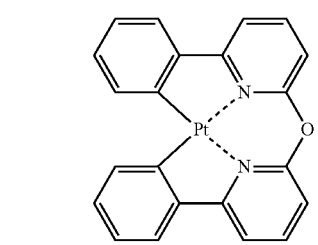
D28
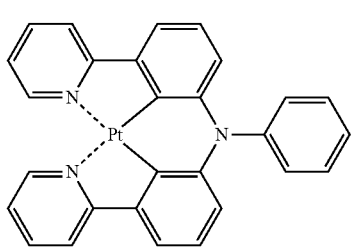

D29
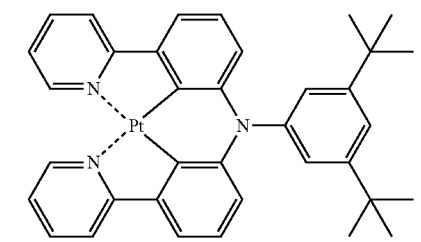
D30
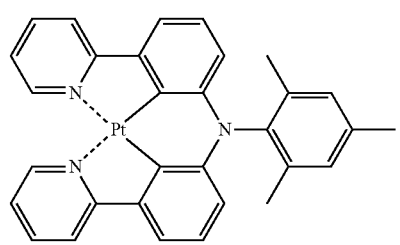
D31
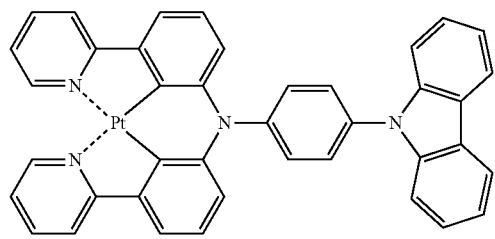
D32
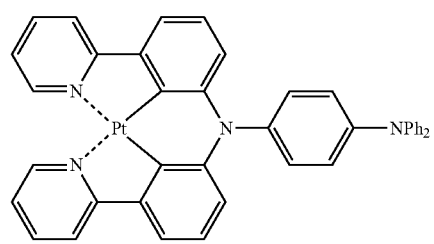
D33
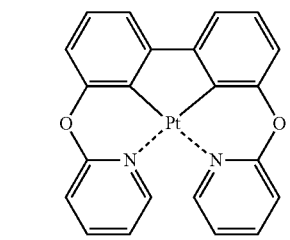
D34
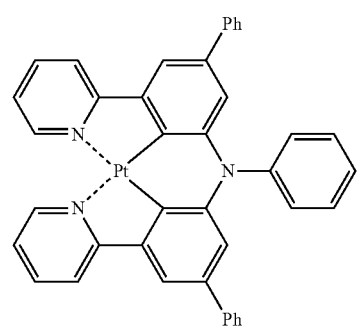
D35
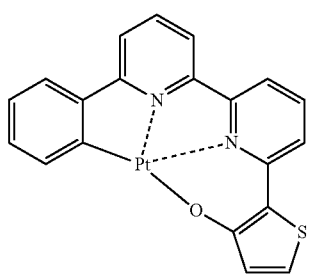
D36
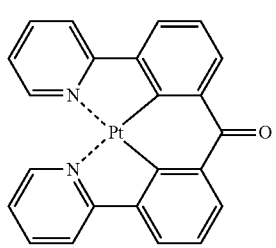
D37
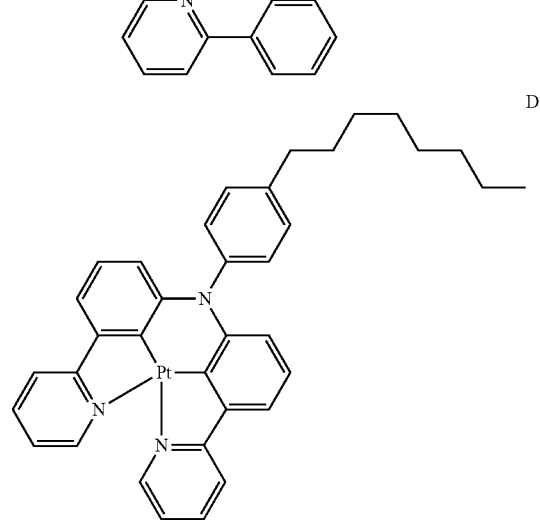
D38
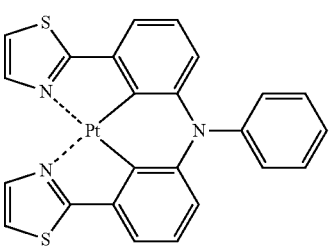
D39
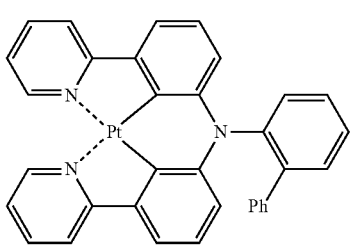

D40 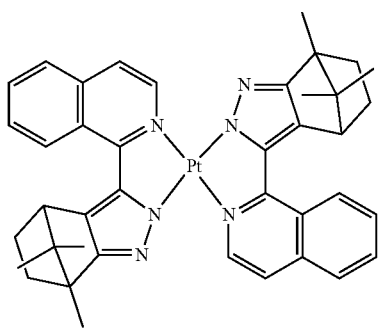
D41 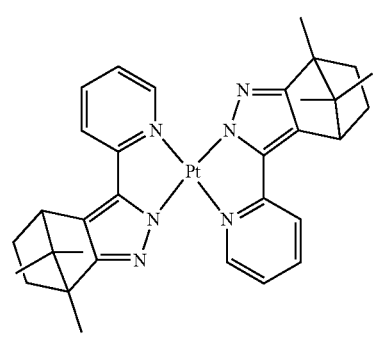
D42 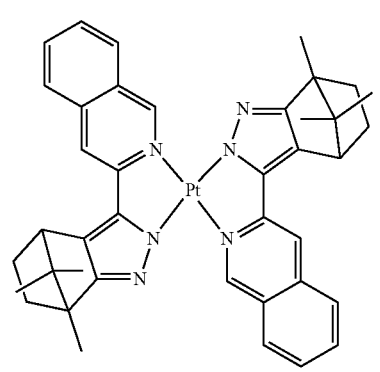
D43 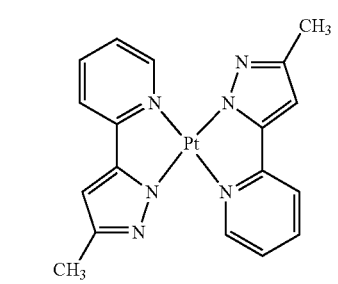
D44 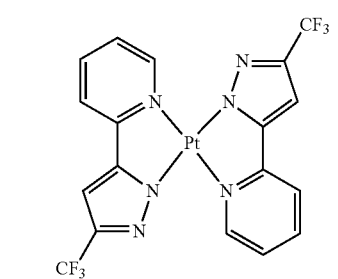
D45 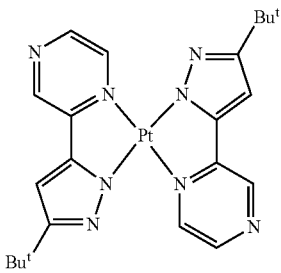
D46 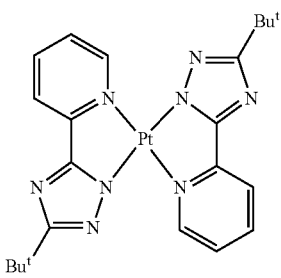
D47 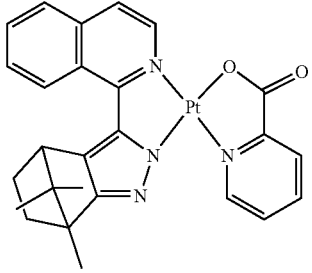
D48 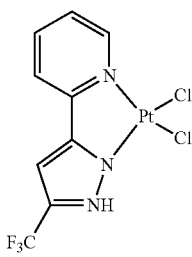
D49 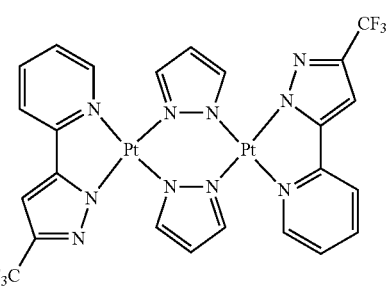

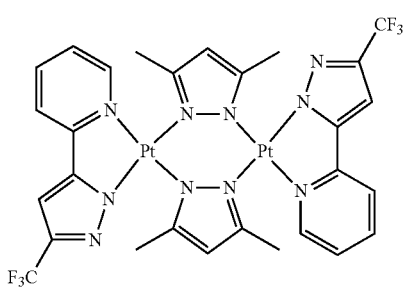

D50

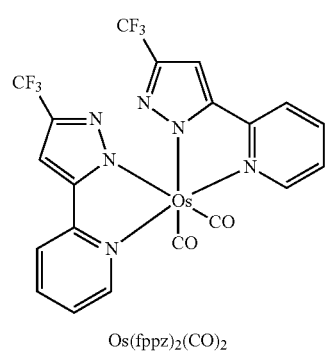

Os(fppz)₂(CO)₂

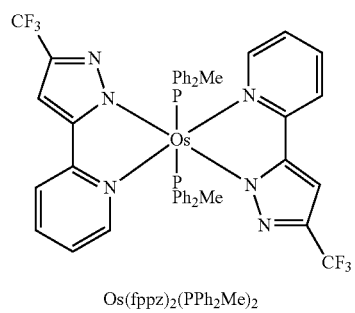

Os(fppz)₂(PPh₂Me)₂

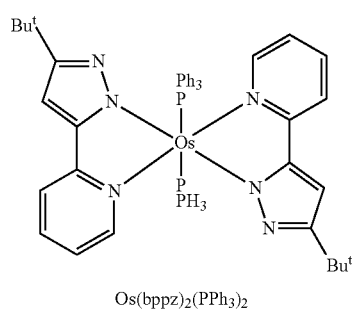

Os(bppz)₂(PPh₃)₂

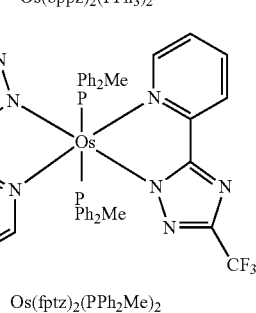

Os(fptz)₂(PPh₂Me)₂

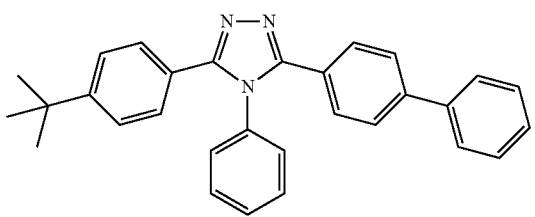

Os(hptz)₂(PPhMe₂)₂

When the EML includes both a host and a dopant, the amount of the dopant may be from about 0.01 to about 15 parts by weight based on 100 parts by weight of the host. However, the amount of the dopant is not limited to this range.

The thickness of the EML may be from about 100 Å to about 1000 Å, and in some embodiments, may be from about 200 Å to about 600 Å. When the thickness of the EML is within these ranges, the EML may have good light emitting ability without a substantial increase in driving voltage.

An ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary depending on the compound that is used to form the ETL.

A material for forming the ETL may be any suitable material that can stably transport electrons injected from the second electrode. Non-limiting examples of materials for the ETL are a quinoline derivative, such as tris(8-quinolinorate) aluminum (Alq₃), TAZ (refer to a formula below), BAlq (refer to a formula below), beryllium bis(benzoquinolin-10-olate (Bebq₂), 9,10-di(naphthalene-2-yl)anthracene (or DNA), Compound 201, and Compound 202.

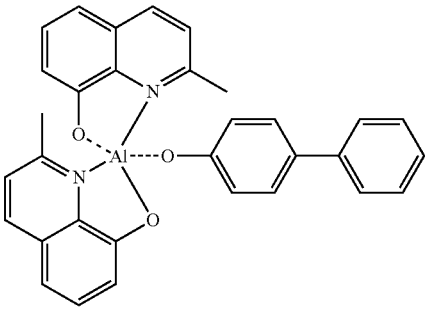

TAZ

BAlq

Compound 201

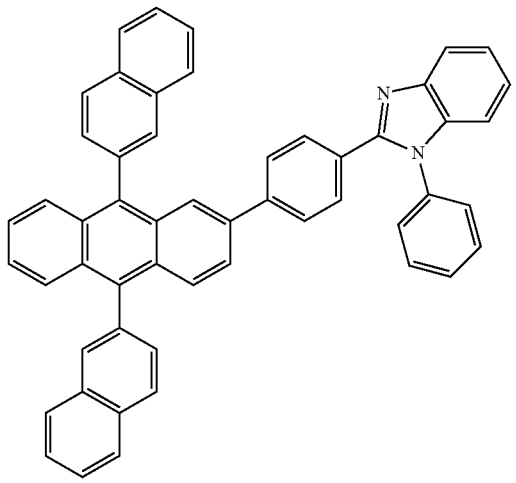

Compound 202

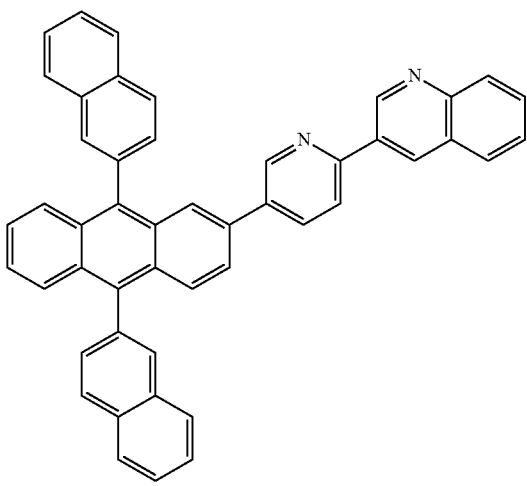

ADN

The thickness of the ETL may be from about 100 Å to about 1,000 Å, and in some embodiments, may be from about 150 Å to about 500 Å. When the thickness of the ETL is within these ranges, the ETL may have satisfactory electron transporting ability without a substantial increase in driving voltage.

In some embodiments the ETL may further include a metal-containing material, in addition to the above-listed electron-transporting organic compounds.

The metal-containing material may include a lithium (Li) complex. Non-limiting examples of the Li complex are lithium quinolate (LiQ) and Compound 203 below:

Compound 203

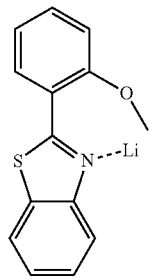

In addition, the EIL, which in some embodiments facilitates injection of electrons from the second electrode, may be formed on the ETL.

Non-limiting examples of materials for forming the EIL are LiF, NaCl, CsF, $Li_2O$, BaO, and Compound 203 above, which are known in the art. The deposition and coating conditions for forming the EIL may be similar to those for the formation of the HIL, though the deposition and coating conditions may vary depending on the material that is used to form the EIL.

The thickness of the EIL may be from about 1 Å to about 100 Å, and in some embodiments, may be from about 3 Å to about 90 Å. When the thickness of the EIL is within these ranges, the EIL may have satisfactory electron injection ability without a substantial increase in driving voltage.

The second electrode may be formed on the EIL. A material for the second electrode may be a metal, an alloy, or an electrically conductive compound, which all have a low work function, or a combination thereof. Non-limiting examples of the material for the second electrode are lithium (Li), magnesium (Mg), aluminum (Al), aluminum (Al)-lithium (Li), calcium (Ca), magnesium (Mg)-indium (In), and magnesium (Mg)-silver (Ag), or the like. In some embodiments, to manufacture a top-emission light-emitting device, the second electrode may be formed of indium tin oxide (ITO) or indium zinc oxide (IZO). However, embodiments of the present invention are not limited thereto.

Although the organic light-emitting device of FIG. 1 is described above, embodiments of the present invention are not limited thereto.

For example, a hole blocking layer (HBL) may also be formed between the EML and the ETL by using vacuum deposition, spin coating, casting, Langmuir-Blodgett (LB) deposition, or the like, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary depending on the material that is used to form the HBL. Any suitable hole-blocking material may be used. Non-limiting examples of hole-blocking materials are oxadiazole derivatives, triazole derivatives, and phenanthroline derivatives. For example, bathocuproine (BCP) represented by the following formula may be used as a material for forming the HBL.

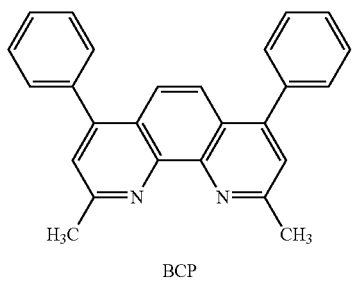 [SMILES: Cc1cc(-c2ccccc2)c2ccc3c(-c4ccccc4)cc(C)nc3c2n1 ; "BCP"]

BCP

The thickness of the HBL may be from about 20 Å to about 1000 Å, and in some embodiments, may be from about 30 Å to about 300 Å. When the thickness of the HBL is within these ranges, the HBL may have improved hole blocking ability without a substantial increase in driving voltage.

According to the above-described embodiments, the organic light-emitting device may include a first HTL and a second HTL as described above. Accordingly, mobility of holes from the first electrode to the EML may be effectively controlled to improve a charge balance in the EML and prevent migration of electrons through the ETL and an interface between the EML and the second HTL, as well as prevent destruction of excitons in the EML. Thus, the organic light-emitting device may have a high efficiency and improved lifetime characteristics.

To evaluate efficiency, driving voltage, and lifetime characteristics, an organic light-emitting device (OLED) 1 was manufactured as follows:

An ITO glass substrate was cut to a size of 50 mm×50 mm×0.5 mm, washed by sonication in acetone isopropyl alcohol and then in pure water each for 15 minutes, and washed with UV ozone for 30 minutes. After Compound 311 was vacuum-deposited on the ITO layer to form a first HTL having a thickness of about 1475 Å, Compound 701 was vacuum-deposited on the first HTL to form a second HTL having a thickness of about 175 Å. Consequently, CBP as a host and Ir(ppy)$_3$ as a dopant were co-deposited on the second HTL in a weight ratio of 9:1 to form an EML having a thickness of about 400 Å. Compound 202 was vacuum-deposited on the EML to form an ETL having a thickness of about 400 Å, followed by vacuum-deposition of Compound 203 on the ETL to form an EIL having a thickness of about 5 Å, and vacuum-deposition of Mg and Ag on the EIL to form a second electrode having a thickness of about 120 Å, thereby manufacturing the OLED 1.

An OLED 2 was manufactured in the same manner as in the manufacturing of OLED 1, except that the formation of a first HTL having a thickness of about 1650 Å was followed by forming an EML directly on the first HTL, without forming a second HTL.

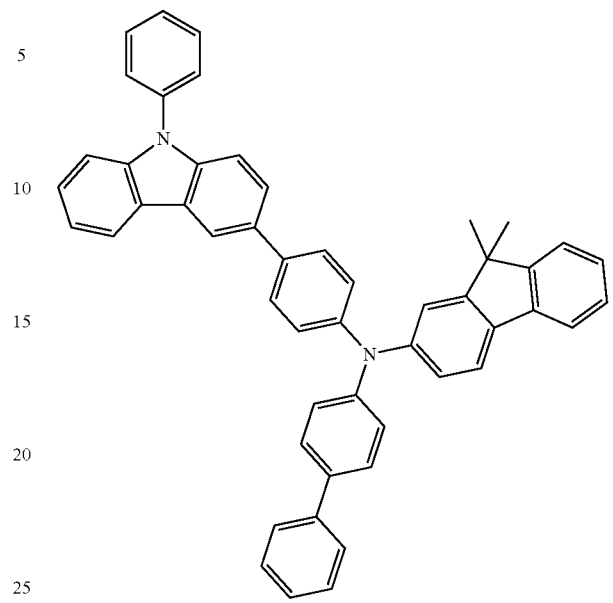

311

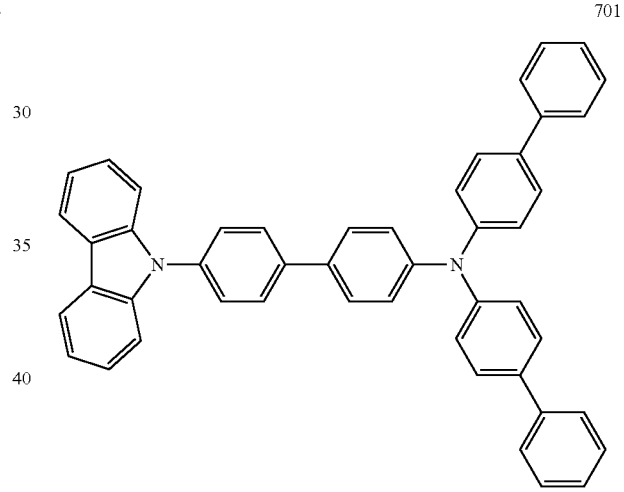

701

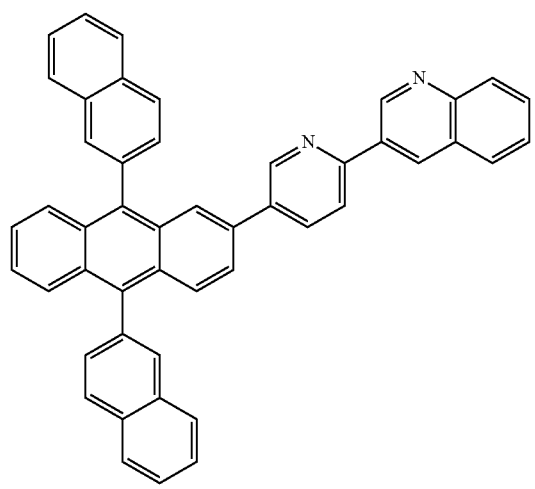

Compound 202

Compound 203

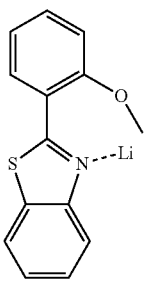

Figure 2:
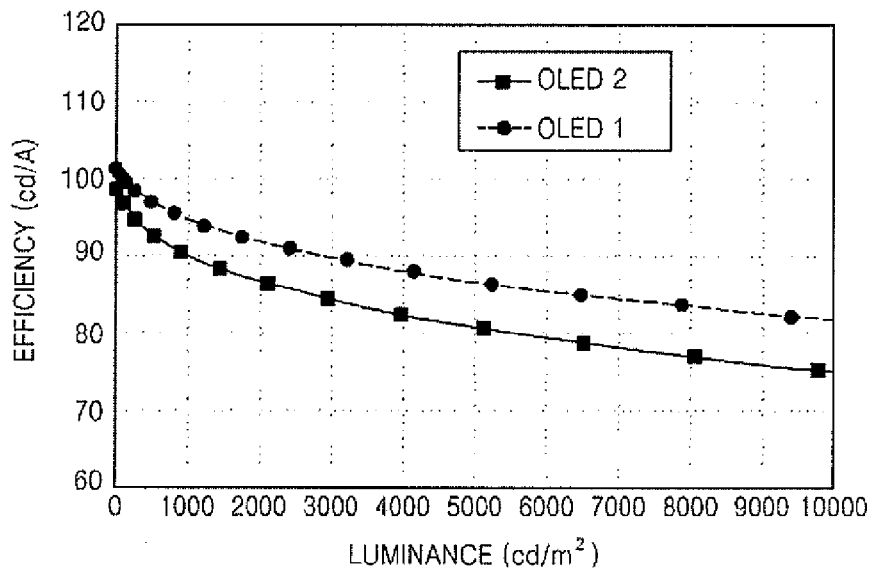
FIG. 2 is a graph of efficiency with respect to luminance in OLED 1 and OLED 2.
Figure 3:
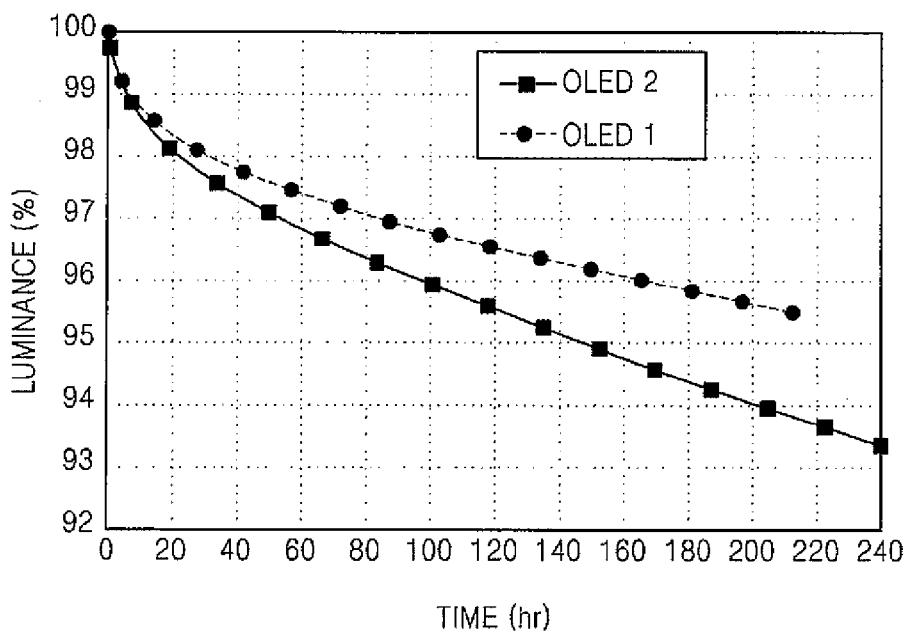
FIG. 3 is a graph of luminance with respect to time in OLED 1 and OLED 2.

The efficiencies and lifetime data (at 150 nit) of the OLEDs 1 and 2 are shown in FIGS. 2 and 3, respectively. Referring to FIGS. 2 and 3, the OLED 1 is found to have better efficiency and better lifetime characteristics than the OLED 2.

As described above, according to the one or more of the above embodiments of the present invention, an organic light-emitting device having a structure as described above in the embodiments of the present invention may have a low driving voltage, a high luminance, and a high efficiency. A high-quality display apparatus may be manufactured using the organic light-emitting device.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and equivalents thereof.

What is claimed is:

1. An organic light-emitting device comprising:

a first electrode;

a second electrode;

an emission layer between the first electrode and the second electrode;

a first hole transport layer between the first electrode and the emission layer; and a second hole transport layer between the first hole transport layer and the emission layer, wherein the first hole transport layer comprises a first compound represented by Formula 1 and the second hole transport layer comprises a second compound represented by Formula 2:

Formula 1

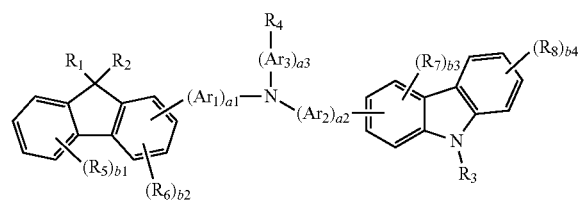

Formula 2

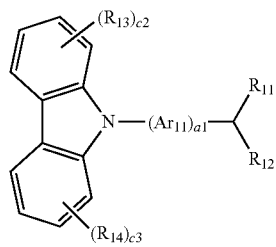

wherein, in Formulae 1 and 2, $Ar_1$ to $Ar_3$, and $Ar_{11}$ are each independently selected from a substituted or unsubstituted $C_3$-$C_{10}$cycloalkylene group, a substituted or unsubstituted $C_2$-$C_{10}$heterocycloalkylene group, a substituted or unsubstituted $C_3$-$C_{10}$cycloalkenylene group, a substituted or unsubstituted $C_2$-$C_{10}$heterocycloalkenylene group, a substituted or unsubstituted $C_6$-$C_{60}$arylene group, and a substituted or unsubstituted $C_2$-$C_{60}$heteroarylene group;

a1 to a3 are each independently an integer from 0 to 5;

c1 is an integer from 1 to 5;

$R_1$, $R_2$, $R_4$ to $R_8$, $R_{13}$, and $R_{14}$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$alkyl group, a substituted or unsubstituted $C_2$-$C_{60}$alkenyl group, a substituted or unsubstituted $C_2$-$C_{60}$alkynyl group, a substituted or unsubstituted $C_1$-$C_{60}$alkoxy group, a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, a substituted or unsubstituted $C_6$-$C_{60}$aryloxy group, a substituted or unsubstituted $C_6$-$C_{60}$arylthio group, a substituted or unsubstituted $C_2$-$C_{60}$heteroaryl group, $-N(Q_1)(Q_2)$, and $-Si(Q_3)(Q_4)(Q_5)$, where $Q_1$ to $Q_5$ are each independently selected from a $C_1$-$C_{60}$alkyl group, a $C_1$-$C_{60}$alkoxy group, a $C_6$-$C_{60}$aryl group, and a $C_2$-$C_{60}$heteroaryl group;

$R_3$, $R_{11}$, and $R_{12}$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$alkyl group, a substituted or unsubstituted $C_2$-$C_{60}$alkenyl group, a substituted or unsubstituted $C_2$-$C_{60}$alkynyl group, a substituted or unsubstituted $C_3$-$C_{10}$cycloalkyl group, a substituted or unsubstituted $C_2$-$C_{10}$heterocycloalkyl group, a substituted or unsubstituted $C_3$-$C_{10}$cycloalkenyl group, a substituted or unsubstituted $C_2$-$C_{10}$heterocycloalkenyl group, a substituted or unsubstituted $C_6$-$C_{60}$aryl group, a substituted or unsubstituted $C_2$-$C_{60}$heteroaryl group, and $-Si(Q_3)(Q_4)(Q_5)$, where $Q_3$ to $Q_5$ are each independently selected from a $C_1$-$C_{60}$alkyl group, a $C_1$-$C_{60}$alkoxy group, a $C_6$-$C_{60}$aryl group, and a $C_2$-$C_{60}$heteroaryl group;

b1, b4, c2, and c3 are each independently an integer from 1 to 4; and b2 and b3 are each independently an integer from 1 to 3.

2. The organic light-emitting device of claim 1, wherein the first hole transport layer is in contact with the second hole transport layer, and the second hole transport layer is in contact with the emission layer.

3. The organic light-emitting device of claim 1, wherein, in Formulae 1 and 2, $Ar_1$ to $Ar_3$, and $Ar_{11}$ are each independently selected from:

a phenylene group, a pentalenylene group, an indenylene group, a naphthylene group, an azulenylene group, a heptalenylene group, an indacenylene group, an acenaphthylene group, a fluorenylene group, a spirofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzopuranylene group, a dibenzothiophenylene group, and a benzocarbazolylene group, and a phenylene group, a pentalenylene group, an indenylene group, a naphthylene group, an azulenylene group, a heptalenylene group, an indacenylene group, an acenaphthylene group, a fluorenylene group, a spirofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzopuranylene group, a dibenzothiophenylene group, and a benzocarbazolylene group, each substituted with at least one selected from:

a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, and a $C_1$-$C_{20}$alkoxy group;

a $C_1$-$C_{20}$alkyl group and a $C_1$-$C_{20}$alkoxy group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_6$-$C_{20}$aryl group, and a $C_2$-$C_{20}$heteroaryl group;

a $C_6$-$C_{20}$aryl group and a $C_2$-$C_{20}$heteroaryl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

—$N(Q_{11})(Q_{12})$, and —$Si(Q_{13})(Q_{14})(Q_{15})$, wherein $Q_{11}$ to $Q_{15}$ are each independently a $C_1$-$C_{20}$alkyl group, a $C_1$-$C_{20}$alkoxy group, a $C_6$-$C_{20}$aryl group, or a $C_2$-$C_{20}$heteroaryl group.

4. The organic light-emitting device of claim 1, wherein $Ar_1$ to $Ar_3$, and $Ar_{11}$ in Formulae 1 and 2 are each independently represented by one of Formulae 10-1 to 10-24:

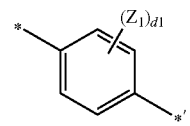

Formula 10-1

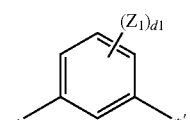

Formula 10-2

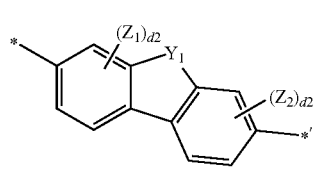

Formula 10-3

-continued
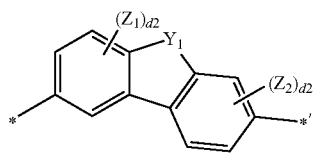
Formula 10-4
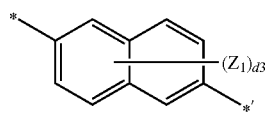
Formula 10-5
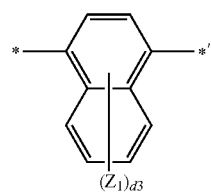
Formula 10-6
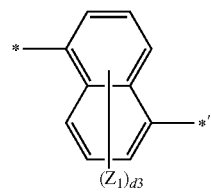
Formula 10-7
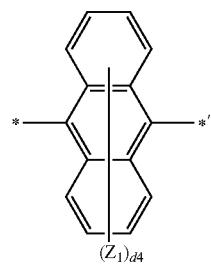
Formula 10-8
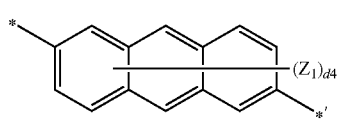
Formula 10-9
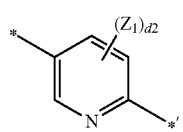
Formula 10-10
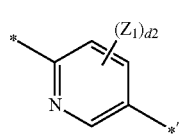
Formula 10-11
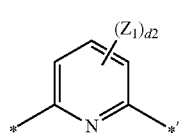
Formula 10-12
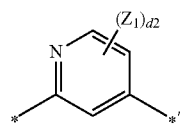
Formula 10-13
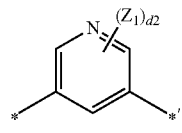
Formula 10-14
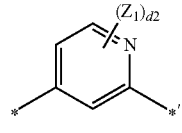
Formula 10-15
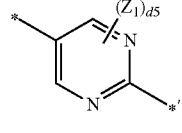
Formula 10-16
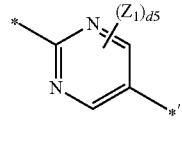
Formula 10-17
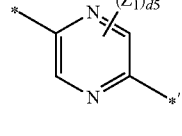
Formula 10-18
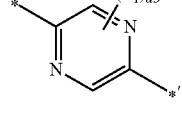
Formula 10-19
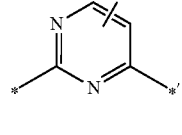
Formula 10-20
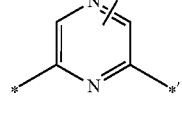
Formula 10-21
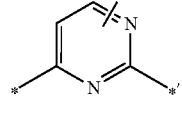
Formula 10-22
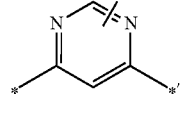
Formula 10-23

Formula 10-24

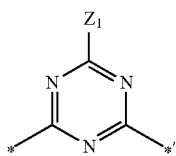

wherein, in Formulae 10-1 to 10-24,
$Y_1$ is O, S, $C(R_{21})(R_{22})$, or $N(R_{23})$;
$Z_1$, $Z_2$, and $R_{21}$ to $R_{23}$ are each independently selected from:
a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phoshoric acid group or a salt thereof, a $C_1$-$C_{20}$ alkyl group, and a $C_1$-$C_{20}$ alkoxy group;
a $C_1$-$C_{20}$ alkyl group and a $C_1$-$C_{20}$ alkoxy group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof;
a $C_6$-$C_{20}$ aryl group and a $C_2$-$C_{20}$ heteroaryl group;
a $C_6$-$C_{20}$ aryl group and a $C_2$-$C_{20}$ heteroaryl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and
—$N(Q_{11})(Q_{12})$, and —$Si(Q_{13})(Q_{14})(Q_{15})$, wherein $Q_{11}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group;
d1 is an integer from 1 to 4;
d2 is an integer from 1 to 3;
d3 is an integer from 1 to 6;
d4 is an integer from 1 to 8, and
d5 is 1 or 2.

5. The organic light-emitting device of claim 4, wherein $Z_1$, $Z_2$, and $R_{21}$ to $R_{23}$ in Formulae 10-1 to 10-24 are each independently selected from:
a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phoshoric acid group or a salt thereof, a $C_1$-$C_{20}$ alkyl group, and a $C_1$-$C_{20}$ alkoxy group;
a $C_1$-$C_{20}$ alkyl group and a $C_1$-$C_{20}$ alkoxy group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof;
a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;
a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and
—$N(Q_{11})(Q_{12})$, and —$Si(Q_{13})(Q_{14})(Q_{15})$, wherein $Q_{11}$ to $Q_{15}$ are each independently a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

6. The organic light-emitting device of claim 1, wherein $Ar_1$ to $Ar_3$, and $Ar_{11}$ in Formulae 1 and 2 are each independently represented by one of Formulae 11-1 to 11-11:

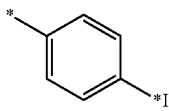

Formula 11-1

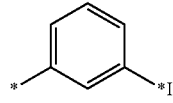

Formula 11-2

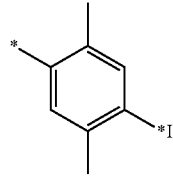

Formula 11-3

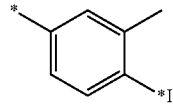

Formula 11-4

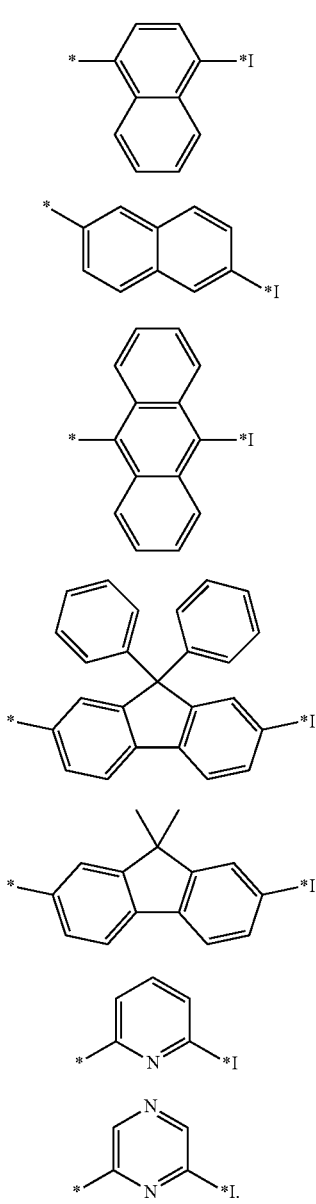

Formula 11-5

Formula 11-6

Formula 11-7

Formula 11-8

Formula 11-9

Formula 11-10

Formula 11-11

7. The organic light-emitting device of claim 1, wherein, in Formula 1, i) a1=0 and a2=0; ii) a1=1 and a2=0; iii) a1=2 and a2=0; iv) a1=0 and a2=1; v) a1=0 and a2=2; or vi) a1=1 and a2=1, and in Formula 2, c1 is 1, 2, or 3.

8. The organic light-emitting device of claim 1, wherein $R_1$ to $R_8$, and $R_{11}$ to $R_{14}$ in Formulae 1 and 2 are each independently selected from:

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group, each substituted with at least one selected from:

a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, and a $C_1$-$C_{20}$alkoxy group;

a $C_1$-$C_{20}$alkyl group and a $C_1$-$C_{20}$alkoxy group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_6$-$C_{20}$aryl group, and a $C_2$-$C_{20}$heteroaryl group;

a $C_6$-$C_{20}$aryl group and a $C_2$-$C_{20}$heteroaryl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$), and —Si($Q_{13}$)($Q_{14}$)($Q_{15}$), wherein $Q_{11}$ to $Q_{15}$ are each independently $C_1$-$C_{20}$alkyl group, a $C_1$-$C_{20}$alkoxy group, a $C_6$-$C_{20}$aryl group, or a $C_2$-$C_{20}$heteroaryl group.

9. The organic light-emitting device of claim 1, wherein $R_3$ to $R_8$, and $R_{11}$ to $R_{14}$ in Formulae 1 and 2 are each independently represented by one of Formulae 12-1 to 12-22:

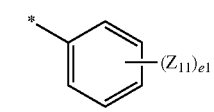

Formula 12-1

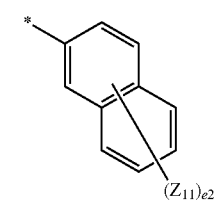

Formula 12-2

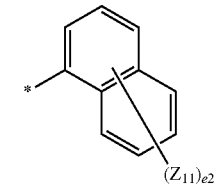

Formula 12-3

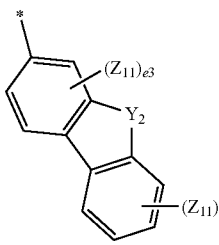

Formula 12-4

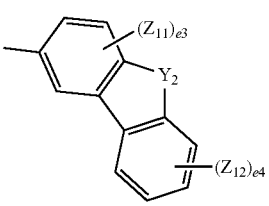

Formula 12-5

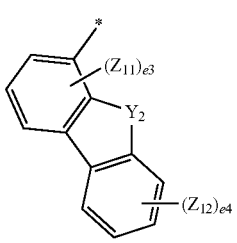

Formula 12-6

-continued

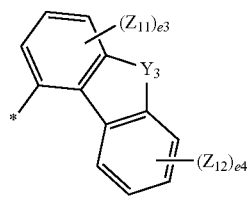

Formula 12-7

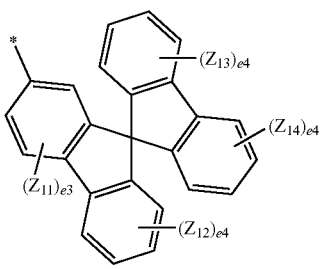

Formula 12-8

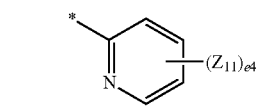

Formula 12-9

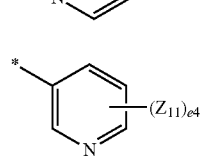

Formula 12-10

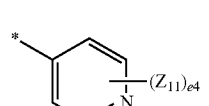

Formula 12-11

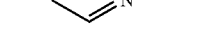

Formula 12-12

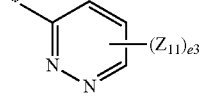

Formula 12-13

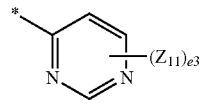

Formula 12-14

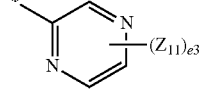

Formula 12-15

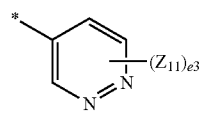

Formula 12-16

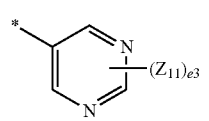

Formula 12-17

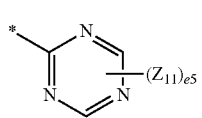

Formula 12-18

Formula 12-19

Formula 12-20

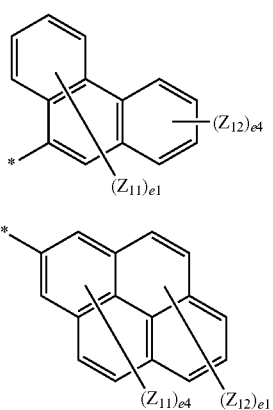

Formula 12-21

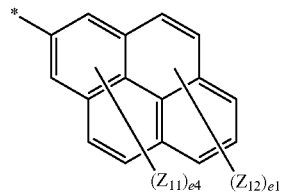

Formula 12-22 wherein, in Formulae 12-20 to 12-22, $Y_2$ is O, S, $C(R_{25})(R_{26})$, or $N(R_{27})$;

$Z_{11}$ to $Z_{14}$, and $R_{25}$ to $R_{27}$ are each independently selected from:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, and a $C_1$-$C_{20}$alkoxy group;

a $C_1$-$C_{20}$alkyl group, and a $C_1$-$C_{20}$alkoxy group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_6$-$C_{20}$aryl group, and a $C_2$-$C_{20}$heteroaryl group;

a $C_6$-$C_{20}$aryl group, and a $C_2$-$C_{20}$heteroaryl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$alkenyl group, a $C_2$-$C_{60}$alkynyl group, a $C_1$-$C_{60}$alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group;

—$N(Q_{11})(Q_{12})$, and —$Si(Q_{13})(Q_{14})(Q_{15})$, wherein $Q_{11}$ to $Q_{15}$ are each independently a $C_1$-$C_{20}$alkyl group, a $C_1$-$C_{20}$alkoxy group, a $C_6$-$C_{20}$aryl group, or a $C_2$-$C_{20}$heteroaryl group;

e1 is an integer from 1 to 6;

e2 is an integer from 1 to 7;

e3 is an integer from 1 to 3;

e4 is an integer from 1 to 4; and e5 is 1 or 2.

10. The organic light-emitting device of claim 1, wherein $R_3$ to $R_8$, and $R_{11}$ to $R_{14}$ in Formulae 1 and 2 are each independently represented by one of Formulae 13-1 to 13-19:

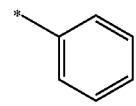

Formula 13-1

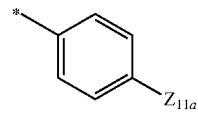

Formula 13-2

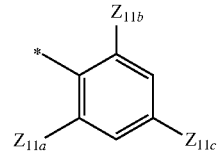

Formula 13-3

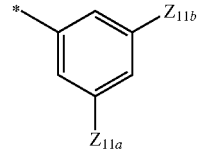

Formula 13-4

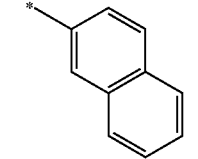

Formula 13-5

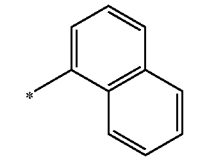

Formula 13-6

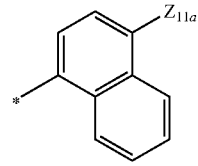

Formula 13-7

-continued

Formula 13-8

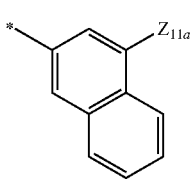

Formula 13-9

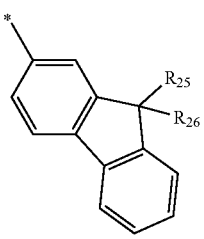

Formula 13-10

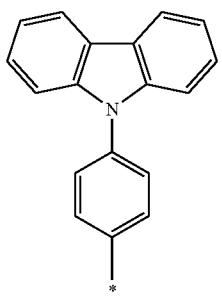

Formula 13-11

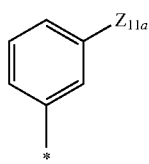

Formula 13-12

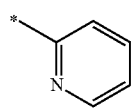

Formula 13-13

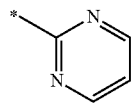

Formula 13-14

Formula 13-15

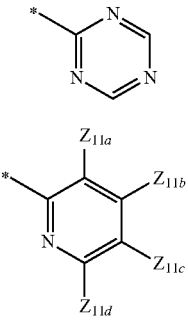

Formula 13-16

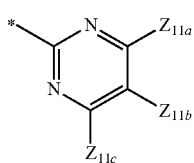

-continued

Formula 13-17

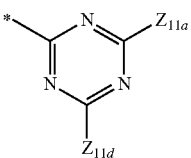

Formula 13-18

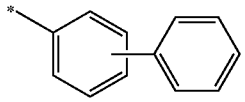

Formula 13-19

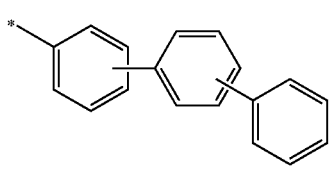

wherein, in Formulae 13-1 to 13-19 above, $Z_{11a}$ to $Z_{11d}$, $R_{25}$, and $R_{26}$ are each independently selected from:

a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phoshoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

11. The organic light-emitting device of claim 10, wherein $Z_{11a}$ to $Z_{11d}$, $R_{25}$, and $R_{26}$ in Formulae 13-1 to 13-19 are each independently selected from:

a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phoshoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, an anthracenyl group, a fluorenyl group, a dimethylfluorenyl group, a diphenyifluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

12. The organic light-emitting device of claim 1, wherein $R_1$ and $R_2$ in Formula 1 are each independently selected from:

a $C_1$-$C_{20}$alkyl group;

a $C_1$-$C_{20}$ alkyl group substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$alkyl group, a $C_1$-$C_{20}$alkoxy group, a phenyl group, a naphthyl group, an anthracenyl group, a fluorenyl group, a dimethylfluorenyl group, a diphenyifluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group.

13. The organic light-emitting device of claim 1, wherein the first compound is a compound represented by Formula 1A(1) or 1B(1):

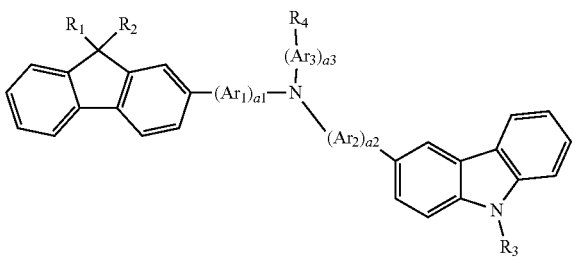

Formula 1A(1)

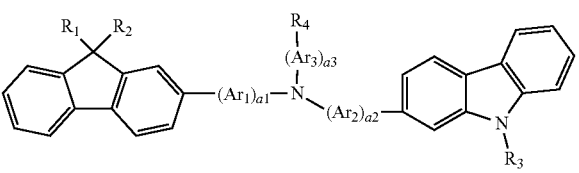

Formula 1B(1)

wherein, $R_1$ to $R_4$, $Ar_1$ to $Ar_3$, a1, a2, and a3 in Formulae 1A(1) and 1B(1) are the same as those defined in Formula 1.

14. The organic light-emitting device of claim 1, wherein the first compound comprises at least one of Compounds 309 to 320:

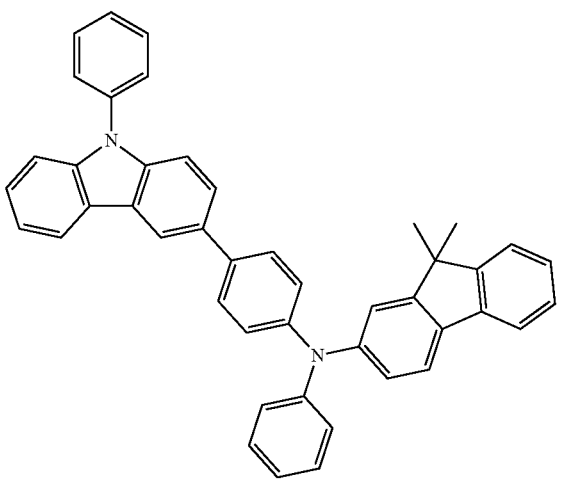

309

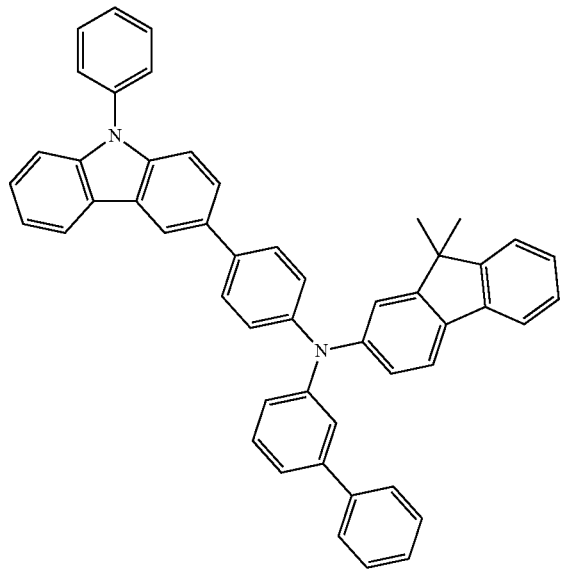
310
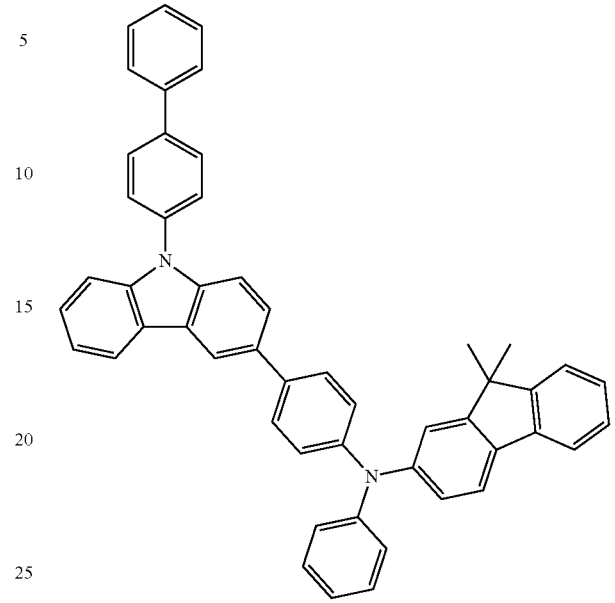
312
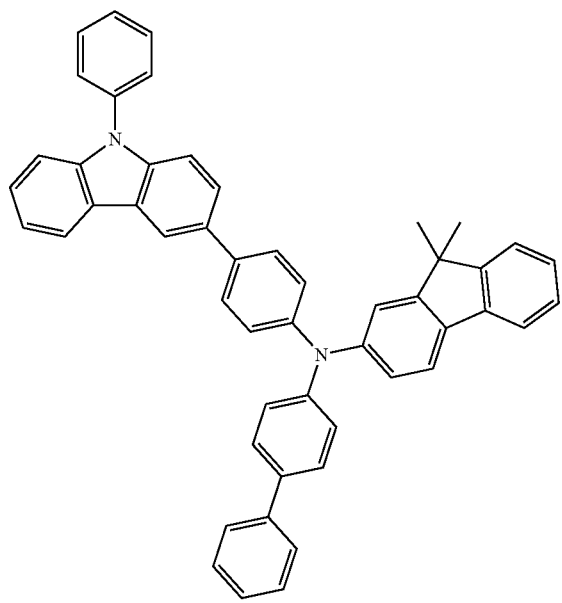
311
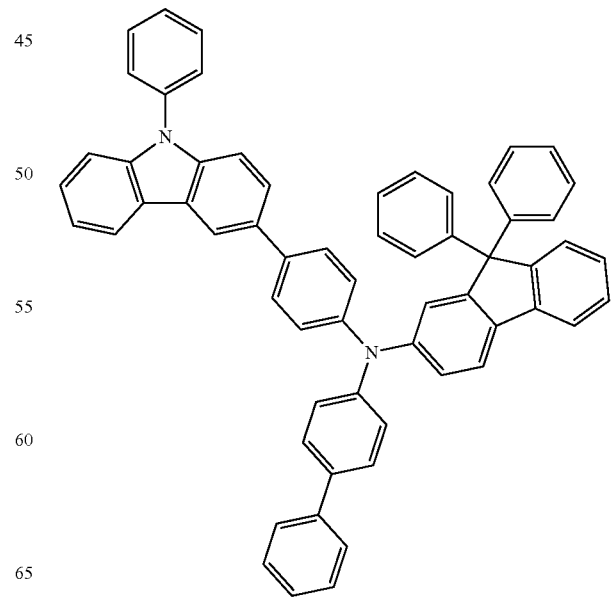
313

314
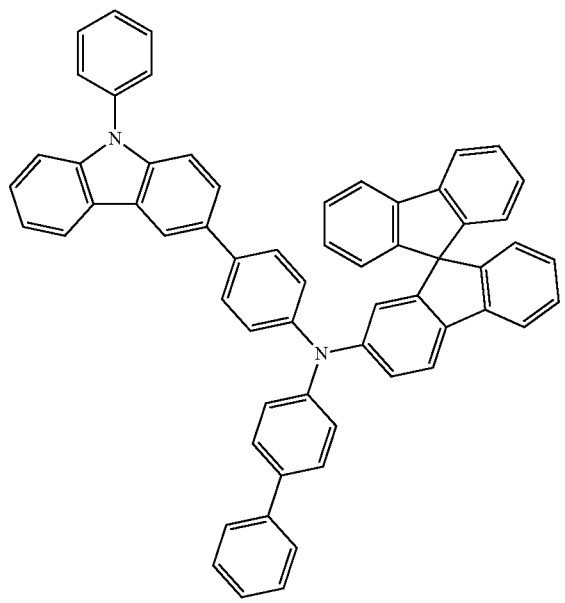
315
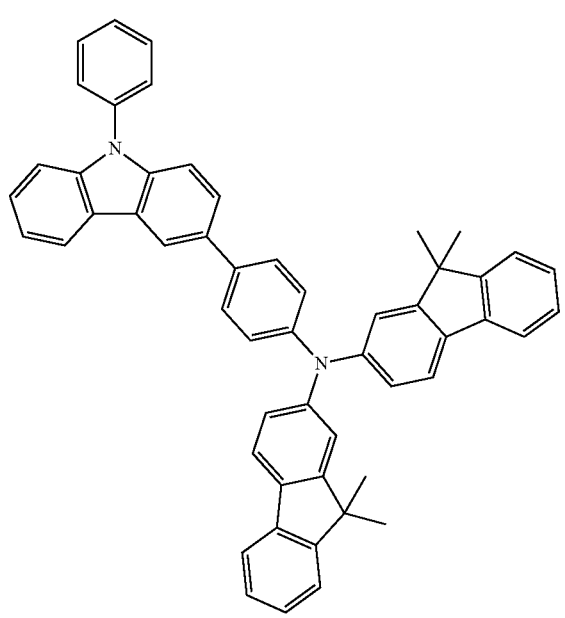
316
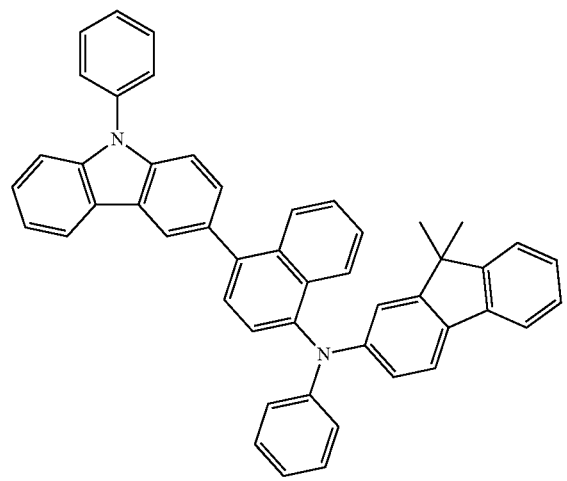
317
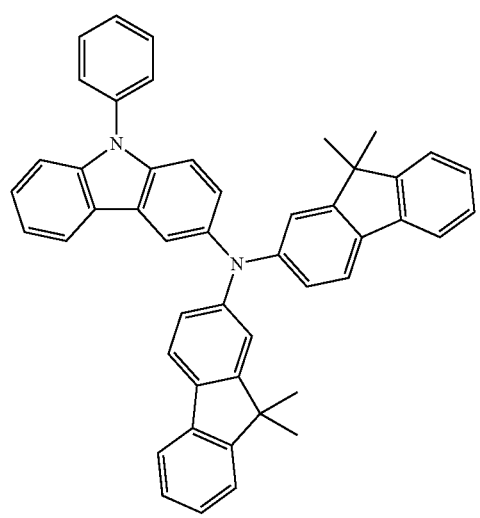
318
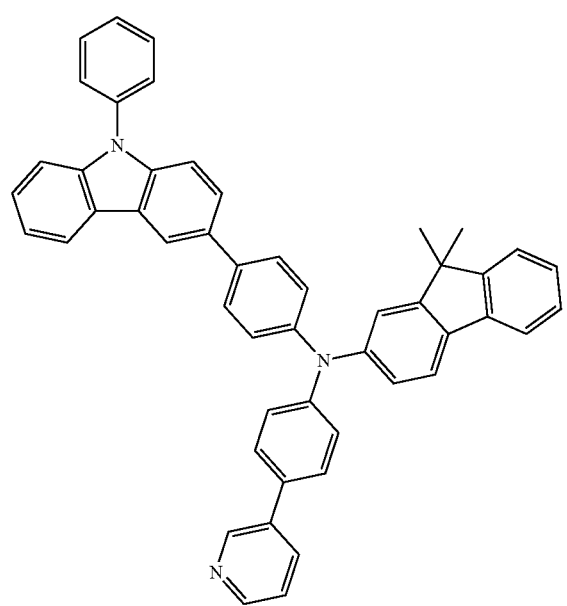

-continued
319
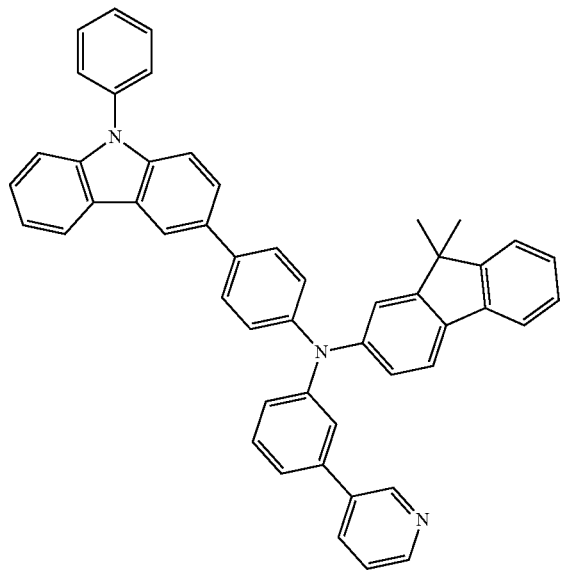
320
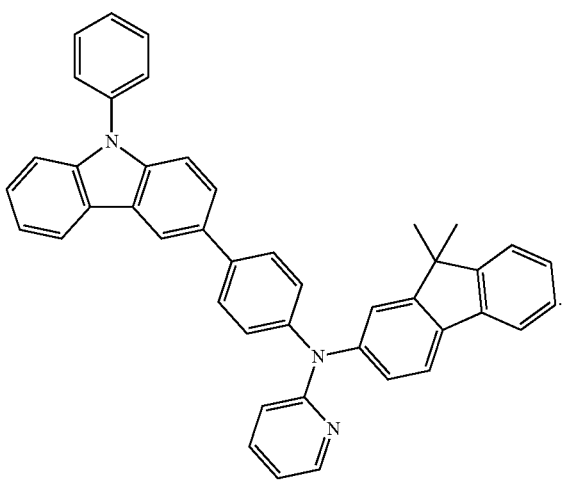
701
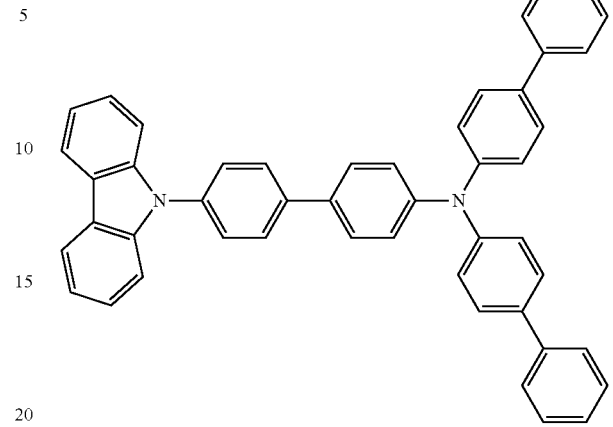
702
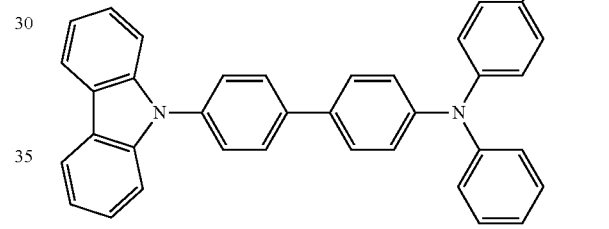
703
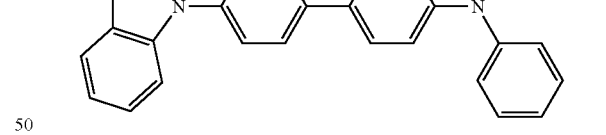
704
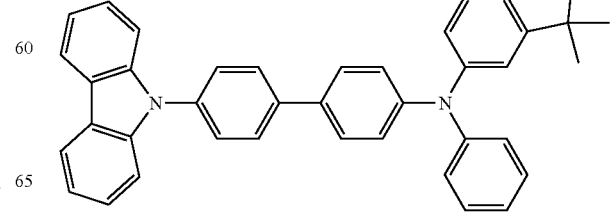
15. The organic light-emitting device of claim 1, wherein the second compound comprises at least one of Compounds 701 to 715:

103
-continued
705
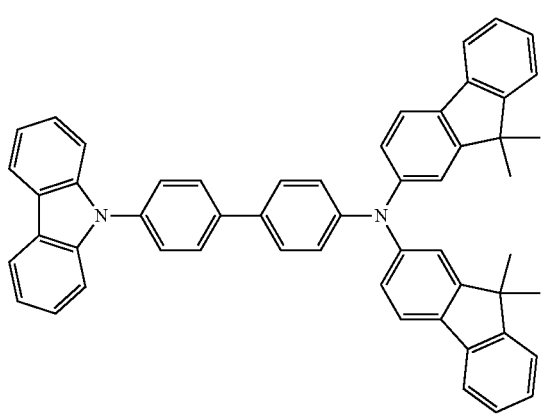
706
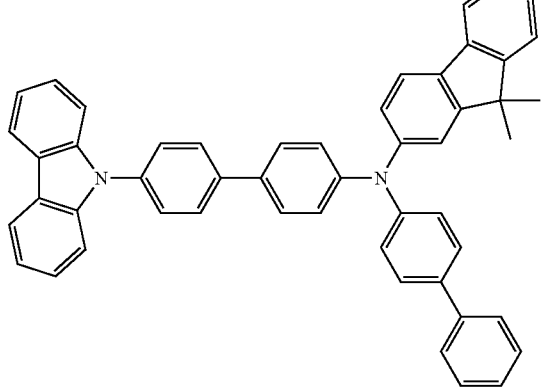
707
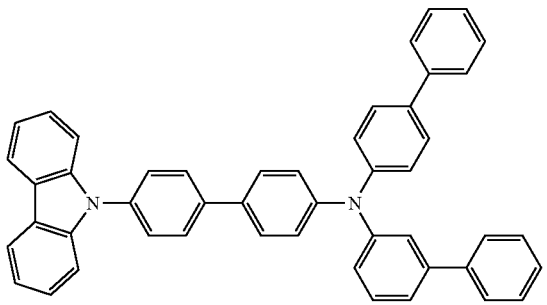
708
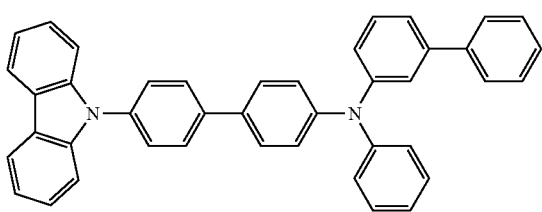
104
-continued
709
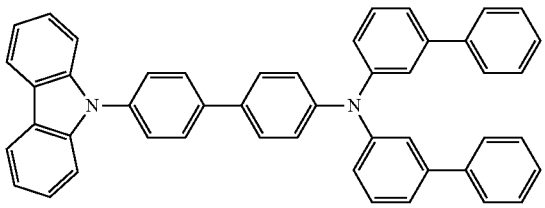
710
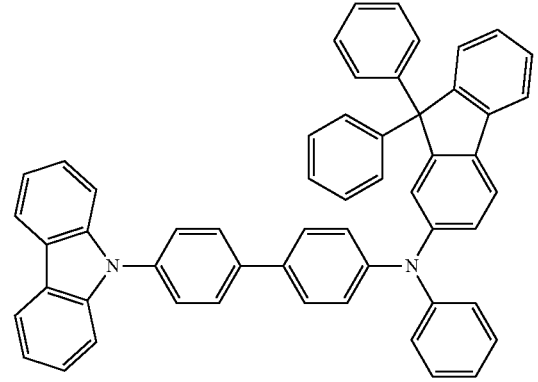
711
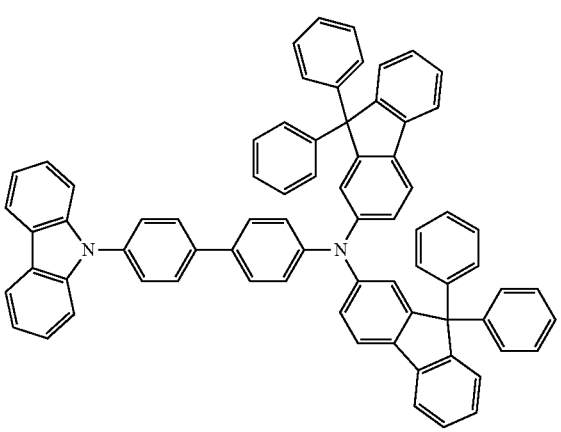
712
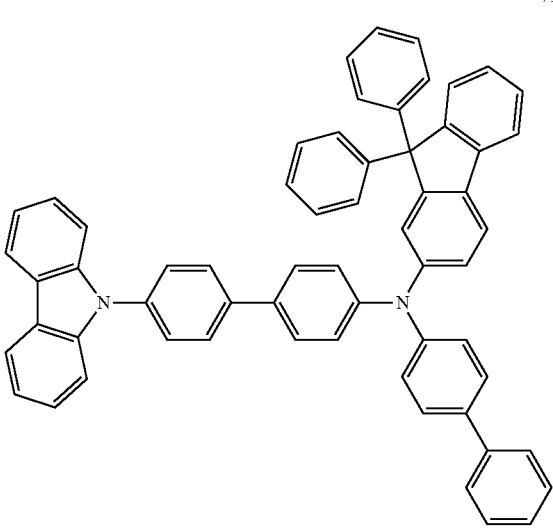

713

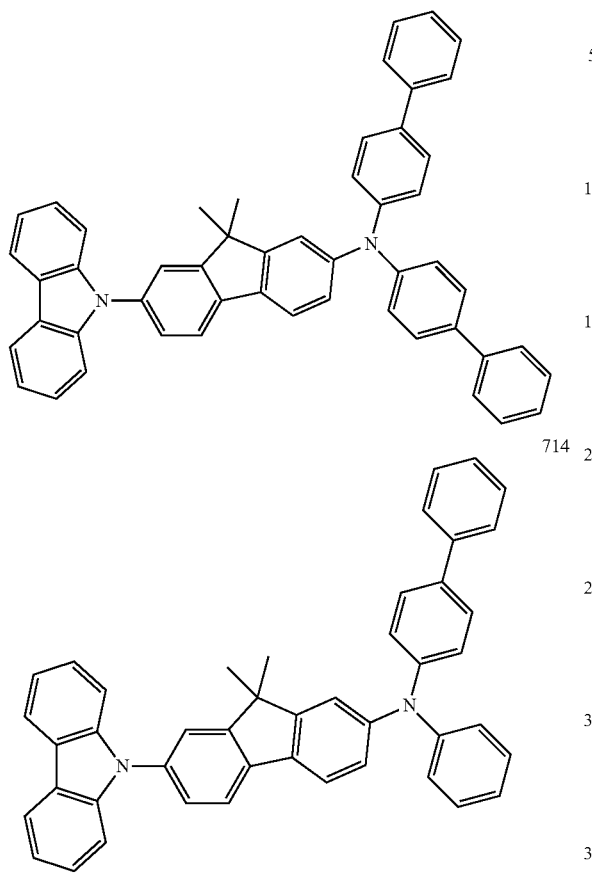

714

715

309

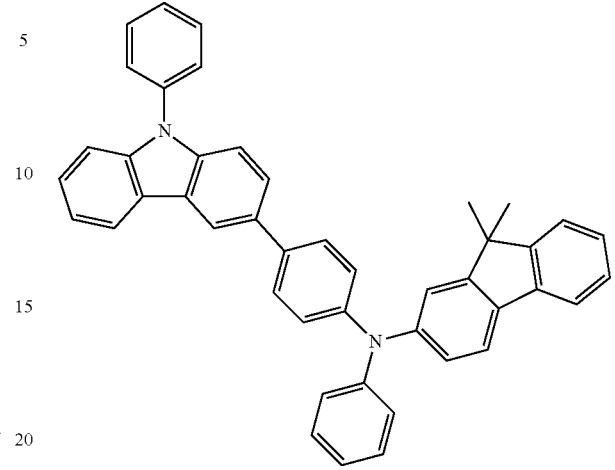

310

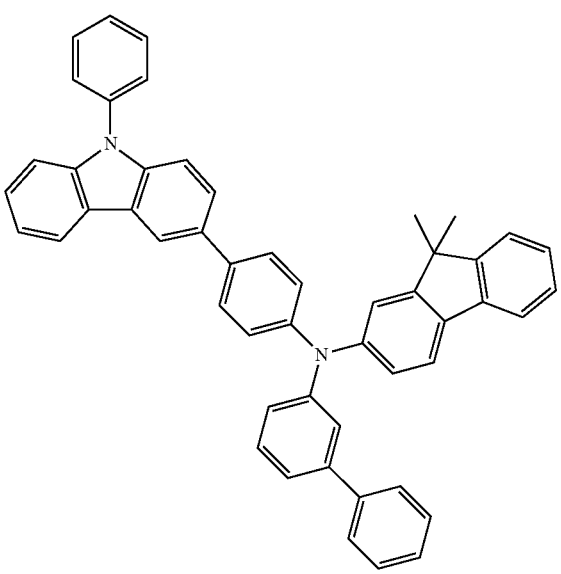

16. An organic light-emitting device comprising:
a first electrode;
a second electrode;
an emission layer between the first electrode and the second electrode;
a first hole transport layer between the first electrode and the emission layer; and
a second hole transport layer between the first hole transport layer and the emission layer,
wherein the first hole transport layer comprises at least one of Compounds 309 to 320, and the second hole transport layer comprises at least one of Compounds 701 to 715:

311
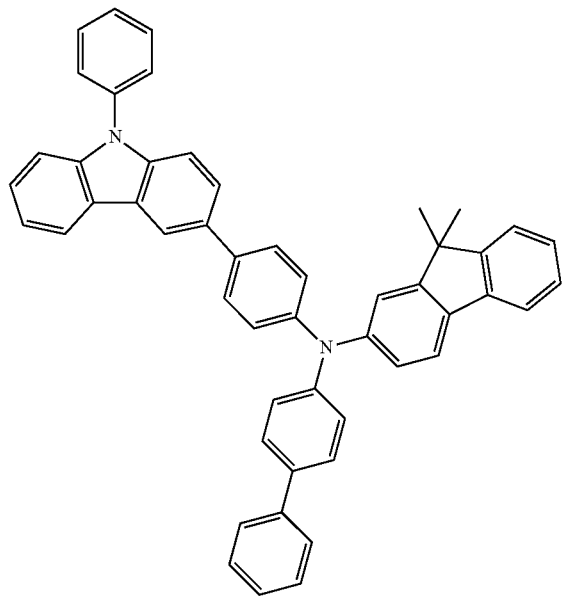
312
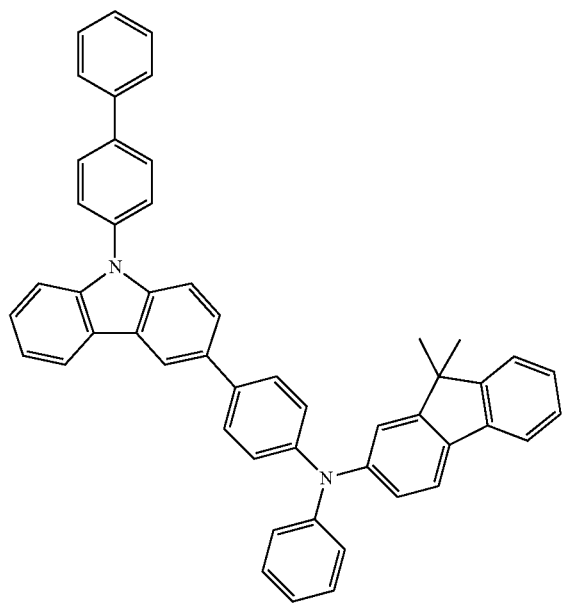
313
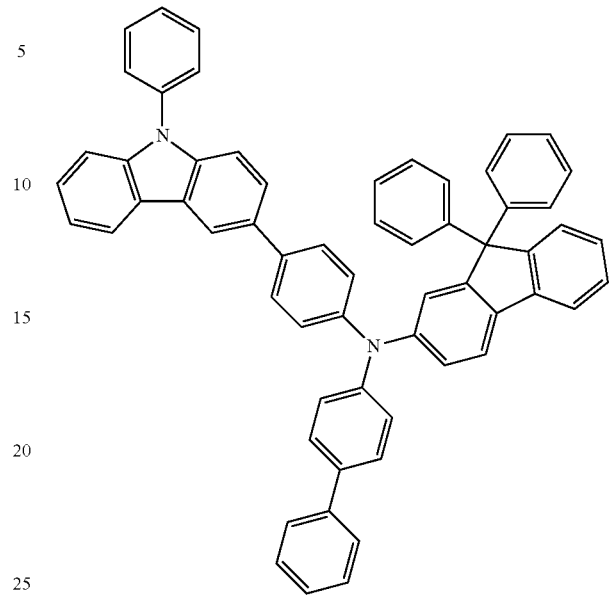
314
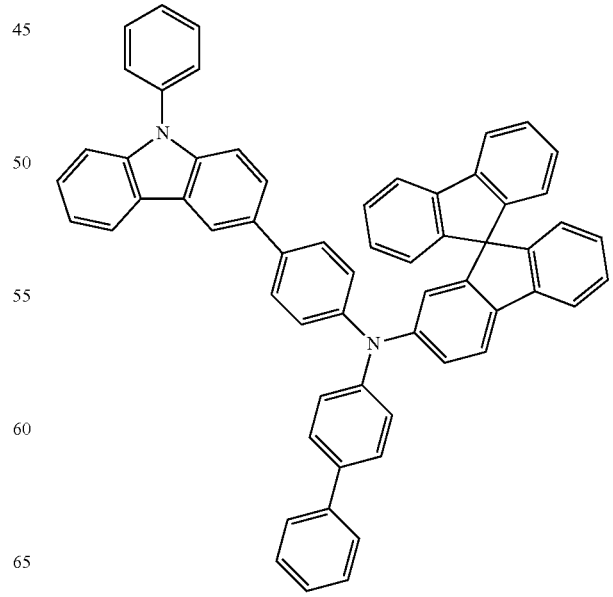

109
-continued
315
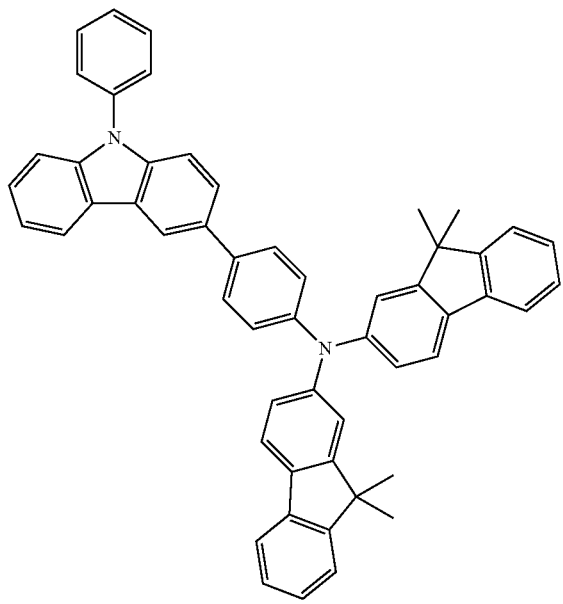
316
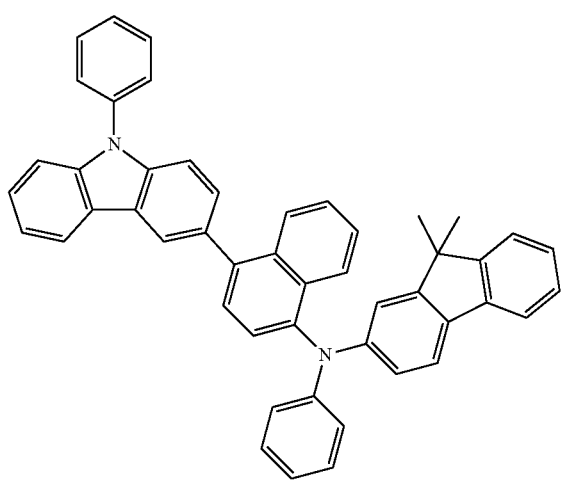
317
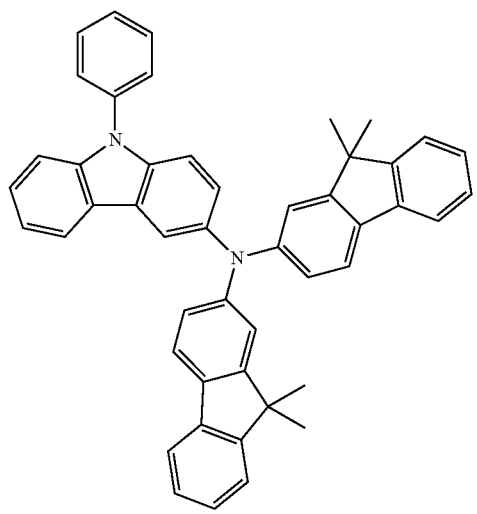
110
-continued
318
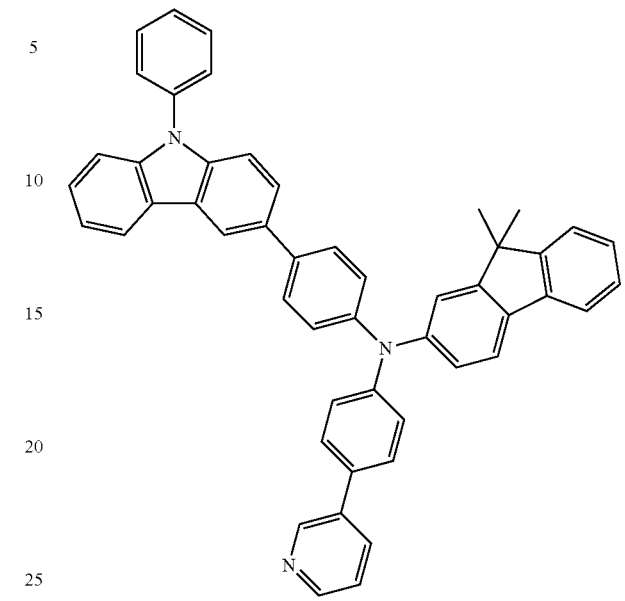
319
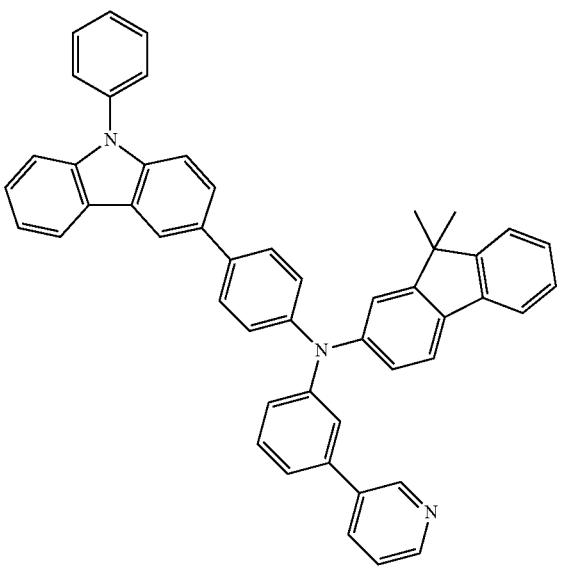

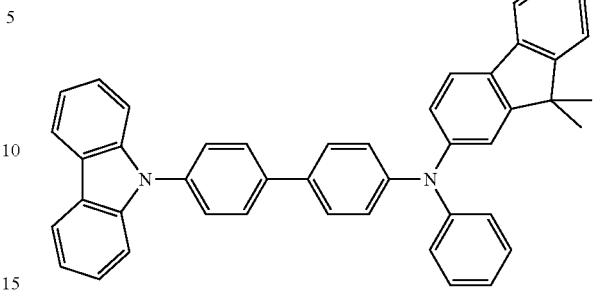
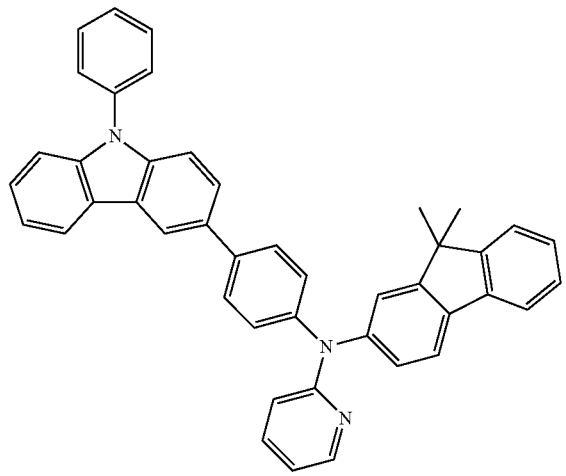
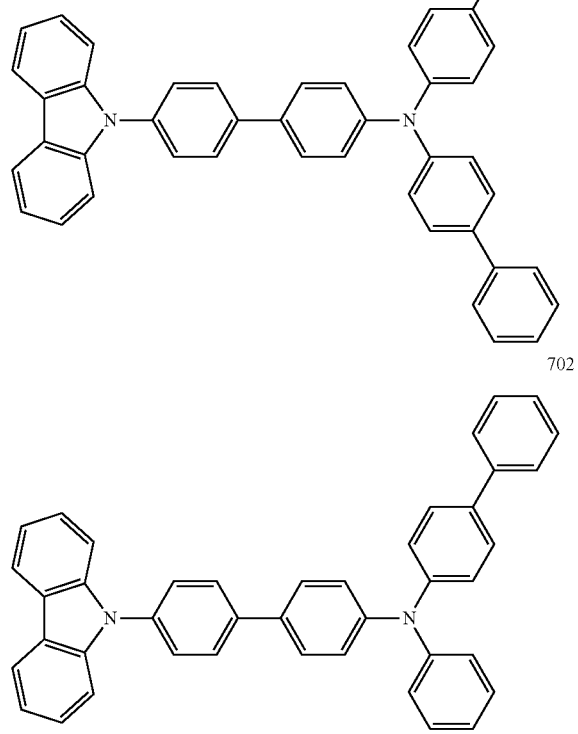
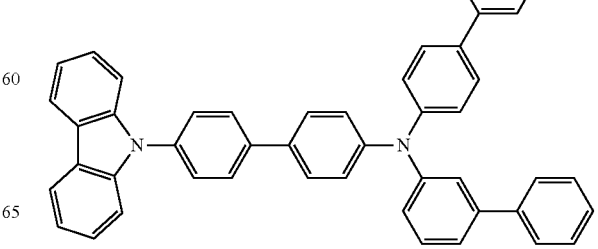
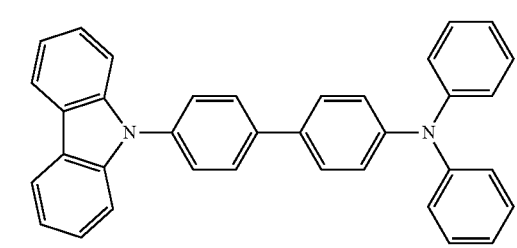

-continued
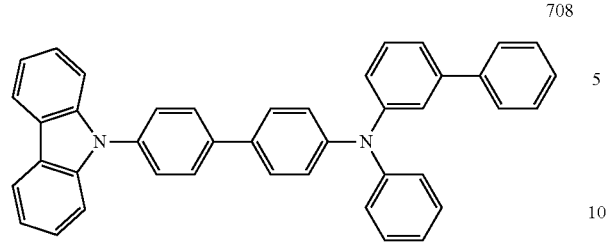
708
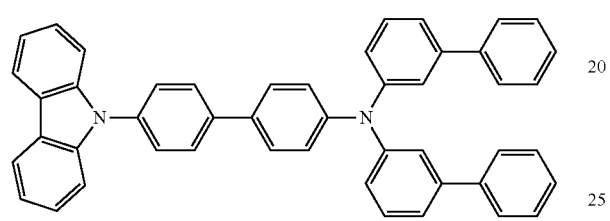
709
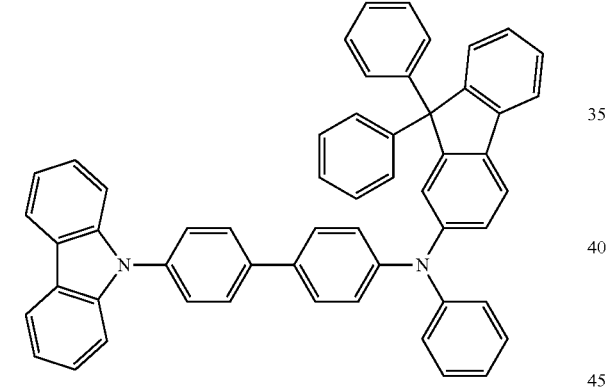
710
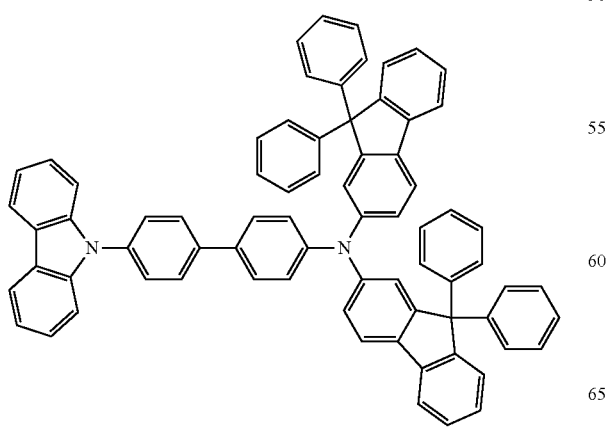
711
-continued
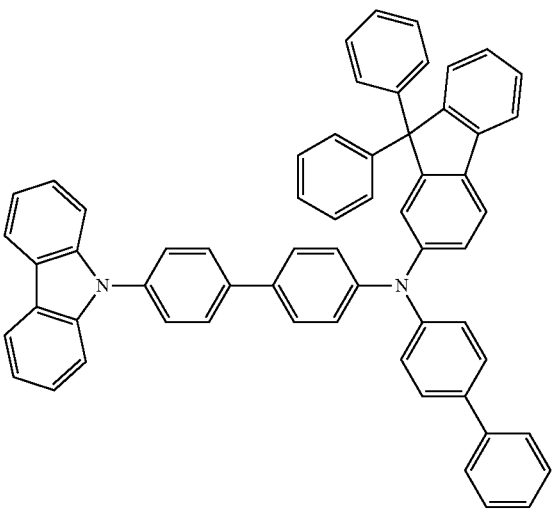
712
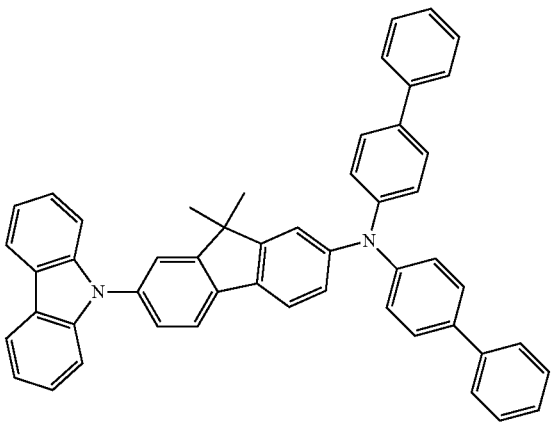
713
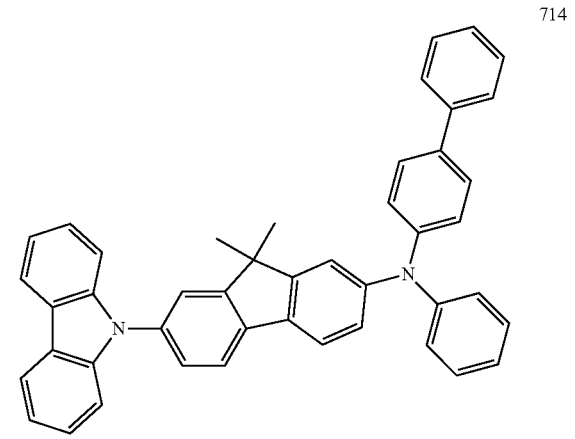
714

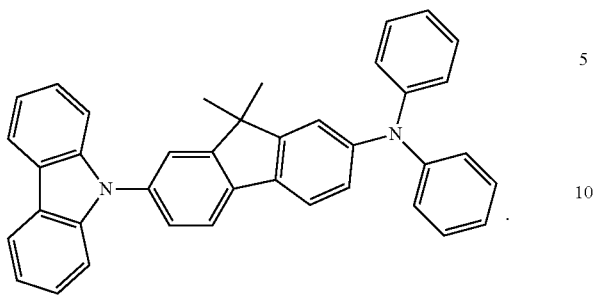
715
* * * * *